United States Patent [19]

Schoeff

[11] Patent Number: 4,962,341

[45] Date of Patent: Oct. 9, 1990

[54] LOW VOLTAGE NON-SATURATING LOGIC CIRCUIT TECHNOLOGY

[76] Inventor: John A. Schoeff, 4107 W. Jensen Rd., Cheney, Wash. 99004

[21] Appl. No.: 151,423

[22] Filed: Feb. 2, 1988

[51] Int. Cl.[5] ............... H03K 19/091; H03K 19/086; H03K 19/09; H03K 19/082

[52] U.S. Cl. .................... 307/200.1; 307/440; 307/448; 307/454; 307/455; 307/459; 307/477; 307/228; 364/490

[58] Field of Search .............. 307/200.1, 440, 446, 307/448, 450, 451, 454, 455–460, 475, 473, 477, 525, 228; 364/490; 357/65, 40

[56] References Cited

U.S. PATENT DOCUMENTS

| | | | |
|---|---|---|---|
| 3,077,551 | 12/1958 | Nelson et al. | 307/200.1 X |
| 3,088,096 | 4/1963 | Steinbuch | 307/200.1 X |
| 3,560,760 | 2/1971 | Chung et al. | 307/456 |
| 3,668,430 | 6/1972 | Kan | 307/440 X |
| 4,216,387 | 8/1980 | Reed | 307/228 |
| 4,521,700 | 6/1985 | Blumberg et al. | 307/456 |
| 4,598,217 | 7/1986 | Predina et al. | 307/525 |
| 4,749,885 | 7/1988 | Gal | 307/445 X |

Primary Examiner—Stanley D. Miller
Assistant Examiner—David R. Bertelson
Attorney, Agent, or Firm—Wells, St. John & Roberts

[57] ABSTRACT

Digital logic circuitry designed to operate on a low voltage power supply without substantial transistor saturation thereby achieving lower power and higher opeational speeds. A non-saturating inverter with a low voltage swing can be made with one transistor using standard bipolar production processes and without clamp diodes. The novel circuitry uses logic units which can be modularly combined to form various other logical functions such as inverters, gates, flip-flops, etc. The preferred logic units use a transistor with the base connected by a load resistor to a first current network. The logical input is between the load resistor and base. The emitter is connected either directly or via one or more resistors to a second current network. The first and second power networks are constructed and arranged to provide a voltage-varying profile across both networks which are preferably complementary to provide nearly constant differential voltages across the logic units. The differential voltages can be relatively low, such as less than 1 volt, thus providing low power operation. The power networks provide the biasing voltage for the logic units without separate biasing circuitry. The inverters, gates or other logical units are advantageously grouped into current balanced groups which conduct approximatley constant current between the power networks for a variety of logical code combinations. The total current flow is preferably balanced to be approximatley constant. A means for providing a relatively fixed amount of current matched to equal the balanced total current flow for the logic array is also preferably used. Also disclosed are preferred power networks, logic signal interconnect methods, a preferred gate array and methods for operating such circuits in non-saturating manners.

26 Claims, 34 Drawing Sheets

FIG 1A
CURRENT MODE INVERTER
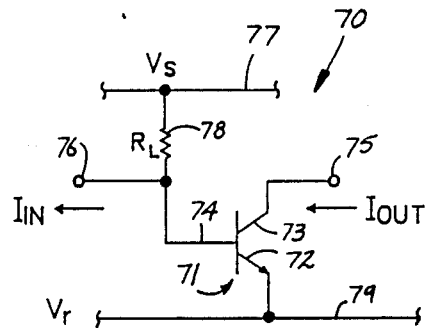
FIG 1B
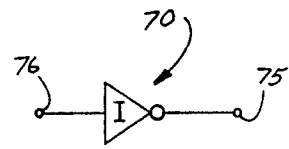
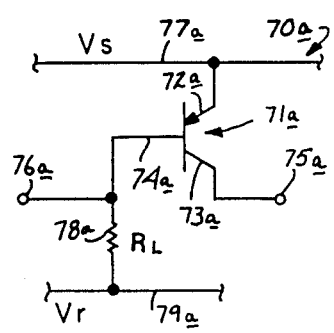
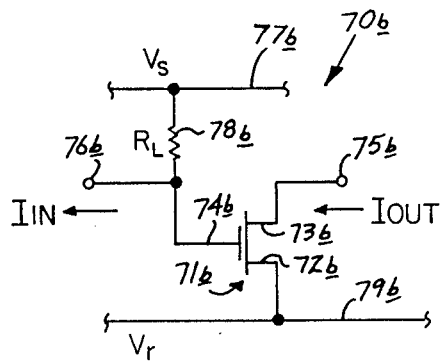
FIG 1C
FIG 1D

NOR GATE

OR GATE

BUFFER

AND GATE

NAND GATE

EX OR GATE

EX NOR GATE

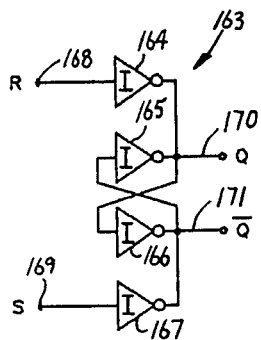
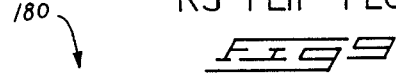
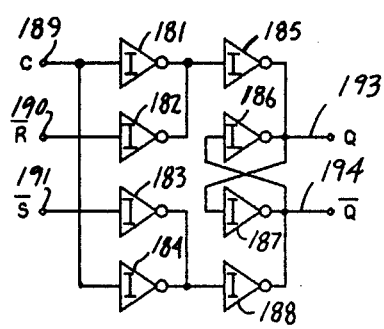
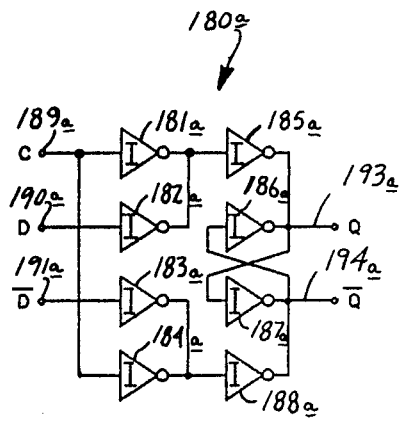
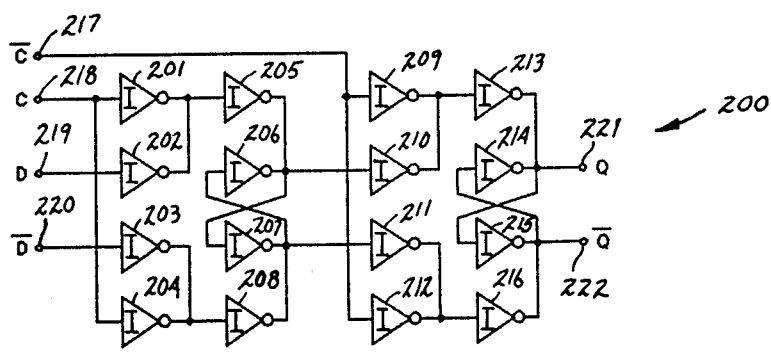
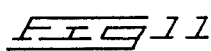

CURRENT MODE INVERTER

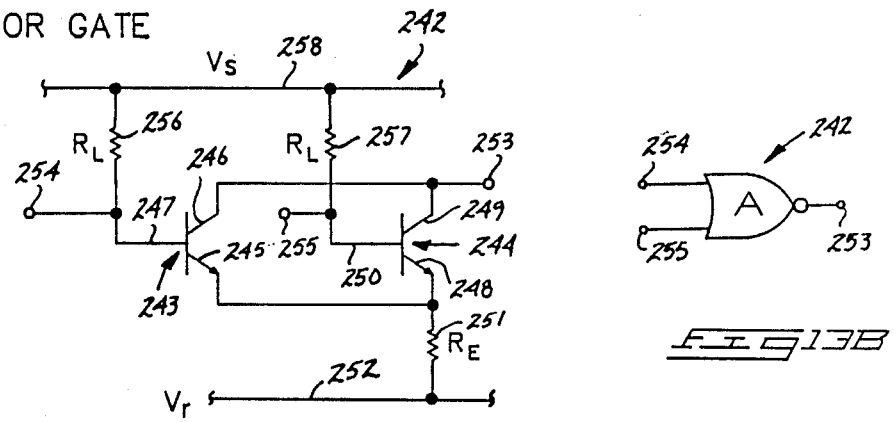
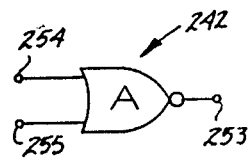
FIG 13A
FIG 13B
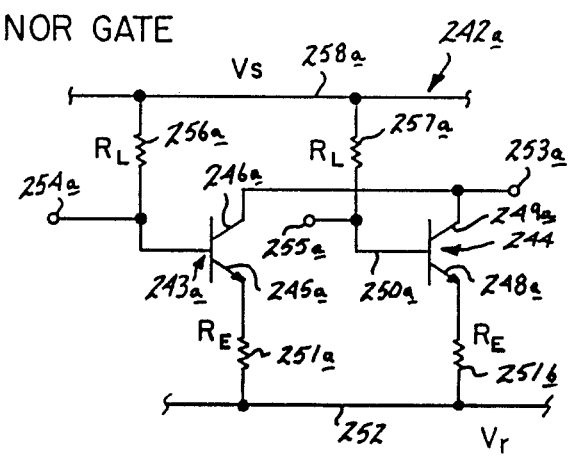
FIG 14A
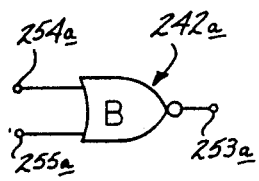
FIG 14B
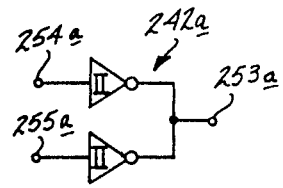
FIG 14C OR GATE
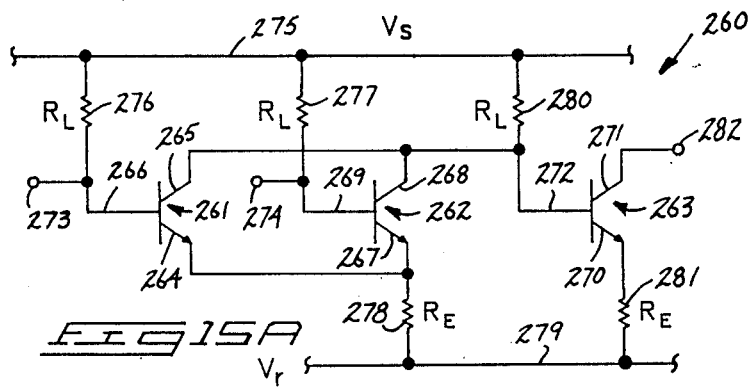
FIG 15A
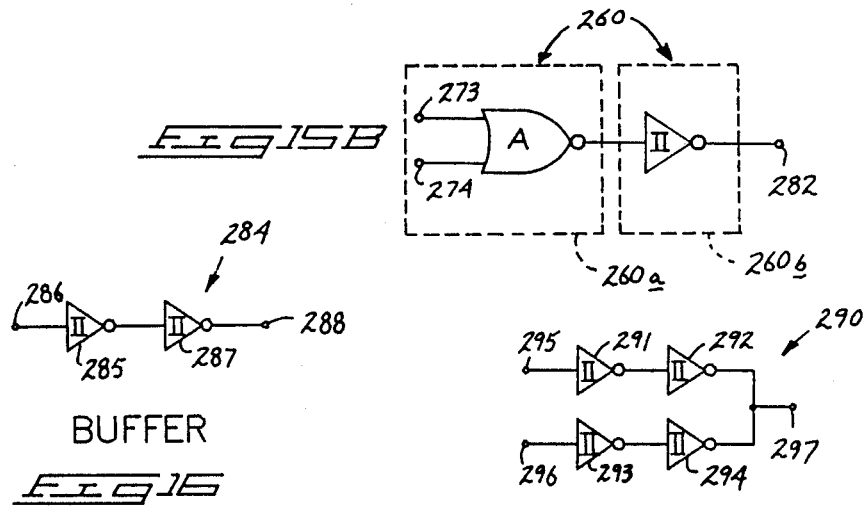
FIG 15B
BUFFER
FIG 16
AND GATE
FIG 17
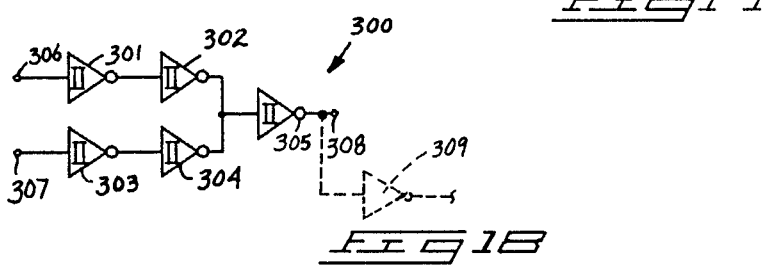
NAND GATE
FIG 18

EX OR GATE

EX NOR GATE

RS FLIP-FLOP

CLOCKED RS FLIP-FLOP

CLOCKED DATA LATCH

MASTER-SLAVE FLIP-FLOP $\Delta V_1 = \Delta V_2$ $\Delta V_1 \neq \Delta V_2$

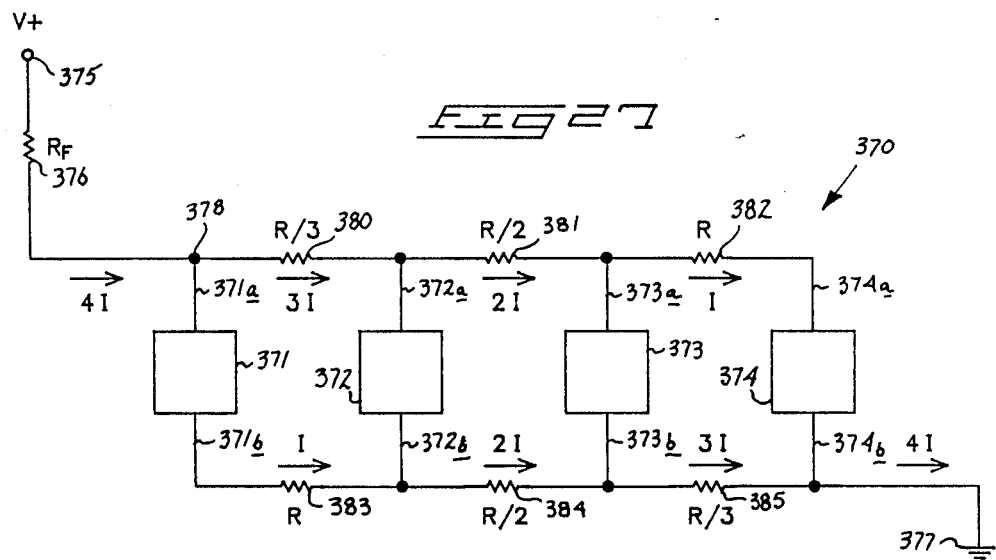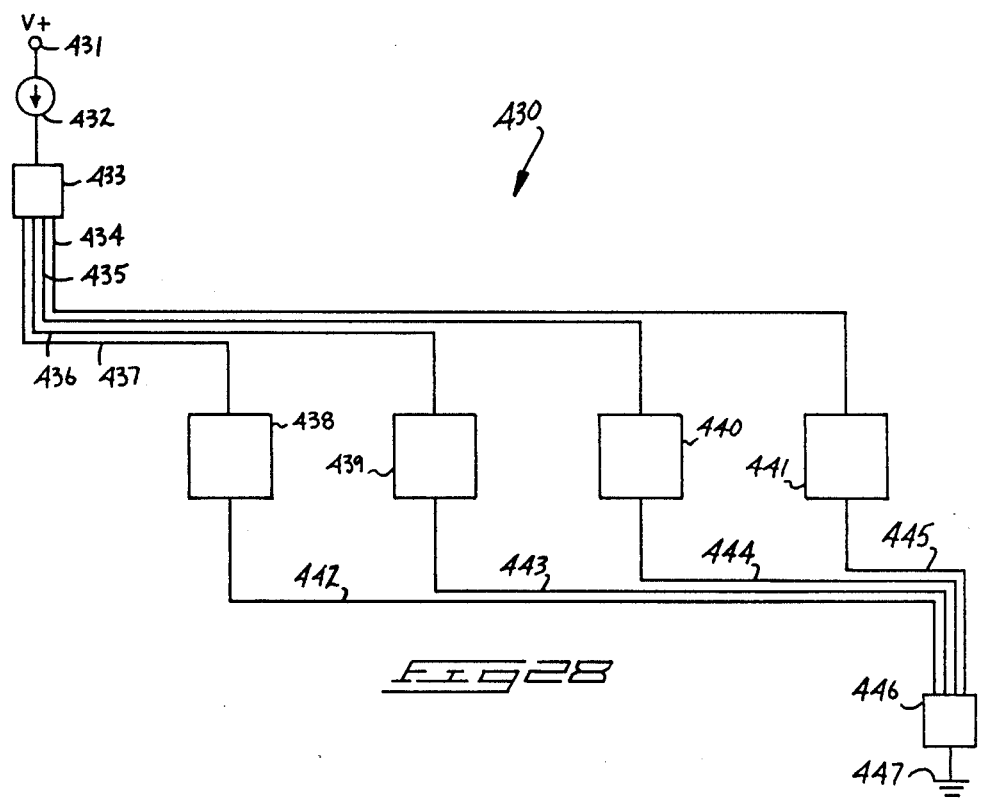

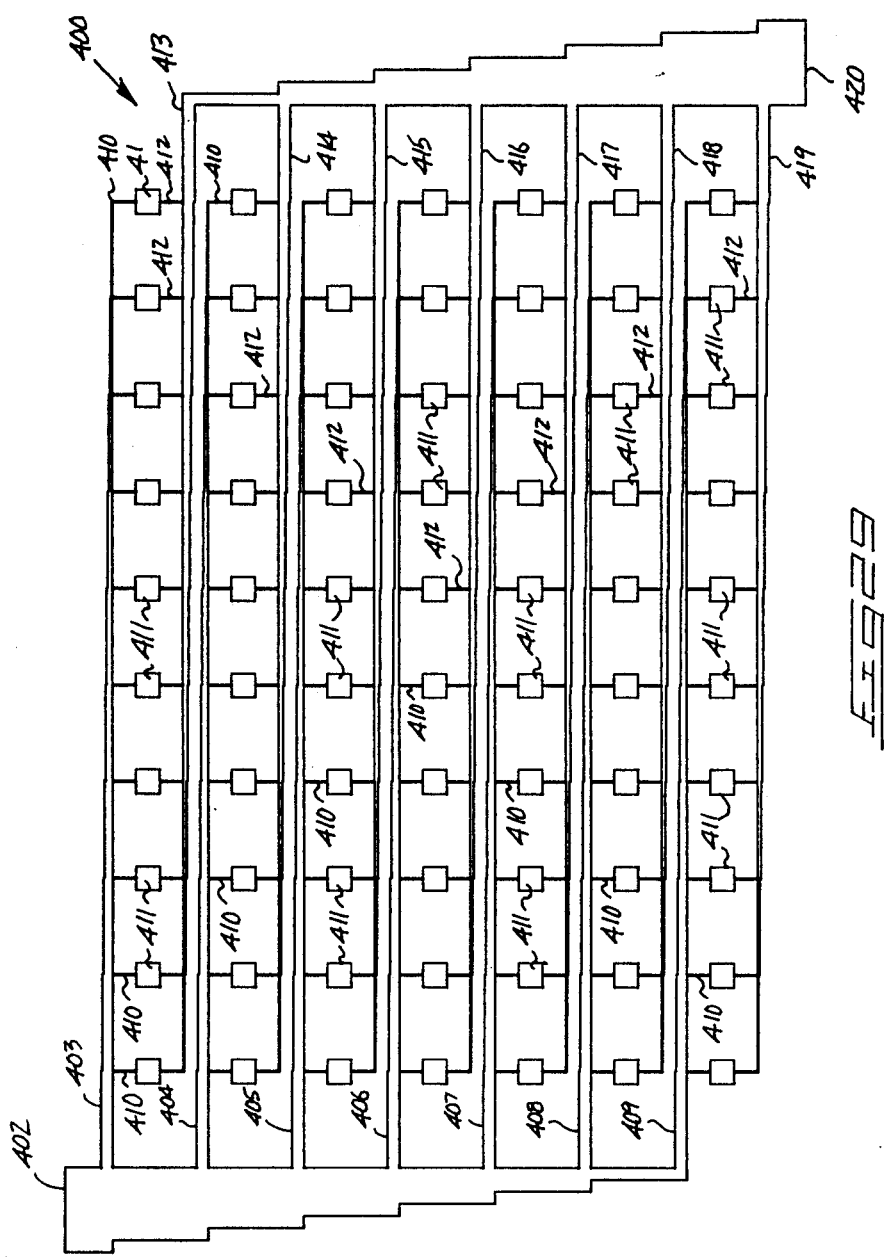

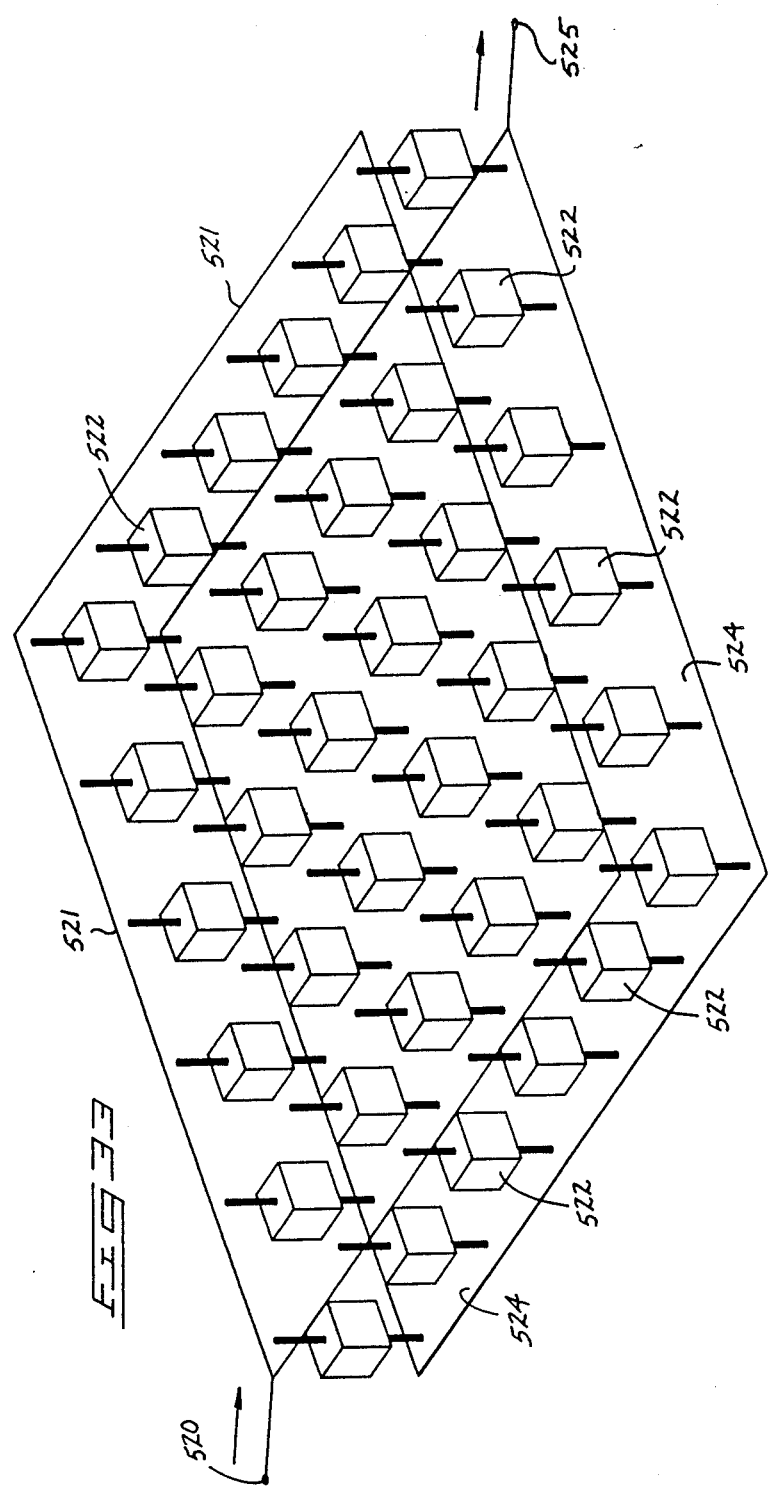

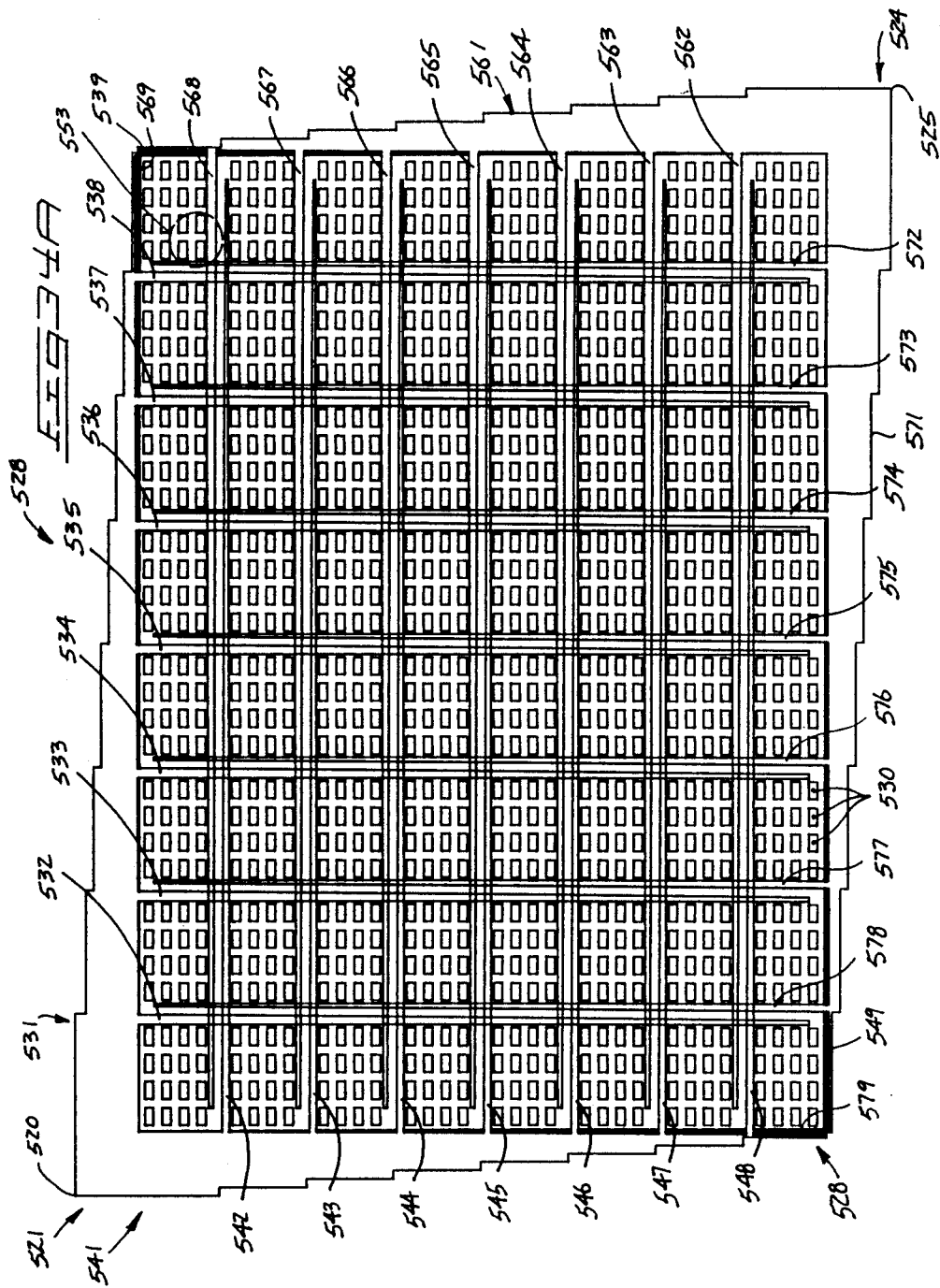

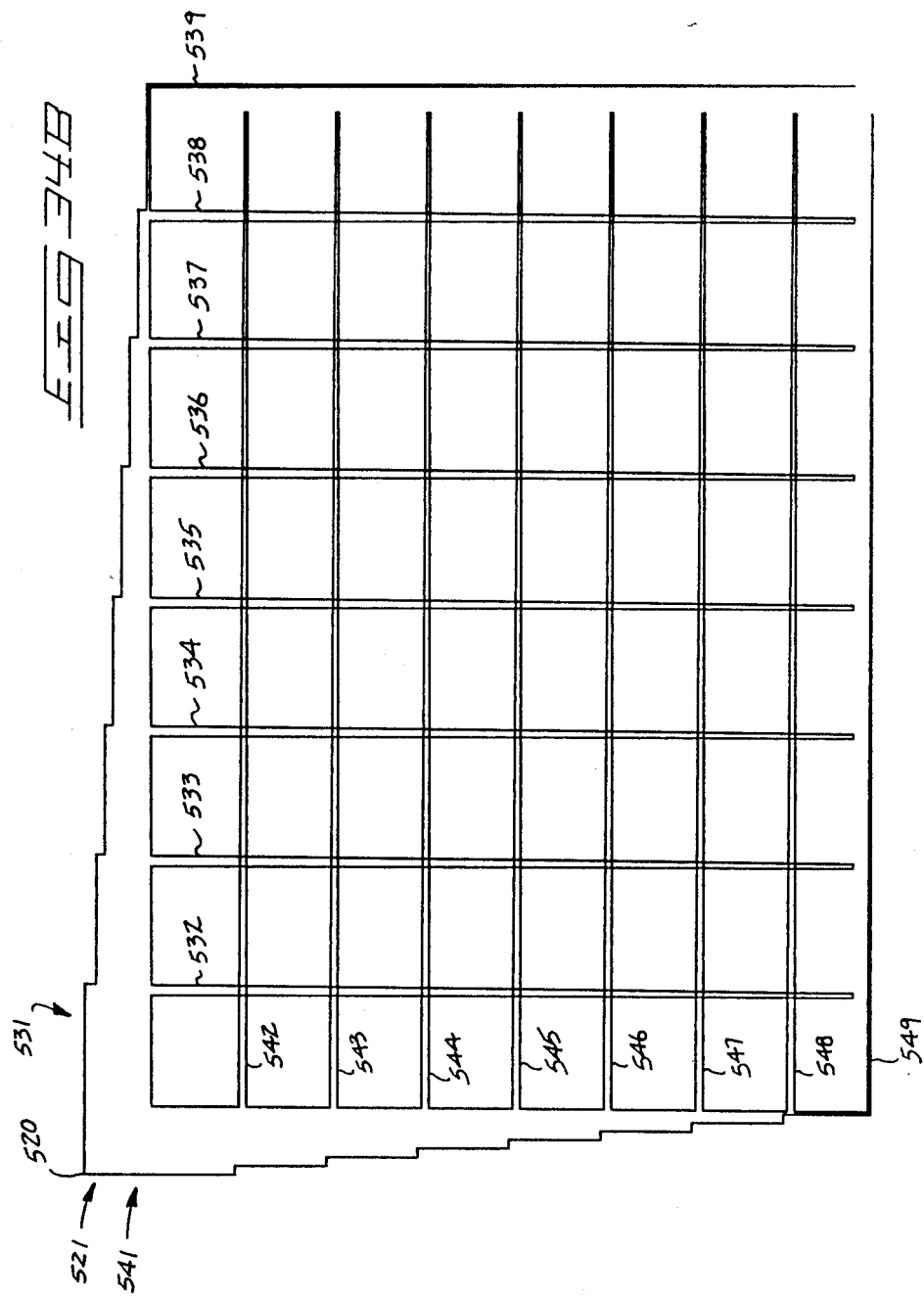

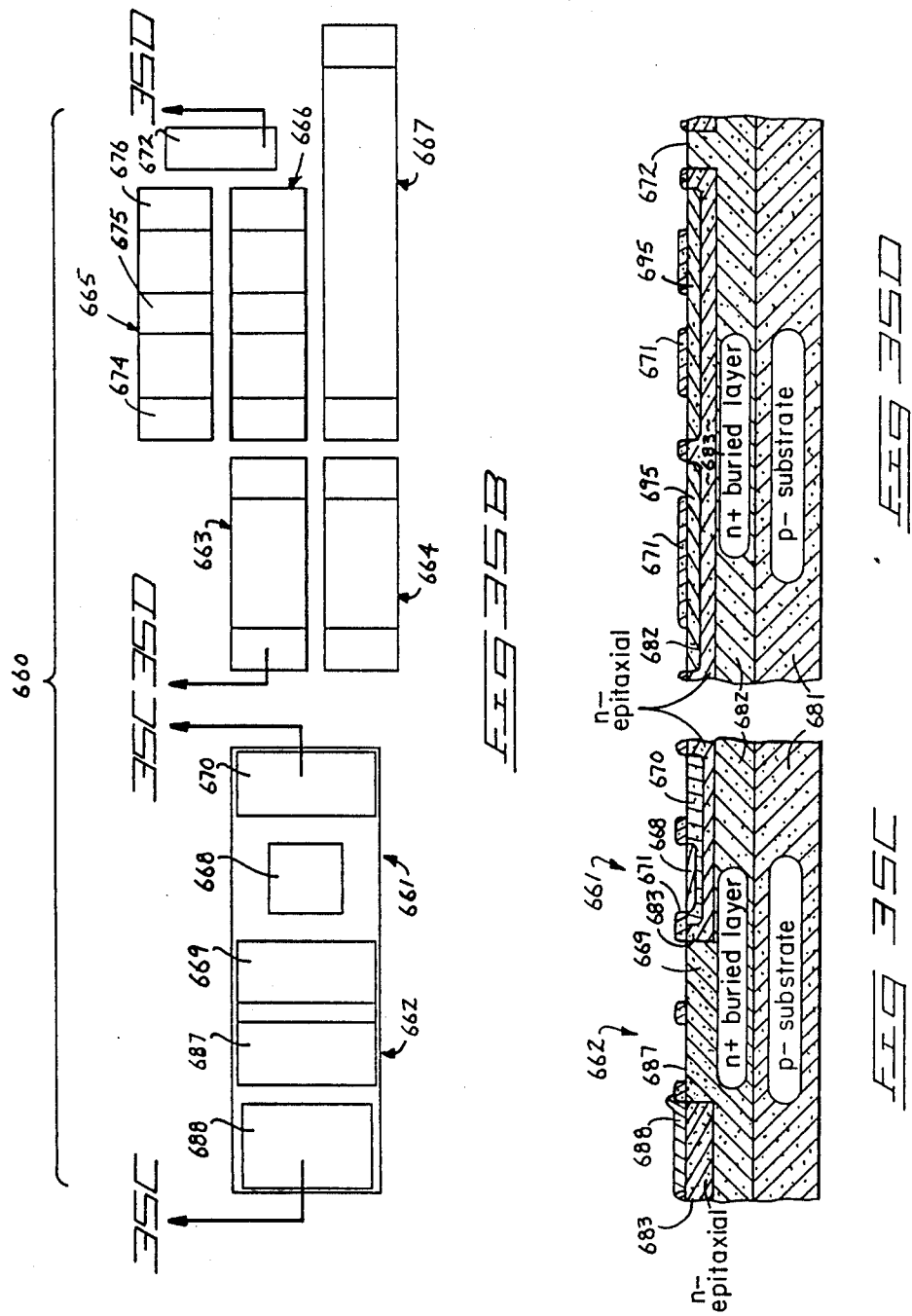

POSITIVE NODES

NEGATIVE NODES

UP SHIFTER

DOWN SHIFTER

LOW VOLTAGE NON-SATURATING LOGIC CIRCUIT TECHNOLOGY

TECHNICAL FIELD

The technical field of this invention is electronic digital logic circuitry.

BACKGROUND OF THE INVENTION

Digital logic circuitry is widely used in a variety of applications including computers, microprocessors, digital logic gate chips, controllers and other applications. In general electronic devices used in such applications can be improved by utilizing logic circuitry which is faster. Faster operation allows more electronic operations to be performed per second thus allowing the device to perform more functions and/or functions of higher sophistication and complexity.

A principal factor in speed limitation of digital logic circuitry is the operational switching speed of the switching transistors. The electronic processing of information in digital form requires numerous transistors to switch in various combinations, sequences and patterns in order to encode information into digital form and then to process such information using various analytical programs. Literally millions or even billions of transistor switching operations occur every second in many digital devices. The speed at which data is processed and analyzed depends on the combinational patterns and sequential progress of numerous transistor switches. Thus, any reduction in the period of time necessary to change or switch a transistor from a nonconductive or "off" state into a conductive or "on" state, or vice versa, can improve the overall speed of the digital system.

Many prior art digital logic families have suffered speed limitations due to electronic designs which cause the switching transistors to operate in a saturated mode in the conductive state. Saturation can be either partial or full depending on the bias voltage applied and other parameters of the circuit. In full or hard saturation, the base-collector diode junction becomes forward biased to a degree which overcomes the forward barrier voltage of the base-collector junction and causes substantial increase in base current. In silicon bipolar transistors hard saturation occurs when the base collector junction is forward biased more than approximately 650 millivolts (mV), assuming a base-emitter voltage of 800 mV when the transistor is on. This must be compared to typical non-saturated operational conditions in which the base-collector junction is reverse biased. Soft or partial saturation is where base current increases only a relatively small amount due to forward biasing of the base-collector junction. In silicon bipolar transistors soft saturation occurs between approximately 500–650 mV forward biasing on the base-collector junction. With base-collector forward biasing of less than approximately 500 mV the base current does not increase appreciably and the effects of this trivial saturation are minor. The other levels of saturation are significant bacause the switching speed of the transistors are slowed. Full saturation causes the longest switching times with increased speed as the degree of saturation decreases.

In order to prevent saturation some logic designs have employed clamping diodes which prevent a hard or full saturation from occurring by allowing drive current to bypass the base-collector junction when the transistor is turned on. Schottky diodes have been widely used for this purpose because their threshold voltage is lower than silicon diodes. Although use of such clamping or bypass constructions have improved performance, they have not provided switching speeds which fully utilize the high speed switching capabilities of bipolar transistors. Presently available logic families using such clamping techniques have similarly not achieved operational speeds which are commensurate with the speeds at which bipolar and other transistors can in fact operate.

Another problem area in digital logic circuitry includes variations in the voltages provided to different switching components spaced at different positions on the integrated circuit chip. This problem can be appreciated by considering the minute size of the conductors used to convey electrical current from one part of the integrated circuit to another. The small sizes of the conductors often cause significant variations in the voltage to occur depending on the current which the circuit is conducting. These changes in voltage along the conductor strips of integrated circuits require that relatively wide logic signal voltage ranges be accepted as defining a particular logic state. The voltages experienced over the power distribution system of an integrated circuit chip due to these and other causes thus has not been maintained with well defined values by prior art circuitry so as to allow minimum logic voltage swing or precise control of transistor biasing using the power supply lines. Most prior art logic families have allowed ground voltages to randomly vary across the chip due to use of a variety of interconnection patterns and conductor widths. This lack of control has maintained the need for gate decoupling diodes and/or clamp diodes or differential logic circuits with many additional bias devices. It has also been common to use relatively large conductor metal and have numerous power pins in order to help stabilize voltages for varying current flows.

Prior art logic circuitry also sometimes uses bias circuitry to set up operating voltages which are relatively independent of the power supply voltage. Emitter coupled logic (ECL) is a family which uses bias circuitry which is separate from the power supply for the transistors performing the logical switching operations. ECL also requires emitter followers between each gate to act as level shifters to eliminate saturation which would occur because the voltage swing must be large enough to overcome ground voltage drops. Due to the use of extra bias circuits and followers, ECL cannot operate on a low voltage power supply, such as less than 1 to 2 volts.

Logic families which utilizes low supply voltages, such as in the range of one volt, have greater potential for signal errors. Very accurate voltages are needed due to the exponential nature of the current output from a transistor, such as in a grounded emitter stage configuration. Utilization of the power supply voltage as a biasing or control circuit for the switching transistors in such circuitry is not acceptable because of the high degree of accuracy needed, both in absolute value and temperature tracking. Resistance of power leads on the chip causes voltage drops which make accurate biasing of low voltage logic circuits extremely difficult. One solution might be to use multiple local voltage regulators on the chip, such as used in nonthreshold logic (NTL). But regulators require extra voltage to operate, and can add as much power dissipation to the chip as the logic is already using. The regulators also add extra components. They further have a limited frequency response at the output and thus cannot adapt to rapidly changing current demands such as when the logic gates are switching. Large filter capacitors, which would stabilize switching transients, can only be used in off-chip regulators which unfortunately are rendered useless by the previously mentioned voltage drops in the chip metallization.

Another important consideration in integrated circuit design is the number of transistors needed to accomplish the various logical gates required for the particular digital circuitry being used. Chip manufactures seek to minimize the number of transistors in order to produce more chips per wafer, increase functional yield and speed, and use smaller chip packages. One early form of digital logic was termed direct coupled transistor logic (DCTL) which used only one transistor for the simplest logic element, an inverter. Unfortunately DCTL operated in a highly saturated mode which prevented high operating speeds.

DCTL also suffered from a phenomenon termed "current hogging" which occurred when the logical output of one switching transistor was connected to multiple subsequent stages, typically called "fanout". If the ground voltage for each of the subsequent stages was not matched then current tended to flow primarily in the subsequent stage having the lowest ground voltage, and one or more of the other transistors being controlled would not be properly activated. Thus current would not be evenly distributed between load transistors when they were turned on.

Another early logic family using a single transistor per inverter was resistor-transistor logic (RTL), which used grounded emitter transistors which had resistors between the logic inputs and the transistor bases. The resistors at the logical inputs reduced current hogging by decoupling the inputs but slowed response time. The input resistors did not satisfactorily solve the current distribution problem when building very large logic arrays, such as those which have hundreds or thousands of gates. The RTL logic also suffered substantial saturation problems and additional speed delay because of such saturation.

Other approaches to decoupling, such as diodes or transistors, will also slow switching speeds by increasing voltage swing and adding circuit nodes. Decoupling also consumes power and requires additional devices on the chip.

U.S. Pat. No. 4,165,470 assigned to Honeywell shows logic circuitry which utilizes a current source to feed the positive power network. A plurality of bipolar transistors receive logical inputs at their bases. The emitters are grounded to the negative network. The collectors are connected to load resistors which extends to the positive network. Each transistor turns on and conducts current through its load resistor to create a voltage drop across the load resistor which swings the next logic stage base low. The Honeywell circuits are forced to consistently use Schottky diodes to allow excess current from the driving transistor to shunt around the load resistor thus preventing hard saturation. However, the amount of shunted current varies depending on the logical code combination of the device at any particular time. The varying amounts of current must pass through the available transistors which are on, so the base-emitter bias voltage must fluctuate to accommodate the varying current. This leads to different biasing voltages for various logic states, which causes noise on the positive network, creates unpredictable and inconsistent delays in the gates due to transistor current variations, and causes the circuitry to operate more slowly than optimum due to the larger voltage swing needed to allow the Schottky diode to bypass excess current around the load resistor. Voltage drops on both the negative and positive networks also cause serious problems when attempting to build large logic arrays with the Honeywell logic.

Despite the fact that DCTL, RTL, NTL and the Honeywell logic families used only one resistors per input they were essentially abandoned in favor of other logic families having increased complexity in order to achieve greater speeds, predictable speeds, and/or reduced power consumption. $I^2L$, ISL, and STL are additional logic families which have problems with speed, speed variation, and noise immunity caused by supply line voltage drops, saturation, and logic code changes, especially with large arrays. Accordingly, there remains a need for a relatively simple, low cost logic circuitry which eliminates bias lines, bias circuits, clamp diodes, emitter followers, decoupling, voltage regulators, and their associated devices. It should operate reliably with a low and well controlled voltage swing, under non-saturating conditions, thus allowing high operating speeds. Such a desired circuitry will also utilize a low power supply voltage to achieve low power dissipation and thus allow higher functional density and operating speed.

BRIEF DESCRIPTION OF INVENTION

The invention described herein includes a new type of digital logic circuitry which utilizes a low power supply voltage, a small number of transistors, and exhibits low power dissipation and high switching speed. The digital logic circuitry can be considered in two families. Both families utilize one or more transistors as the primary switching element in a logic unit. The transistors are connected to control electrical current flow between first and second power networks. In an exemplary embodiment the first power network is relatively more positive than the second power network by approximately one volt. Current flows through the transistors between first and second current conduction terminals. The current flow is carefully controlled by voltage at a third control terminal of the transistor or other active 3 terminal electronic device which can be controlled using a defined voltage or current. The transistors are preferably connected with a relatively high output impedance first current conduction terminal defining the logical output node of the logic unit. In the case of a bipolar transistor the collector is the first current conduction terminal and forms the logical output node. The emitter of a bipolar transistor forms the second current conduction terminal in the first family. The emitter or other similar second current conduction terminal of the transistor is connected directly to the second power network. In the second family an emitter resistor is interposed between the emitter or second conduction terminal and the second power network.

The logic units include a load, such as load resistor, through which current is controllably conducted. The load is electrically connected between the first power network and the transistor base or other control terminal of the transistor which can be used to bias the transistor and control current flow therethrough. The node between the base or similar control terminal of the transistor and the load forms the logical input for the logic unit.

In operation a logically upstream inverter or other logic unit controls current flow through the load resister of a connected downstream logic unit. The output signal from the upstream logic unit is at a relatively higher voltage when the upstream transistor is off. This off condition of the upstream transistor is associated with a very small current through the downstream load resistor and the voltage drop relative to the first power network is small. The voltage thus developed at the input of the downstream logic unit is also relatively high thus forward biasing the downstream transistor turning it on.

When a transistor of an upstream logic unit turns on, it conducts substantial current through the load resistor of a connected downstream logic unit which is logically connected thereto. The amount of current is carefully controlled to cause a significant voltage drop to be developed across the load resistor in the downstream logic unit. The voltage drop across the lod resistor lowers the voltage at the downstream logical input thus reading the forward bias on the transistor to a point where no significant conduction occurs through the downstream logic unit. The downstream logic unit transistor is thus placed in an off condition.

The novel inverters described herein are constructed using a single transistor and an associated load resistor connected at the input. Also disclosed are numerous other novel logic devices such as AND gates, NAND gates, OR gates, NOR gates, exclusive OR gates, exclusive NOR gates, buffers, flip-flops, and other logical devices.

The inverters and NOR gates form perferred basic logic units. These and other logic units described herein utilize the relative voltges between the first and second power networks in order to define the baising voltage applied to the transistors. Proper operation of the transistors requires accurate currents through the output nodes so they do not saturate and so that the logically downstream logic units experience well-defined voltages at their input nodes. The invention thus includes novel power network systems which allow very acccurate differential supply voltages to be developed across substantially all the logic units as bias voltage. In some forms of the invention, the power networks are intentionally designed to have voltage-varying profiles across each power network. The first and second power networks are designed to have complementary voltage-varying profiles so that closely-related or more preferably equal differential voltages are developed across all of the logic units. The high output impedance of the driving logic unit allows the load unit to be at a different voltage on the power network.

The invention further includes logic circuitry which is current balanced so as to use a relatively constant current flow for a variety of operational states assumed over time. Current balancing is advantageously achieved by logically interconnecting the gates in a manner which turns on a relatively fixed proportion of logic elements at all times, or the equivalent in terms of total current flow. Dummy logic units not necessary for the logical functions of the chip can advantageously be employed to help achieve current balance. The dummy units are logically connected to turn on or off and conduct current to appropriately balance the operation of other transistors included in logic units which are necessary to the logical functioning of the chip. Total current flow through chips according to this invention are advantageously current balanced to provide total current flow through an array which is within approximately ±40% or less of the desired normal operating current. The need for current balancing in localized areas of the chip depends upon the type of power networks used and the possible variations in current which occur due to different logical switching combinations. The need for local current balancing is relatively low when the preferred power grid structures described herein are used for the power networks. When other network structures are used the degree of current balancing for localized areas of the network may need to be done with more accuracy in order to prevent significant voltage variations in the power networks which can upset the accurate differential voltages maintained across the logic units.

The disclosure further shows two novel forms of digital gate arrays. One of the gate arrays operates at a single power supply voltage level and the other one is constructed with four different levels which operate between different supply voltage ranges. The different voltage levels are preferably stacked so that current passing through the gate array passes through each of the four different voltage levels. This stacking of portions of the chip helps to regulate and minimize total current flow through the array. The invention also includes electronic structures used to shift logical signals from one voltage level to another.

In addition to the stacked arrangement just discussed, there are other means used to regulate total current flow through the chip or other array of logic devices. A feed resistor or transistor can be mounted either on-chip or off-chip to help control power flow through the first and second networks and logic units which interconnect them. Alternatively, or is combination, it is possible to use distributed feed resistors which are located at a large number of different positions about the chip such as at each transistor or at subdivisions including a number of transistors. Intermediate conductors can be used with such distributed feed resistors to provide better voltage stability for localized groups or subdivisions of the logical arrays.

The digital logic circuitry of this invention is preferably employed in integrated circuits using a substantial number of individual transistors. A large number of parallel transistors are turned on at any one particular time between the two power networks thus greatly reducing the impedance between the power networks. This low impedance reduces noise generation and helps to suppress noise which may be generated through capacitive coupling of logical signal lines and other causes. It further allows logical switching of many transistors to be effectively averaged to thereby achieve very stable operational voltages on the first and second power networks, thus eliminating the need for an on-chip or off-chip precision volatge regulator.

The invention further includes methods of operation for the power networks and logical circuitry described above. The methods includ‿ conducting current through a logical array having a plurality of logical units connected to controllably conduct currrent between the first and second networks in parallel. The logical units are connected so that an approximately constant amount of current is conducted for all desired operational states assumed by the array. Current through the array is preferably controlled to be constant both by the logic array transistors and by some other current control means such as a suitable feed resistor, distributed feed resistor or feel transistor which are electrically connected in series with current flow through the array of parallel transistors. The operational methods also include controlling the logic unit transistors by conducting a carefully controlled nearly constant current so that a relatively constant differential voltage exists across all logic units thereby allowing precise biasing voltages to be developed and accurate currents to be output from transistors which are turned on. The transistors are preferably controlled so that the voltage swing is minimized and operation occurs in the linear region, preferably with some small but insignificant current when off and a very well defined non-saturating current when on.

BRIEF DESCRIPTION OF THE DRAWINGS

Preferred embodiments of the invention are illustrated in the accompanying drawings which are briefly described below.

FIG. 1A is a schematic representation of a preferred form of inverter forming a basic unit used in a first family of digital logic circuitry according to this invention.

FIG. 1B is a diagrammatic symbol representing the inverter of FIG. 1A.

FIG. 1C is a schematic representation of an alternative form of inverter constructed using a PNP transistor, which can be used in an alternative form of the first logic family.

FIG. 1D is a schematic representation of another alternative form of inverter constructed using field effect transistor, for use in the first logic family.

FIG. 9 is a diagrammatic representation showing a preferred form of RS flip-flop constructed using inverters of FIG. 1A, which is useful in the first family of logic circuitry.

FIG. 10A is a diagrammatic representation showing a preferred form of clocked RS flip-flop constructed using inverters of FIG. 1A, which is useful in the first family of logic circuitry.

FIG. 10B is a diagrammatic representation showing a preferred form of clocked data latch using inverters of FIG. 1A, which is useful in the first family of logic circuitry.

FIG. 11 is a diagrammatic representation showing a preferred form of master-slave flip-flop constructed using inverters of FIG. 1A, which is useful in the first family of logic circuitry.

FIG. 13A is a schematic representation of a preferred form of NOR gate forming a second basic unit in the second family of digital logic circuitry of this invention.

FIG. 13B is a diagrammatic representation symbolizing the NOR gate of FIG. 13A.

FIG. 14A is a schematic representation of an alternative NOR gate used as a third basic unit in the second family of digital logic circuitry.

FIG. 14B is a diagrammatic representation symbolizing the NOR gate of FIG. 14A.

FIG. 14C is an alternative diagrammatic representation symbolizing the NOR gate of FIG. 14A.

FIG. 15A is a schematic representation of a preferred form of OR gate constructed using an inverter and NOR gate as shown in FIGS. 12A and 13A, which is useful in the second family of logic circuitry.

FIG. 15B is a diagrammatic representation of the OR gate shown in FIG. 15A.

FIG. 16 is a diagrammatic representation showing a preferred form of buffer constructed using inverters of FIG. 12A, which is useful in the second family of logic circuitry.

FIG. 17 is a diagrammatic representation showing a preferred form of AND gate constructed using inverters of FIG. 12A, which is useful in the second family of logic circuitry.

FIG. 18 is a diagrammatic representation showing a preferred form of NAND gate constructed using inverters of FIG. 12A, which is useful in the second family of logic circuitry.

FIG. 27 is a diagrammatic representation showing one form of power network system useful in the digital logic circuitry according to this invention.

FIG. 28 is a diagrammatic representation showing another form of power network system useful in the digital logic circuitry according to this invention.

FIG. 29 is a diagrammatic representation showing a further form of power network system useful in the digital logic circuitry according to this invention.

FIG. 33 is a diagrammatic pictorial view showing a plurality of logic units provided with power using an upper planar power grid which supplies and distributes current and a lower planar power grid which receives and accretes current from various logic units. Details showing actual connections and consruction of the upper and lower power grids are not shown in FIG. 33 for clarity and reference should be made to FIG. 34A.

FIG. 34A is a plan or layout view of a portion (sector) of an integrated circuit chip showing positive and negative power networks superimposed to show the relative positions when arranged on a chip in substantially parallel but distinct planes;

FIG. 34B is a layout view of the positive power grid sector shown in FIG. 34A.

FIG. 35B is a still further enlarged plan or layout view showing a single logic cell as presented in FIG. 35A.

FIG. 35C is a cross-sectional view taken along line 35C—35C of FIG. 35B.

FIG. 35D is a cross-sectional view taken along line 35D—35D of FIG. 35B.

FIG. 40 is a diagram showing the resistance on a preferred positive power grid connected in a full logic array network, including logic inverters and a negative grid, at various points across the positive grid. One half of the inverters are turned on.

DETAILED DESCRIPTION OF THE PREFERRED EMBODIMENTS

Figure 2A:
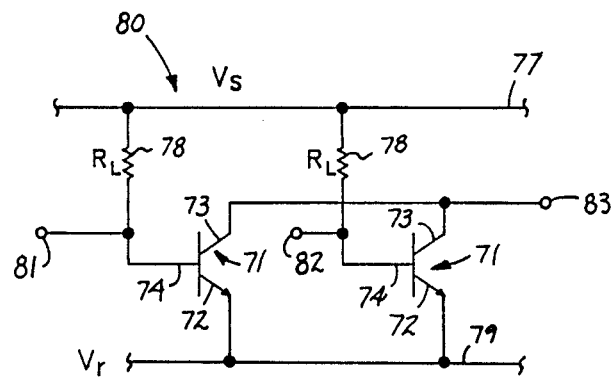
FIG. 2A is a shematic representation of a preferred form of NOR gate constructed using inverters as shown in FIG. 1A. The NOR gate is useful in the first family of logic circuitry.

The following disclosure of the invention is submitted in compliance with the constitutional purpose of the Patent Laws "to promote the progress of science and useful arts" (Article 1, Section 8).

Logic Units and Gates

FIG. 1A shows a preferred inverter 70 according to this invention. Inverter 70 includes an NPN bipolar transistor 71 having an emitter, collector and base marked 72, 73 and 74, respectively. The base is the control terminal and the collector and emitter are the first and second current conduction terminals, respectively. Collector 73 is connected as the inverter logical output 75. Base 74 is connected as the inverter logical input 76. Power is supplied from a power or current supply conductor 77 through an appropriate load means such as load resistor 78. Alternative electronic forms such as a properly biased transistor can also be used as a load in appropriate circumstances. Load resistor 78 is most preferably positioned immediately adjacent the switching transistor on the chip. Positive current flows from positive first power network 77 through load resistor 78 and out to the previous digital stage through input 76 when the input is low. When input 76 is high, transistor 71 turns on and positive current passes in through output 75, down through transistor 71, and out through emitter 72 to a negative second power network 79 which can be a ground connection. The negative second power network is maintained at a return voltage $V_r$ which is below the supply voltage $V_s$ by a logic unit differential voltage which is at least sufficient to forward bias the base-emitter junction of transistor 71 to produce substantial current flow therethrough.

FIG. 1B shows a symbol representing inverter 70 with logical input 76 and logical output 75. The connections for inverter 70 to the power networks 77 and 79 are not shown in this or other logic diagrams, but such connections are implied by the symbol. Inverter 70 is the primary unit used in the first family of digital logic circuitry according to this invention.

FIG. 1C shows an alternative inverter 70a for use in an alternative form of the first logic family. Inverter 70a includes a PNP bipolar transistor 71a with emitter 72a, collector 73a and base 74a. Emitter 72a acts as the second current conduction terminal and is connected to a more positive second power network 77a. Collector 73a acts as the logical output 75a from inverter 70a and is connected to an input of a logically downstream inverter (not shown). Collector 73a also acts as the second current conduction terminal of transistor 71a. Base 74a acts as a control terminal and is connected to the negative first power network 79a via load resistor 78a to act as the logical input of the inverter. The construction of inverter 70a is substantially the same as inverter 70 except for the substitution of PNP transistor 71a for NPN transistor 71, and the load resistor is connected to a first power network which is negative and the transistor emitter is connected to a second power network which is positive. In general the description given herein will be provided with respect to NPN based logic systems because of the greater speed now available using such transistors as compared to available PNP transistors. However, analogous PNP versions of the logic devices can easily be constructed using the inverter 70a in lieu of inverter 70 with the indicated changes. Accordingly, the logic diagrams and descriptions given below will apply to either version even though the express description is for NPN versions.

FIG. 1D shows a further alternative inverter 70b constructed using a suitable field effect transistor, such as a metal oxide semiconductor field effect transistor 71b (MOSFET), in lieu of bipolar transistor 71. The gate 74b is connected equivalent to base 74. The source 72b is connected equivalent to emitter 72. The drain 73b is connected equivalent to collector 73. Inverter 70b also includes a load, such as load resistor 78b, connected between the logical input node at gate 74b and the first power network conductor 77. The logical output is formed by the drain 73b. The gate acts as the control terminal of MOSFET 71b. The drain acts as the first current conduction terminal or current supply terminal. The source acts as the second current conduction terminal or current return terminal. Other components of inverter 70b are numbered similar to corresponding parts of inverter 70 with an additional "b".

FIG. 2A shows a preferred two input NOR gate 80 used in the first family. NOR gate 80 is constructed using two inverters 70. NOR gate 80 includes two logical inputs 81 and 82 which are connected to the bases 74 of parallel inverter transistors 71. The emitters 72 are connected to the current return conductor 79 which exists at return voltage $V_r$. The collectors 73 of both of the transistors 71 are joined to form output 83 of the NOR gate. If either of transistors 71 are on then the output node is drawn low. This operational characteristic also applies to other logical devices described herein where two or more collector outputs share a node.

Figure 2B:
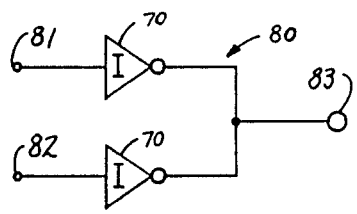
FIG. 2B is a diagrammatic representation of the NOR gate of FIG. 2A.

FIG. 2B shows a logic symbol representing NOR gate 80 and showing its construction using two parallel current mode inverters 70 with their collectors outputs joined.

Figure 3:
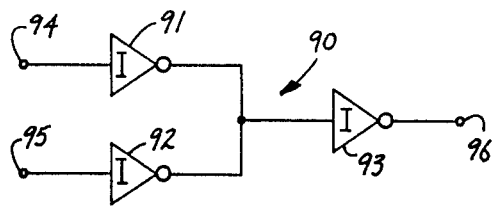
FIG. 3 is a diagrammatic representation showing a preferred form of OR gate constructed using inverters of FIG. 1A, which is useful in the first family of logic circuitry.

FIG. 3 shows a logic diagram representing a preferred form for constructing an OR gate 90 using three current mode inverters 91, 92 and 93, which are all preferably constructed the same as inverters 70 or 70a described above. Inverters 91 and 92 are connected in parallel and provide inputs 94 and 95 for OR gate 90. The outputs from inverters 91 and 92 are connected together and to the input of inverter 93. The output of inverter 93 is the output 96 for OR gate 90. The positive and negative power network conductors have not been shown in FIG. 3 but are connected as shown in FIGS. 1A or 1C with respect to each inverter cell.

Figure 4A:
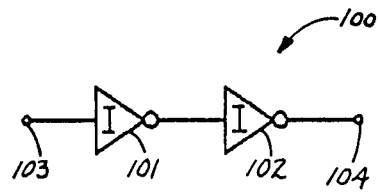
FIG. 4A is a diagrammatic representation showing a preferred form of buffer constructed using two inverters according to FIGS. 1A and 1B, which is useful in the first family of logic circuitry.
Figure 4B:
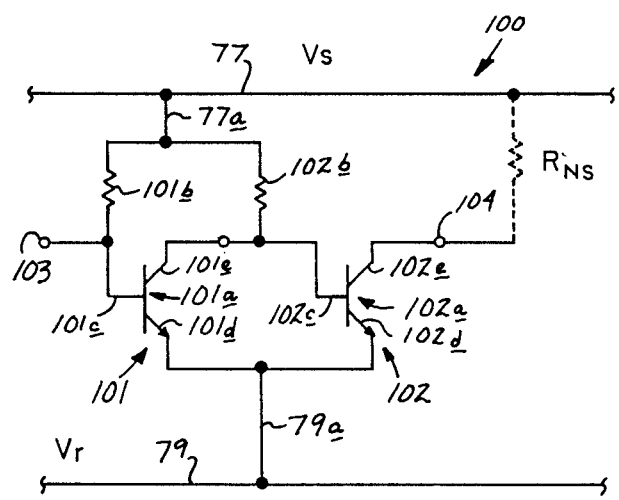
FIG. 4B is a schematic representation of a preferred first form for carrying out the buffer shown in FIG. 4A.
Figure 4C:
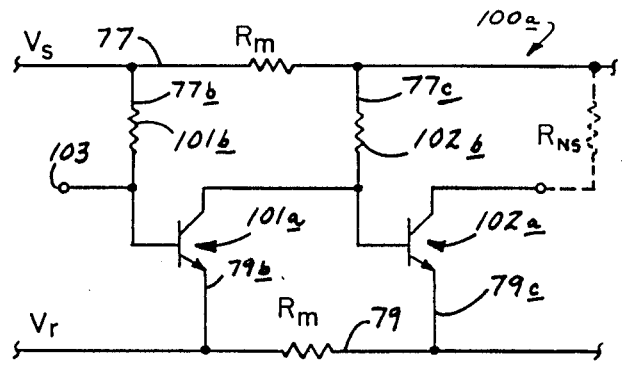
FIG. 4C is a schematic representation of a preferred second form for carrying out the buffer shown in FIG. 4A.

FIG. 4A shows a preferred buffer 100 used in the first logic family of this invention. Buffer 100 is preferably constructed from two inverters 101 and 102 which are logically connected in series. Inverters 101 and 102 are current mode inverters such as described above as 70 (or 70a). The input 103 of buffer 100 is the input to first inverter 101. The output of first inverter 101 is connected to the input of second inverter 102. The output 104 of inverter 102 is the output for buffer 100. Power current is supplied to inverters 101 and 102 in the same manner and structure as described above with regard to inverter 70. FIG. 4B and 4C show alternative electronic structure 100 and 100a used to implement buffer 100. They are described in greater detail below with respect to operation and current balance.

Figure 5:
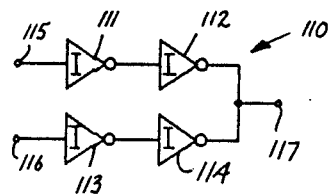
FIG. 5 is a diagrammatic representation showing a preferred form of AND gate constructed using inverters of FIG. 1A, which is useful in the first family of logic circuitry.

FIG. 5 shows a preferred AND gate 110 for use in the first logic family of this invention. AND gate 110 is advantageously constructed using four inverters 111–114 such as described above. AND gate 110 has inputs 115 and 116 which are also inputs to inverters 111 and 113, respectively. The outputs from inverters 111 and 113 are connected to the inputs of inverters 112 and 114, respectively. The outputs from inverters 112 and 114 are connected together to form the ouput 117 of AND gate 110.

Figure 6:
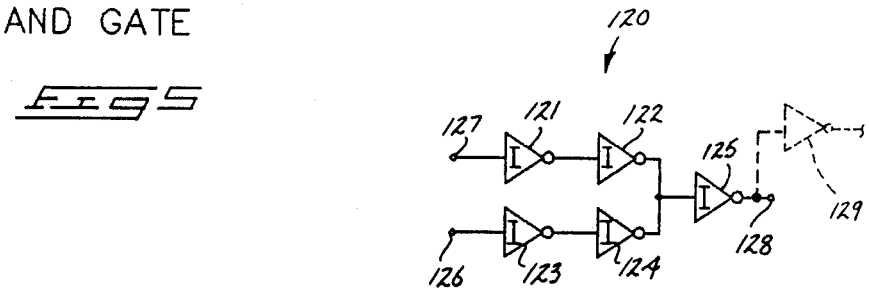
FIG. 6 is a diagrammatic representation showing a preferred form of NAND gate constructed using inverters of FIG. 1A, which is useful in the first family of logic circuitry.

FIG. 6 shows a preferred NAND gate 120 for use in the first logic family of this invention. NAND gate 120 is constructed substantially like AND gate 110 with an additional inverter at the output. NAND gate 120 includes inverters 121–125. The inputs 127 and 126 to inverters 121 and 123 serve as the inputs to NAND gate 120. The outputs from inverters 121 and 123 are connected to the inputs of inverters 122 and 124, respectively. The outputs from inverters 122 and 124 are connected together and to the input of inverter 125. The output 128 of inverter 125 is the logical output from NAND gate 120. The output from inverter 125 can also be input to a dummy inverter 129 (shown in phantom) to provide a current balanced NAND gate structure. A current balanced logic function conducts an approximately constant amount of current between the positive and negative power networks for the different operational conditions which it can assume. Further aspects of current balancing will be more fully explained hereinafter.

Although NOR gate 80, OR gate 90, AND gate 110, and NAND gate 120 are shown as having only two inputs, it is alternatively possible to have additional multiple inputs. Additional inputs can be added by providing parallel logical structures similar to that shown. For instance, NOR gate 80 can be extended for additional multiple inputs by adding an additional input using an additional inverter stage (not shown) and having the output of the inverter connected to output 83 in the same manner as the inverters shown. Additional inputs can be provided to OR gate 90 by adding one or more additional inverters (not shown) parallel to inverters 91 and 92, which have inputs which are connected to some previous logical operator and an output which is connected to the input of inverter 93. AND gate 110 can similarly be provided with one or more additional parallel sets of two inverters. The two additional inverters are connected in series in the same manner as inverters 111 and 112 or inverters 113 and 114. The input of the additional pair of inverters provides another logical input to the AND gate. The second of the serially connected inverters is connected with the output thereof connected to AND gate output 117. NAND gate 120 can also be adapted to handle more than two inputs by adding additional pairs of serially connected inverters similar to pairs 121 and 122 or 123 and 124. The output from any such additional pairs of inverters are connected to the input of inverter 125.

Figure 7:
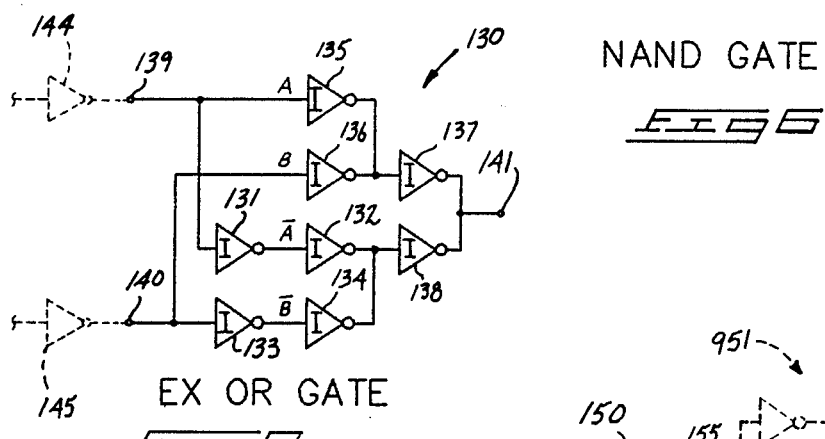
FIG. 7 is a diagrammatic representation showing a preferred form of EXCLUSIVE OR (EX OR or XOR) gate constructed using inverters of FIG. 1A, which is useful in the first family of logic circuitry.

FIG. 7 shows a preferred EXCLUSIVE OR (EX OR or XOR) gate 130. EXCLUSIVE OR gate 130 is advantageously constructed using 8 current mode inverters as described above which are numbered 131–138. EX OR gate 130 has inputs 139 and 140. Input 139 is connected to both the input of inverter 131 and the input of inverter 135. The output of inverter 131 is connected to the input of inverter 132. Input 140 is connected to the inputs of inverters 136 and 133. The output of inverter 133 is connected to the input of inverter 134. The outputs from inverters 132 and 134 are connected together and to the input of inverter 138. The output of inverters 135 and 136 are connected together and to the input of inverter 137. The outputs from inverters 137 and 138 are connected together to form the output 141 of EX OR gate 130.

FIG. 7 also shows two associated inverters 144 and 145 in phantom. These inverters input to the gate and can either be sepcially added or can be part of some gate, buffer, inverter or other structure needed in the chip. The inverters 144 and 145 can be considered associates of EX OR gate 130 to achieve a more nearly current balanced structure. However, the combination of inverters 144 and 145 connected as shown in FIG. 7 does not provide strictly constant current flow. In many cases such a degree of current balancing is sufficient for chips constructed according to this invention. The letters A, $\overline{A}$, B, $\overline{B}$ are representative of signals and are included merely for ease in recognizing complements of the input signals A, B.

Figure 8:
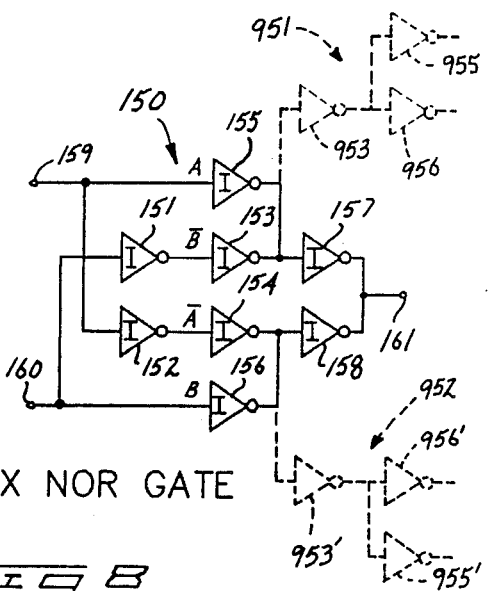
FIG. 8 is a diagrammatic representation showing a preferred form of EXCLUSIVE NOR (EX NOR) gate constructed using inverters of FIG. 1A, which is useful in the first family of logic circuitry.

FIG. 8 shows a preferred form of EXCLUSIVE NOR (EX NOR) gate useful in the first logic family of this invention. EXCLUSIVE NOR gate 150 utilizes 8 current mode inverters 151–158. Current mode inverters 151–158 are constructed substantially the same as inverter 70 (or 70a) described hereinabove. EX NOR gate 150 includes inputs 159 and 160. Input 159 is connected to the inputs of inverters 152 and 155. Input 160 is connected to the inputs of inverters 151 and 156. The output from inverter 151 is input to inverter 153. The output from inverter 152 is input to inverter 154. The outputs from inverters 155 and 153 are connected together and to the input of inverter 157. The outputs from inverters 154 and 156 are connected together and to the input of inverter 158. The outputs from inverters 157 and 158 are connected together to form output 161 of EXCLUSIVE NOR gate 150.

The EX NOR gate 150 can be considered with prior stage inverters (not shown) similar to 144 and 145 of FIG. 7 to achieve a more nearly, but not perfectly, current balanced gate. Such degree of current balancing will typically be acceptable in circuitry according to this invention. In addition, this gate can be fully balanced using inverters 953, 955, 956 and 953', 955' and 956' (shown in phantom) as will be explained more fully below.

FIG. 9 shows a preferred RS flip-flop 163 for use in the first logic family according to this invention. RS flip-flop 163 advantageously utilizes four current mode inverters 164–167. Inverters 164–167 are the same as current mode inverter 70 described hereinabove. The R or reset input 168 of RS flip-flop 163 is connected to the input of inverter 164. The S or set input 169 is connected to the input of inverter 167. The output from inverter 164 is connected to the Q output 170 and to the input of inverter 166. The output from inverter 167 is connected to the Q bar output 171 and to the input of inverter 165. The output from inverter 165 is connected to the Q output. The output of inverter 166 is connected to the Q bar output.

Inverters 165 and 166 form a latch or memory cell. This latch portion is inherently current balanced since only one of inverters 165 or 166 can be on at a given time. The remaining inverters 164 and 167 can be current balanced with inverters from prior stages (not shown) as will be explained below.

FIG. 10A shows a preferred clocked RS flip-flop 180 for use in the first logic family circuits according to this invention. Clocked RS flip-flop 180 includes 8 inverters 181–188. The C or clock input 189 is connected to the inputs of inverters 181 and 184. The R input 190 is connected to the input of inverter 182. The outputs form inverters 181 and 182 and connected together and to the input of inverter 185. The S input 191 is connectd to the input of inverter 183. The outputs from inverters 183 and 184 are connected together and to the input of inverter 188. The output of inverter 185 is connected to the Q output 193 and to the input of inverter 187. The output of inverter 188 is connected to the Q bar output 194 and to the input of inverter 186. The output of inverter 186 is connected to the Q output 193, and the output of inverter 187 is connected to the Q bar output 194.

The clocked RS flip-flop of FIG. 10A is not completely current balanced. The cross-connected inverters 186 and 187 do inherently current balance. In most systems a complementary clock signal $\overline{C}$ is available, and a dummy driven by $\overline{C}$ and carrying 2 units of current will balance out inverters 181 and 184. When C is low and inverters 181 and 184 are off, inverters 182 and 185 act as a current balanced pair, as do inverters 183 and 188. When C is high, inverters 181 and 184 are on and inverters 185 and 188 are off. Normally $\overline{R}$ and $\overline{S}$ are high, so inverters 182 and 183 balance out inverters 185 and 188. Only when $\overline{R}$ or $\overline{S}$ go low will a small current imbalance exist. $\overline{R}$ and $\overline{S}$ are not allowed to be low simulatneously. These conditions will provide a sufficient degree of current balancing for circuitry according to this invention.

FIG. 10B is a clocked data latched 180a which is constructed the same as clocked RS flip-flop 180. Reference is made to that description except all items are numbered with an additional "a" added to the reference numerals. Also the R and S inputs are defined as D and $\overline{D}$ connections representing data and data complement, respectively.

The clocked data latch 180a has four (4) inverters on and four (4) off when the clock is high. When the clock is low, there are three (3) inverters on and five (5) inverters off. This degree of imbalance will typically be acceptable as sufficiently current balanced in most applications under this invention.

FIG. 11 shows a preferred form of master-slave flip-flop 200 useful with first logic family circuits according to this invention. Master-slave flip-flop 200 utilizes 16 current mode inverters 201-216, such as inverter 70. The C input 218 of master-slave flip-flop 200 is connected to the input of inverters 201 and 204. The D input 219 is connected to the input of inverter 202. The D bar input 220 is connected to the input of inverter 203. The outputs of inverters 201 and 202 are connected together and to the input of inverter 205. The outputs of inverters 203 and 204 are connected together and to the input of inverter 208. The output of inverter 205 is connected to the output of inverter 206 and also to the input of inverter 207. The output of inverter 208 is connected to the output of inverter 207 and to the input of inverter 206. The output of inverter 206 is connected to the input of inverter 210. The output of inverter 207 is connected to the input of inverter 211. The C bar input 217 is connected to the inputs of inverters 209 and 212. The outputs from inverters 209 and 210 are connected together and to the input of inverter 213. The outputs from inverters 211 and 212 are connected together and to the input of inverter 216. The output from inverter 213 is connected to the output of inverter 214 and to the input of inverter 215. The output from inverter 216 is connected to the output of inverter 215 and to the input of inverter 214. The Q output 221 is connected to the outputs of inverters 213 and 214. The Q bar output 222 is connected to the outputs of inverters 215 and 216. Master-slave flip-flop 200 is inherently current balanced without use of dummy inverters or consideration with associated inverters logically upstream or downstream. The two sets of 8 inverters operate out of phase, so in every case 7 inverters are on; 3 in one half and 4 in the other.

Figure 12A:
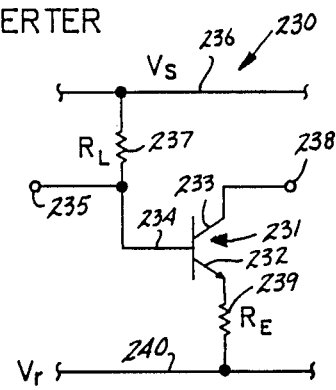
FIG. 12A is a schematic representation of a preferred form of inverter forming a first basic unit in a second family of digital logic circuitry according to this invention.

FIG. 12A shows an alternative preferred current mode inverter 230 which is preferably employed in a second family of digital logic circuitry according to this invention. Inverter 230 utilizes a single transistor 231 having an emitter, collector, and base numbered 232, 233, and 234, respectively. Base 234 acts as the control terminal and collector 233 and emitter 232 act as the first and second current terminals, respectively. Collector 233 can also be viewed as the current sypply terminal and emitter 232 can be viewed as the current return terminal. Base 234 is connected directly to the logical input 235 and to the positive first current supply conductor 236 via load resistor 237. Collector 233 is connected directly to the logical output 238 of inverter 230. Transistor emitter 232 is connected to the negative second network or current return system 240 via an emitter resistor 239.

Figure 12B:
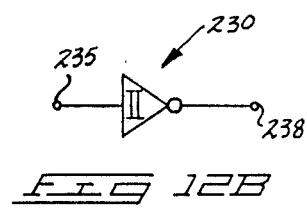
FIG. 12B is a diagrammatic representation symbolizing the inverter shown in FIG. 12A.

FIG. 12B shows a logic diagram symbol representing current mode inverter 230. Power connections to current sypply 236 and current return 240 are not shown but implied by the symbol.

Figure 12C:
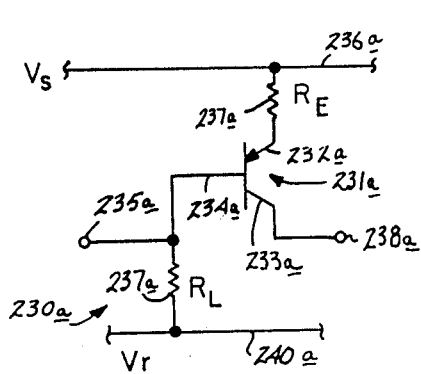
FIG. 12C is a schematic representation of an alternative form of inverter constructed using a PNP transistor, which can be used in an alternative form of the second logic family according to this invention.

FIG. 12C shows an alternative inverter structure 230a for use in an alternative PNP form of the second logic family. Inverter 230 includes a PNP bipolar transistor 231a with emitter 232a, collector 233a and base 234a. Emitter 232a acts as the second conduction terminal and is connected to a positive second power network 240a. Collector 233a acts as the first conduction terminal and as the logical output 238a from the inverter. Collector 233a is typically connnected to an input node (like 235a) of a logically downstream inverter (not shown). Base 234a acts as the control terminal and is connected to a negative first power network 236a via load resistor 237a to serve as the logical input. The construction of inverter 230a is substantially the same as inverter 230 except for the substitution of PNP transistor 231a for NPN transistor 231, and the load resistor is connected to a first network which is negative and the transistor emitter is connected to a second network which is positive. In general, the description given herein will be provided with respect to NPN based logic systems because of the greater speed thereof. Analogous PNP logic circuitry can alternatively be constructed and used by appropriately compensating for the differences indicated above. The logic diagrams and description given below will thus in general apply to either form of the second family.

Figure 12D:
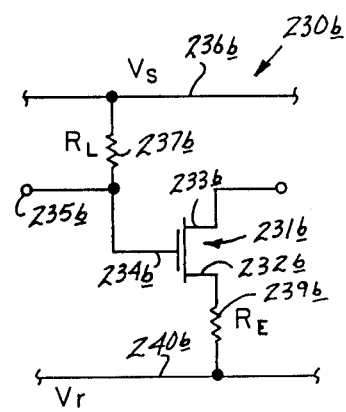
FIG. 12D is a schematic representation of another alternative form of inverter constructed using field effect transistor for use in the second logic family.

FIG. 12D shows a further alternative inverter 230b constructed using a suitable field effect transistor, such as a metal oxide semiconductor field effect transistor 231b, in lieu of bipolar transistor 231. The gate 234b is connected equivalent to base 234. The source is connected equivalent to emitter 232. The drain 233b is connected equivalent to collector 233. Inverter 230b also includes a load, such as load resistor 237b, connected between the logical input node at gate 234b and the first power network conductor 236. The gate acts as the control terminal of MOSFET 231b. The drain acts as the first current conductor terminal or current supply terminal. The source acts as the second current condition terminal or current return terminal. Other components of inverter 230b are numbered similar to corresponding parts of inverter 230 with an additional "b".

FIG. 13A shows a preferred NOR gate 242 used with the second family of digital logic circuitry according to this invention. NOR gate 242 is constructed using two parallel transistors 243 and 244. Transistor 243 has an emitter 245, collector 246 and base 247. NOR gate transistor 244 has an emitter 248, collector 249 and base 250. Transistor emitters 245 and 248 are connected together and to one end of a common emitter resistor 251. The other end of the common emitter resistor 251 is connected to the second power network using current return conductor 252 which is at a current return voltage $V_r$. The transistor collectors 246 and 249 are connected together to form NOR gate output 253. The NOR gate input 254 is connected to base 247 of transistor 243. The other input 255 is similarly connected to base 250 of second transistor 244. Load resistors 256 and 257 are connected to the first power network conductor 258 and to the bases 247 and 250 of first and second transistors 243 and 244, respectively.

FIG. 13B is a logic diagram symbol representative of the NOR gate shown in FIG. 13A and described hereinabove. Power connections to the first network 258 and second network 252 are not shown but implied by the symbol. The NOR gate 242 is referred to as an A-type NOR gate to distinguish it from the B-type NOR gate described below.

FIG. 14A shows the B-type NOR gate 242a which is the same as A-type NOR gate 242 except there are separate emitter resistors 251a and 251b and the emitters are not directly connected together. B NOR gate 242a has inputs 254a and 255a similar to inputs 254 and 255 of NOR gate 242. B NOR gate 242a also has an output 253a similar to output 253 of NOR gate 242. The A and B NOR gates are often interchangeable for use in logic combinations of the second family of logic devices. The A and B NOR gates conduct different amounts of current because of the differences between a single common emitter resistor versus multiple individual emitter resistors as used in B. This difference in the amounts of current drawn by the A and B NOR gates allows the circuit designer to balance the amount of current drawn from the power network as will be explained more fully below.

FIG. 14B is a logic diagram symbol representative of the B-type NOR gate shown in FIG. 14A and described hereinabove. Power connections to the first and second current networks are not shown but implied by the symbol in a manner shown in FIG. 14A. FIG. 14C is an alternative logic diagram symbol representative of the B-type NOR gate shown in FIGS. 14A and 14B. FIG. 14C indicates that B NOR gate 242a is the same as two inverters with their outputs joined.

FIG. 15A shows a preferred form of OR gate used with the second logic family according to this invention. OR gate 260 is essentially a combination of a current mode NOR gate as described above as 242 with the output thereof connected to the input of a current mode inverter such as described above as 230 (see FIG. 15B). FIG. 15A includes first, second and third transistors 261, 262, and 263. First transistor 261 includes an emitter 264, collector 265 and base 266. Second transistor 262 includes an emitter 267, collector 268, and base 269. Third transistor 263 includes an emitter 270, collector 271, and base 272. The logical inputs to OR gate 260 include a first input 273 which is connected to the base 266 of first transistor 261. A second input 274 is connected to base 269 of second transistor 262. Bases 266 and 269 are also connected to the positive current supply conductor 275 of the first power network via load resistors 276 and 277, respectively. Emitters 264 and 267 of the first and second transistors are connected together and to one end of an emitter resistor ($R_E$) 278. The other end of emitter resistor 278 is connected to the second or current return network 279. The collectors 265 and 268 of the first and second transistors are connected together to form the logical output of the NOR gate portion 260a (see FIG. 15B) of the OR circuit. This output is connected to the input of the inverter stage 260b at base 272 of third transistor 263. The base of the third transistor is also connected to the current supply 275 via load resistor 280. Emitter 270 of the third transistor is connected to the second power network 279 via an emitter resistor 281. The collector 271 of third transistor 263 forms the logical output 282 for OR gate 260. OR gate 260 with its shared emitter resistor and inverter stage is a substantially current balanced structure, or in other words its conducts an approximately constant amount of current between the first and second power networks for all input combinations. Resistors 278 and 281 each conduct approximately one unit of current but out of phase with one another.

FIG. 15B is a logic diagram symbol representative of OR gate 260. The symbol comprises the NOR symbol of FIG. 13B with the output thereof input to an inverter symbol as shown in FIG. 12B. Power connections to the current supply and current return networks are not shown by implied.

FIG. 16 shows a preferred buffer for use with the second family of digital logic circuitry according to this invention. Buffer 284 is advantageously constructed using two current mode inverters such as described above as 230. The first inverters 285 has an input 286 which forms the input to the buffer. The output from inverter 285 is connected to the input of the second inverter 287. The output from inverter 287 forms the output of the buffer 288. Buffer 284 is a current balanced structure.

FIG. 17 shows a preferred form of AND gate 290 constructed according to this invention for use in the second family of logic devices. AND gate 290 utilizes four current mode inverters such as described above as 230. The four current mode inverters 291–294 are arranged in two pairs which are serially connected. Input 295 is also the input of inverter 291.

The output from inverter 291 is connected to the input of inverter 292 and the output of inverter 292 is connected to AND gate output 297. AND gate input 296 is the input to inverter 293. The output of inverter 293 is input to inverter 294 and the output of inverter 294 is connected to the AND gate output 297. AND gate 290 is a current balanced structure.

FIG. 18 shows a preferred form of NAND gate 300 used with the second family of logic circuitry according to this invention. NAND gate 300 utilizes five current mode inverters, such as described above as 230. One logical input 306 is the input to inverter 301. The output from inverter 301 is connected to the input of inverter 302. Another logical input 307 is the input to inverter 303. The output from inverter 303 is connected to the input of inverter 304. The outputs from inverters 302 and 304 are connected together and to the input of inverter 305. The output from inverter 305 forms the logical output 308 of NAND gate 300. A dummy inverter 309 can be connected with its input receiving the output of inverter 305 to produce a current balanced NAND gate structure. Alternatively, a logically downstream inverter (not shown) can be considered with NAND gate 300 to produce a current balanced grouping.

Although NOR gates 242 and 242a, OR gate 260, AND gate 290 and NAND gate 300 are shown having only two inputs, it is alternatively possible to construct gates according to this invention with greater number of inputs. Additional inputs for AND and NAND gates are easily provided by adding additional pairs of inverters. The input of the first inverter in such a pair is another gate input and the output from the second inverter of such a pair of pairs is connectred with the outputs of the associated parallel pairs of the gate. NOR gate structures having more than two inputs can be constructed in the B-type format with the addition of further inverters in parallel in a manner best suggested by FIG. 14C. Such multiple input B-type NOR gates can then be connected to a further inverter stage to produce multiple input OR gates.

Figure 19:
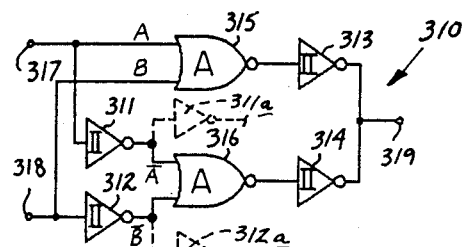
FIG. 19 is a diagrammatic representation showing a preferred form of EXCLUSIVE OR (EX OR or XOR) gate constructed using inverters and NOR gates of FIGS. 12A and 13A, respectively, which is useful in the second family of logic circuitry.

FIG. 19 shows a preferred form of EXCLUSIVE OR (EX OR) gate 310 adapted for use with the second family of digital logic circuitry. EXCLUSIVE OR gate 310 includes four current mode inverters 311–314 which are constructed as inverter 230 described hereinabove. EX OR gate 310 also includes two current mode NOR gates 315 and 316 which are constructed as current mode NOR gates 242 or 242a described hereinabove. EX OR gate 310 has a first input 317 and a second input 318. The first input 317 is connected to the input of inverter 311 and to one of the inputs of NOR gate 315. The second input 318 is connected to the other input of NOR gate 315 and to the input of inverter 312. The outputs from inverters 311 and 312 are connected to the inputs of NOR gate 316. The output of NOR gate 316 is connected to the input of inverter 314. The output of NOR gate 315 is connected to the input of inverter 313. The outputs from inverters 313 and 314 are connected together to form the output 319 of EXCLUSIVE OR gate 310. Dummy inverters 311a and 312a (shown in phantom) are advantageously connected with the outputs of inverters 311 and 312 input thereto to produce an inherently current balanced EX OR gate. If inputs 317 and 318 are fed by signal sources which are inverters, the dummy inverters will not be needed to achieve current balanced operation for all logical states. The signal letters A, $\overline{A}$, B, $\overline{B}$ are included merely for ease of consideration. Where complementary signals A, $\overline{A}$, B, $\overline{B}$ are already available in the circuit then inverters 311 and 312 can be omitted. This also results in a current balanced EX OR gate.

Figure 20:
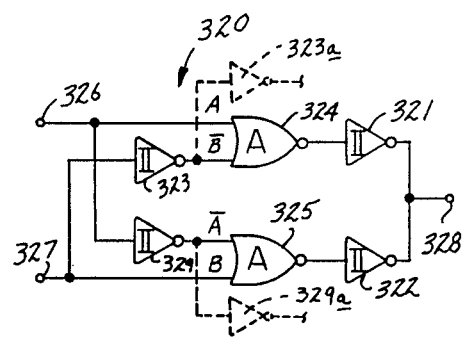
FIG. 20 is a diagrammatic representation showing a preferred form of EXCLUSIVE NOR (EX NOR) gate constructed using inverters and NOR gates of FIGS. 12A and 13A, respectively, which is useful in the second family of logic circuitry.

FIG. 20 shows a preferred form of EXCLUSIVE NOR (EX NOR) gate 320 constructed for use with the second family of digital logic circuits according to this invention. EXCLUSIVE NOR gate 320 is advantageously constructed using four inverters 321, 322, 323 and 329, like inverter 230; and two NOR gates 324 and 325, like NOR gate 242. Input 326 of EXCLUSIVE NOR gate 320 is connected to one side of NOR gate 324 and to an input of inverter 329. Input 327 is connected to an input of NOR gate 325 and to an input of inverter 323. The outputs from inverters 323 and 329 are connected to remaining inputs of NOR gates 324 and 325, respectively. The output from NOR gate 324 is connected to the input of inverter 321. The output from NOR gate 325 is connected to the input of inverter 322. The outputs from inverters 321 and 322 are connected together to fom the logical output 328 of EXCLUSIVE NOR gate 320. Dummy inverters 323a and 329a can be connected to receive the output signals from inverters 323 and 329, respectively, to produce a current balance structure. Alternatively, prior stage inverters (not shown) can be considered with gate 320 to produce a current balanced structure.

The descriptions given for EX OR gates 130 and 310, and EX NOR gates 150 and 320 show only two inputs. EX OR or EX NOR gates having greater numbers of inputs can be constructed by serially cascading these gates as is well-known in the art.

Figure 21:
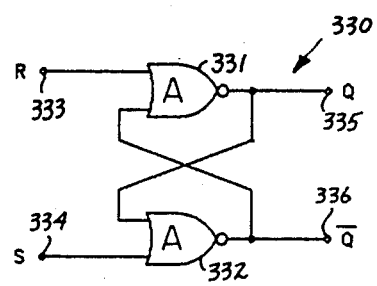
FIG. 21 is a diagrammatic representation showing a preferred form of RS flip-flop constructed using NOR gates of FIG. 13A.

FIG. 21 shows a preferred form of RS flip-flop 330 which is constructed for use with the second family of digital logic circuits of this invention. RS flip-flop 330 utilizes two NOR gates 331 and 332 which are constructed as described hereinabove with respect to NOR gate 242. The R input 333 is connected to one input of NOR gate 331. The S input 334 is connected to one input of NOR gate 332. The output from NOR gate 331 forms the Q output 335 and is also connected to the remainding input of NOR gate 332. The output from NOR gate 332 forms the Q bar output 336 and is also connected to the remaining input of NOR gate 331. RS flip-flop 330 is current balanced for all operational states.

Figure 22A:
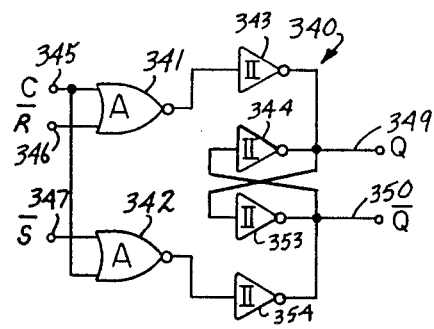
FIG. 22A is a diagrammatic representation showing a preferred form of clocked RS flip-flop constructed using inverters and NOR gates of FIGS. 12A and 13A, which is useful in the second family of logic circuitry.

FIG. 22A shows a preferred clocked RS flip-flop 340 constructed according to this invention for use in connection with the second family of digital logic circuits. Clock RS flip-flop 340 utilizes two NOR gates 341 and 342 which are advantageously constructed as described above with respect to NOR gate 242. Flip-flop 340 also uses four inverters 343, 344, 353 and 354. The C input to clocked RS flip-flop 340 is connected to inputs for both NOR gates 341 and 342. The R input is connected to the other input of NOR gate 341. The S input 347 is connected to the other input to NOR gate 342. The output of NOR gate 341 is connected to the input of inverter 343. The output from NOR gate 342 is connected to the input of inverter 354. The output from inverter 343 is connected to the Q output 349 and is also connected to the input of inverter 353. The output from inverter 354 is connected to the Q bar output 350 and is also connected to the input of inverter 344. The outputs from inverters 344 and 353 are connected to the Q and Q bar outputs, respectively. Clocked R-S flip-flop 340 is a current balanced structure since it is made of two inherently current balanced OR gates and a latch which is also inherently current balanced.

The latch structure formed by inverters 344 and 353 when connected as shown in FIG. 22A can alternatively use a single common emitter resistor rather than the two parallel emitter resistors indicated by the distinct inverters 344, 353. This may be desired to reduce space requirements of the chip. Such construction is also generally possible in other applications of such a cross-coupled latch. It is also noteworthy that an RS flip-flop structure is formed by inverters 343, 344, 353, and 354 when connected as shown in FIG. 22A. This can alternatively be represented as two parallel B NOR gates instead of said four inverters. An R-S flip-flop using four inverters and a common emitter for the latch portion thereof can be used in lieu of the construction shown in FIG. 21. Also, the four inverters of FIG. 22A can be replaced by the cross coupled gate pair of FIG. 21 but such will not be totally current balanced.

Figure 22B:
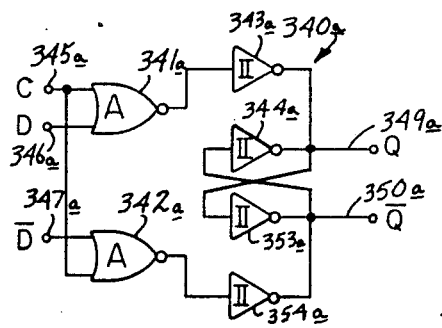
FIG. 22B is a diagrammatic representation showing a preferred form of clocked data latch using inverters and NOR gates of FIGS. 12A and 13A, which is useful in the second family of logic circuitry.

FIG. 22B shows a clocked data latched 340a which is constructed the same as clocked RS flip-flop 340. The reference numerals used in FIG. 22B are similar to those used in FIG. 22A with an additional "a" added thereto. Otherwise the description provided above can be applied thereto except that the data input, D, is used in lieu of R and the data bar input, $\overline{D}$, is used in lieu of S.

Figure 23:
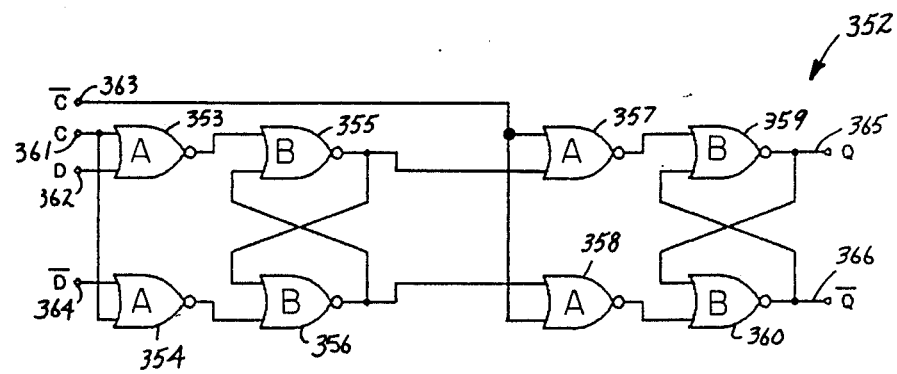
FIG. 23 is a diagrammatic representation showing a preferred form of master-slave flip-flop constructed using NOR gates of FIGS. 13A and 14A, which is useful in the second family of logic circuitry.

FIG. 23 shows a preferred master-slave flip-flop 352 for use with the second family of digital logical circuitry according to this invention. Master-slave flip-flop 352 utilizes 8 NOR gates 353–360. NOR gates 353, 354, 357 and 358 are advantageously constructed like A-type NOR gate 242. NOR gates 355, 356, 359 and 360 are advantageously constructed like B-type NOR gate 242a. The C input 361 of master-slave flip-flop 352 is connected to one input of NOR gate 353 and to one input of NOR gate 354. The D input 362 is connected to the remaining input of NOR gate 353. The D bar input 364 is connected to the remaining input of NOR gate 354. The C bar input is connected to one input of both NOR gates 357 and 358. The output from NOR gate 353 is connected to an input of NOR gate 355. The output from NOR gate 354 is connected to one input of NOR gate 356. The output from NOR gate 355 is connected to a remaining input of NOR gate 357 and to the remaining input of NOR gate 356. The output of NOR gate 356 is connected to a remaining input of NOR gate 358 and to a remaining input to NOR gate 355. The output from NOR gate 357 is connected to an input of NOR gate 359 and the output from NOR gate 358 is connected to an input of NOR gate 360. The output of NOR gate 359 forms the Q output 365 and is connected to the remaining input of NOR gate 360. The output from NOR gate 360 is connected to form the Q bar output 366 and is also connected to the remaining input of NOR gate 359. Master-slave flip-flop 352 forms an inherently current balanced structure for all operational states. Alternatively, a master-slave flip-flop may be constructed using 8 A NOR gates connected as shown in FIG. 23. This will be a current balanced structure.

Preferred Operational and Component Values

One preferred form of digital logic circuitry according to the first family of this invention advantageously utilizes a local differential voltage, $V_s - V_r$, across each inverter 70 between the positive and negative power networks of approximately 800 millivolts (mV). Other preferred values associated therewith include load resistors 78 having resistances of approximately 200 ohms and NPN bipolar transistors designed to conduct approximately 1 milliamp (mA) of current when on with an base-emitter bias voltage of approximately 800 millivolts at a collector-emitter voltage differential of approximately 600 mV. Use of such components and operational parameters provide a logic swing at the switching transistor bases between a low or off condition at approximately 600 mV above the emitter voltage, and a high or on condition at approximately 800 mV above the emitter voltage, which is also the local negative power network voltage ($V_r$). When a transistor turns off, this relatively small 200 mV logic swing changes the base-emitter biasing voltage, preferably resulting in a reduction of current through the switching transistor and load resistor in the range of $10^{-3}$, such as to less than 0.001 mA.

One preferred form of digital logic circuitry according to the second family of this invention advantageously utilizes a local differential voltage, $V_s - V_r$, across each inverter 230 or NOR gates 242 or 242a, equal to 900 mV. Other preferred values associated with such circuitries include load resistors 237, 256, 257, 256a, 257a having resistances of 250 ohms. The NPN bipolar transistors 231, 243, 244, 243a, 244a are designed to conduct approximately 1 mA of current with a base-emitter forward bias voltage of approximately 800 millivolts at a collector-emitter differential voltage of approximately 550 mV. Use of such components provides a logic swing at the switching transistor bases of 250 mV, between approximately 650 mV in the off condition and approximately 900 mV in the on condition, both referenced to the local negative power network voltage. The emitter resistors, such as 239, 251, 251a, and 251b have associated resistances of approximately 100 ohms which cause an increase in the emitter voltage in the on condition to thus provide a base-emitter bias voltage of approximately 800 mV in the on condition and approximately 650 mV in the off condition. A biasing change from 800 down to 650 mV provides a reduction in current through the transistor and load resistor in the range of $10^{-2}$, such as to less than 0.001 mA.

Preferred digital logic circuitry according to the first family of this invention advantageously operate with logic swings on the order of approximately 100–600 mV, more preferably 100–400 mV, even more preferably 100–300 mV. More specifically, the first family of logic circuitry as described herein preferably operates with a logic swing in the range 120–200 mV, most preferably approximately 200 mV. Preferred digital logic circuitry according to the second family advantageously operates with logic swings on the order of approximately 200–600 mV, more preferably 200–400 mV, even more preferably 200–300 mV. More specifically, the second family of logic circuitry most preferably operates with a logic swing of approximately 250 mV. These relatively small but well defined voltage swings are in the linear region of transistor operation and are able to achieve relatively precisely controlled conduction without saturating the transistor or causing speed variations between gates. Typically, current in various inverters on the same chip match within a few percent.

It should be appreciated that the circuitry of this invention provides a logic swing which is at or very near the minimum possible logic swing. This has not been accomplished in any prior art logic family and is particularly advantageous in driving capacitive loads at high speed while dissipating low power.

The preferred logic unit constructions and associated logic swings indicated above result in thresholds for the first family which are approximately 40 mV below the supply voltage $V_s$, or $V_s - 40$ mV, for transitioning from an on state to an off and for transitioning from an off state to an on state. The preferred forms of the second family indicated herein have a threshold level of approximately 80 mV below the supply voltage $V_s$, or $V_s - 80$ mV.

The novel circuitries described herein are shown employing bipolar transistors. Such transistors are currently preferred as constructed in the form of NPN silicon transistors in an integrated circuit. PNP transistors can also be used. Other semiconductor materials such as gallium arsenide, germanium and others are potentially useful in circuitry according to this invention. It is further possible to use transistors other than bipolar with some or all of the novel circuitry described herein with suitable modification to accommodate the differences between bipolar and the other type or types of transistors employed. In general field effect transistors are also useful in this invention. Both junciton and insulated gate field effect transistors are useful, particularly metal oxide semiconductor field effect transistors and gallium arsenide field effect transistors. Ballistic transistors are also useful with this invention. Other transistor types or suitable 3 terminal active electronic devices may also work.

The descriptions given herein show the transistor operated in the forward mode of operation. Although this is preferred it should also be recognized that circuitries according to this invention can alternatively be constructed with the transistors connected to operate in the inverse mode of operation. In the inverse mode the emitters are connected as a collector would be in the forward mode, and the collector is connected as an emitter would be in the forward mode. Inverse mode versions of the invention off the advantage of having multiple collectors (emitters under forward mode operation) for current coupling to multiple downstream logic units. This improves the fanout possibilities without adding as many parallel driving transistors or intervening fanout stages as may be required using forward mode operation and construction.

Integrated circuitries constructed according to this invention can utilize a variety of resistor designs and types. Preferred resistor types include diffused and thin film.

Current Balancing

Digital logic circuitries according to this invention are constructed using transistor connections, current network structures and related componentry and methods which provide for carefully controlled current flow. The carefully controlled current is preferably approximately constant in the power network system over time. This minimizes voltage fluctuations due to the various logical states which the circuitry assumes during operation. The relatively small operational logic swing voltages which are used allow nonsaturating transistor operation to be achieved, thus making the novel circuitries of this invention more efficient and capable of higher operational speeds because of the quicker response possible when turning a transistor off from an unsaturated state versus a saturated state. In preferred constructions the transistors are never placed into hard saturation and also are always forward biased to some degree at the base-emitter junction and therefor operation is maintained in the linear operating region of the transistor.

A principal aspect for preferred utilization of certain power network systems according to this invention is to arrange the logical operators, such as the inverters, AND gates, NOR gates, OR gates, EX OR gates, EX NOR gates, buffers, flip-flop, etc., into current balanced groups which conduct approximately the same amount of current between the power networks for all operative states which will be assumed by that group of logical operators. Examples of current balanced groups which draw a nearly constant current (iso-current groups) are the buffers shown in FIGS. 4A, 4B, 4C and 16. In FIG. 4A the buffer consists of inverters 101 and 102. When input 103 is high the output from inverter 101 is low, as is the input to inverter 102. The output from inverter 102 is accordingly high. Two adjacent serially connected inverters will operate with one switching transistor conducting current through the logically downstream load resistor and the other not conducting a substantial amount of current through the downstream load resistor.

FIG. 4B shows an electronic schematic representative of buffer 100. Current is supplied from positive first power network conductor 77 at voltage $V_s$. A branch conductor 77a is connected to first network conductor 77 and receives a relatively constant current flow therethrough. Inverter 101 includes a first buffer transistor which is preferably a bipolar NPN transistor 101a analogous to transistor of FIG. 1A. Inverter 102 includes a similar second buffer transistor 102a. When the buffer input 103 is high the base-emitter voltage of transistor 101a is forward biased and transistor 101a is on or in a low impedance state. This on condition causes current to flow through the logically downstream load resistor 102b, transistor 101a, current return conductor 79a to negative second power network 79 at voltage $V_r$. A relatively high voltage condition at input 103 also causes load resistor 101b to have approximately the same potential at each end thereof thus reducing current flow therethrough to the insignificant base current from transistor 101a and any leakage allowed by the prior stage. At the same time, current drawn through load resistor 102b is at a relatively full value because transistor 101a is sufficiently forward biased to conduct substantial current through group branch conductor 77a. In that same condition, transistor 102a is in an off or nonconductive state because of the voltage drop across load resistor 102b associated with the substantial current flow through the load resistor and transistor 101a. The lower voltage developed at base 102c causes the base-emitter voltage of transistor 102a to drop below a suitable voltage for significant conduction by the transistor (such as $10^{-3}$) thus placing it in the off state. Accordingly, there is no substantial current flow through either emitter 102d or collector 102e of transistor 102. Thus when buffer 100 receives a high input there is positive current flowing through current supply branch 77a, resistor 102b, transistor 101a, and current return branch 79a. No substantial current flows either at input 103 or output 104 in this condition.

If a prior stage connected to input 103 turns conductive then a substantial current flow occurs through load resistor 101b and at logical input 103. The associated voltage drop across resistor 101b maintains the voltage of transistor base 101c low, thus lowering the base-emitter voltage below the voltage needed for effective current conduction through transistor 101a from collector 101e to emitter 101d. Thus the current flow through downstream load resistor 102b is relatively low and the base 102c of the second transistor is drawn up toward the supply voltage $V_s$ by resistor 102b. This forward biases the base-emitter junction of transistor 102a placing the transistor in a conductive or on state thereby conducting substantial current through the next stage load resistor, $R_{NS}$, logical output 104, transistor 102a and current return conductor 79a. In this operating state with input 103 low, one unit of current will flow through supply branch conductor 77a and at input 103. One unit of current will also flow at output 104 and through return current branch 79a. Under the converse situation with input 103 high, there is also one unit of current conducted through supply branch 77a and one unit of current conducted through the current return branch 79a. Thus, it can be seen that for either of the two possible states of buffer 100, approximately the same amount of electrical current is conducted through branch supply line 77a and branch return line 79a. This assumes that the resistance values of resistors 101b, 102b, and $R_{NS}$ are approximately equal, and that the conductance of the transistor of the prior and next stages (not shown) and transistors 101a and 102a are approximately equal. Relative equality of such values is reasonable when implemented using similar transistor designs on a monolithic integrated circuit chip.

The discussion of buffer 100 given above is exemplary of many different combinations of inverters which can be arranged into pairs or other groups which conduct approximately constant amounts of current for the variety of logical operating states assumes by a chip. The exact number of single transistor inverters used in a current balanced group will preferably vary from two upwardly in groups of even numbers. However, it should be appreciated that functional logical devices are shown which do not have constant current flow. During design of a chip the arrangement and selection of the members of a current balanced group will be primarily directed to conducting an approximately constant amount of current for all logical states which can operatively be assumed by the group. However, in many cases exact equality is not possible.

Groups of logical operators can be arranged together or divided and the subdivisions arranged together so that adjacent groups can function in a manner acceptable for current balanced design. An ideal design is an iso-current group with current supplied and returned over single branch lines, as was shown and described with respect to FIG. 4B. FIG. 4C shows an alternative construction for buffer 100 which causes current loading on conductors 77 and 79 which is substantially equivalent to the construction shown in FIG. 4B. The effective equivalence occurs because of relatively small amounts of current which are typically conducted and the relatively low resistance of the conductors 77 and 79 over the small geographical distances represented between branches 77b and 77c, and 79b and 79c. Thus a current balanced group need not be arranged so that a single conductor carries all current from the network to the group as a whole, instead the various components of a current balanced group are arranged in most cases to be adjacent on the chip and to have current demand which is sufficiently equivalent to an iso-current group arranged for current flow from a single conductor, but which may be connected to each network using one or more tertiary or branch conductors.

The geographical proximity of two inverters making up a current balanced pair may vary depending upon the type of power network system used to supply current throughout the chip. In the preferred power grid structures described below the impedance of the grid is very low and the connection of current balanced pairs can occur over substantial distances primarily governed by the voltage drop in the power network and the requirements for proper current coupling of the logic signal as will be explained more fully below. However, in other power networks the current balanced groups are preferably formed by inverters found within a close distance on the chip, such as in the same power frame as described below. In large arrays, the percent of current associated with any one particular pair of switching inverters will typically be insignificant so long as the array as a whole is current balanced to a sufficient degree, both with respect to the overall array current needs and with respect to the local needs for current balance in order to prevent substantial fluctuations in the amount of current which must be carried by the various conductors of the power networks.

In addition to the current balanced buffers described above, current balanced groups according to this invention are also inherently provided by the AND gates of FIGS. 5 and 16. Both gates include two pairs of two inverters which are serially connected and operate in a complementary fashion as explained above with respect to buffer 100. AND gate 110 can thus be divided into two iso-current groups, one including inverters 111 and 112, and the other including inverters 113 and 114. AND gate 290 can similarly be divided into two iso-current groups, one including inverters 291 and 292, and the other including inverters 293 and 294.

As indicated above, there are also other logical operators which provide a current balanced group. Included are OR gate 260 and the master-slave flip-flops of FIGS. 11 and 23. In all of these designs the inverters can be paired into either sequential pairs which must switch out of phase or into complementary pairs which are input by complementary logic signals or otherwise operate in a complementary relationship.

The proper balancing of current in integrated circuits according to this invention can also advantageously employ several other constructions which allow the circuit designer to assure that approximately constant current is drawn in the various sectors or other relevant portions as needed, and for the chip as a whole. Besides the complementary and sequential pairing of inverter cells as described above, it is also possible for the designer to include dummy inverters connected at appropriate points. The dummy inverters or dummy logic cells include a transistor which has it collector connected to the first power network, either with or without a load resistor. The base of the dummy receives an input thereof, and the emitter is connected to the second power network. Current is conducted between the power networks by the dummy cell transistor when the input at the transistor's base or other biasing control connection is high or active. The use of dummies allows current balanced pairs of inverters to be created at desired points throughout the chip as required by the particular logical functions being constructed. In general, the design and use of current balancing dummies will not be onerous because the designer simply draws loops on a circuit diagram with complementary or sequential pairs in each loop. When a string of current balanced logic units ends or there are unbalanced NOR gates, unbalanced fan in (fanin) or fan out (fanout), then dummies may often be employed, preferably so that substantially all logic units can be paired or otherwise grouped into current balanced groups.

FIG. 6 shows a NAND gate 120 having five inverters. Inverters 121 and 122, and 123 and 124 form sequential pairs and are thus current balanced. The output inverter 125 can advantageously be paired with a sequentially connected dummy 129 thus providing a current balanced pair.

FIG. 7 shows an EX OR gate 130 having sequentially connect current balanced pairs 131, 132; and 133, 134. The unpaired inverters 135 and 136 can be paired with prior stage inverters 144 and 145 to form current balanced groups. The inverters 137 and 138 cannot be paired with distinct dummies because they are located between two nodes which are not exclusively controlled by a single transistor. This indicates that single current balancing dummies may not always be connected to be out of phase with a transistor. However, the degree of imbalance shown can often be accepted without operational error. Because of the way the EX OR gate is interconnected, inverters 137 and 138 can never be on at the same time, but both can be off. This means that the EX OR uses either 4 or 5 current units, or 4.5 ±0.5 units which is approximately a ±11% current imbalance.

Use of dummy logic units is also indicated in FIG. 18 using dummy 309; in FIG. 19 using dummies 311a and 312a; and in FIG. 20 using dummies 323a and 329a. Dummies (not shown) at the inputs of the gates shown in FIGS. 19 and 20 will work in the manner shown in FIG. 7, and would be used in place of inverters 311a, 312a, and 323'a, 329a.

Where an inverter is input by two or more independent prior stages and the inverter's output is connected to at least one other inverter output, then it may not be possible to balance using a single dummy inverter. Balancing at such a structural location (also termed as being between captive nodes) can be accomplished using a first dummy transistor with its input connected to the input of the inverter or other transistor which is in need of having a current balanced complement. A second dummy inverter is connected to receive the output from the first dummy inverter and thus switch out of phase with both the first dummy and transistor which is being balanced. Such a second dummy transistor is designed to conduct as much current as both the first dummy and the transistor being balanced, for example 2 units. Thus the combination of the transistor being balanced and the first dummy are current balanced by the directly complementary current flow of the second dummy.

FIG. 8 shows a pair of captive node dummy assemblages 951 and 952 which are used to balance the current conducted by the inverters 157 and 158, respectively. These inverters are both between captive nodes with intput and outputs to nodes which can be controlled by either of two or more inverters or transistors which are capable of independent operation. Assemblage 951 includes a first dummy 953 and two secondary dummy inverters 955 and 956. The input to inverter 157 is also input to inverter 953 which switches in a manner which is in phase with inverter 157. Together inverters 157 and 953 simultaneously conduct 2 units of current when turned on. The output from inverter 953 is input to a single inverter which conducts 2 units of current, or to the 2 parallel inverters 955 and 956. Inverters 955 and 956 switch in a manner out of phase or complementary to inverter 157 and 953. The group of four inverter thus function to constantly conduct approximately two units of current and form a current balanced group. Assemblage 952 functions in the same manner using inverters 953', 955' and 956'.

Similar current balancing structures can also be used between relatively distant locations on a chip to provide current balanced operation by routing appropriate amounts of current in a complementary manner. The complementary current is conducted to the area to which current is conducted by the logic unit, but out of phase therewith. This achieves relatively constant current flows thereto at all times so that current imbalance does not occur. Such current balancing can conveniently be accomplished using one or more complementary inverters which can conduct out of phase current over independent conductors to the distant location. Alternatively, where the need for current balance between two areas occurs for a large number of logical inputs, then a single conductor can be used to carry a variable number of current units in order to counteract imbalance which would otherwise occur. Use of a single conductor saves interconnect area. Such current balancing techniques can also be used to compensate for logical interconnection between different voltage levels as will be explained more fully hereafter.

Figure 24:
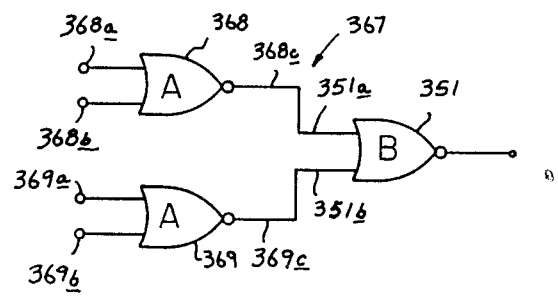
FIG. 24 is a diagrammatic representation of one current balanced structure according to this invention constructed using the NOR gates of FIGS. 13A and 14A.

Another current balancing tool used in the second family of logic is the choice between using A or B type NOR gates as described above. FIG. 24 shows an inherently current balanced structure 367 comprising two A-type NOR gates 368 and 369 which have inputs 368a, 368b, 369a and 369b, respectively. The outputs 368c and 369c from NOR gates 368 and 369 are connected to inputs 351a and 351b of B-type NOR gate 351. The structure 367 constantly uses essentially two units of current, one unit of current for each half which includes one A gate and one of the two inverters of the logically downstream B gate. This forms 2 parallel OR gates with output collectors connected to perform an AND function therebetween. Since OR gates like 260 are inherently current balanced then structure 367 is inherently current balanced.

The current balancing design and operational techniques and structures techniques described above have dual objectives. A first objective is to create a relatively constantly current flow requirement for the array or entire chip for the various possible logic states. This is herein termed total current balancing. This involves assigning at least a majority, more preferably approximately all current flows into current balanced groups or at least to a degree within the limits of acceptable and preferred current balance deviations indicated below. This achieves an approximately constant total current flow with approximately one half of all logic elements on at one time, or the equivalent current flow if the current capacity of the logic elements are not all equal. The valve of current flow through the array is matched to the current availabe from a feed resistor, feed transistor or other means for regulating current flow through the array.

A second objective is to use relatively constant amounts of current for different localized groupings of logic units so that the branches of the power networks are required to carry approximately constant flow for the various logical states which are assumable. This is herein termed local current balancing. The accuracy with which such local current balancing must occur will depend on several factors as explained below.

It has been found possible to create some forms of digital logic circuitry according to this invention which have total current flow through an array or chip which amy vary by as much as ±40% from a mean, average or other desired value. Total array current flow which varies ±30% from a desired value will more often be operative with a larger variety of different array or chip designs. Balancing of total array current to within ±20% will be sufficient to allow consistent error-free operation in most logic array designs which incorporate the inventive technology described or taught herein. More preferably, digital logic designs hereunder will provide for total array chip current flow which is within ±10% of a desired value. Designs having total array current variations of less than ±5% will be operable in almost all cases and is more accuracy than is necessary when the power networks are the preferred grids described below. Current flows whic fall within the indicated variances can be considered functionally substantially equivalent with an appropriate circuit allowing proper operation.

The degrees of variance given above for total current flow through an array do not necessarily apply to local current balance. The degree of accuracy needed in designing a local area will depend upon the size of the area, the logic family used, the type of power networks used to carry current to and from the local area, chip temperature performance characteristics and requirements, and other design factors. Where the local area is defined to include one inverter than current balance does not exist because the transistor turns on and off. However, as the local current balance area is increased in size the degree of balance will approach that required for a total array. In order to determine the maximum acceptable variance in current which can occur for a particular area of the chip or array, it is necessary to analyze the current demands on the particular parts of the power networks affected and then make sure that such fluctuations do not cause a significant change in the differential voltage between the power networks for the logic units within that local area. Where the preferred power grids, such as described with respect to FIGS. 34A and B, are used for the power networks there is little concern for localized current balance because current fluctuations tends to increase or descrease the entire array voltage by very small amounts due to the very low impedance of the grid structures. However, where power rails, such as described with respect to FIG. 29 are used, then analysis of the current flow on each rail zone, such as between secondary rails 403 and 413, must be analyzed to make sure that voltage changes on those conductors do not vary so as to prevent proper control of the transistor biasing voltages. Each design will necessarily vary in its ability to accommodate current flow variations in localized areas of the chip or array within the allowable power network voltages required.

In the preferred embodiments described herein the differential voltages between power terminals are approximately 1 volt. Some designs of the second logic family can accept variance in the power network voltages which is within approximately ±4%, or ±40 mV. Such an amount of variance may not be acceptable in all designs using the second family. Preferably the differential voltage variance is within approximately ±2%, or ±20 mV. More preferably the voltage variance is within ±1%, or ± mV. In the second family these levels of fluctuation causes changes in voltage across the emitter resistors of approximately ±16%, or 16 mV, and ±8%, or ±8 mV, respectively, and changes in the base-emitter voltages of approximately ±4 mV and ±2 mV, respectively. These levels of fluctuation in the base-emitter bias voltage result in current flow and voltage swing variations in the subsequent stage load of approximately ±16% and ±8% respectively. The current output and logic swing of the first family of logic functions is about 5 times more sensitive to power network voltage changes, since there is no emitter resistor to reduce the voltage gain of the inverter or gate. This means a 1% power supply voltage change results in approximately 40% change in current output and logic swing. The novel circuitries of this invention typically allow maintenance of the power supply voltages within approximately ±1%.

Coupling of Logic Signals

Logical interconnections between individual inverters, NOR gates or other logical operators occur via logic signal conductors. The logic signal conductors can be run in any suitable manner on the chip to interconnect the various logical signals of the logic units, gates, or sequential logic operators. In many cases the physical placement of logically adjacent units on the chip will be very close and little concern will exist for relative voltages on the power network or resistive drop along the signal conductor. However, there will be logical interconnections which run a substantial distance across the chip either within a sector or between sectors.

Figure 25:
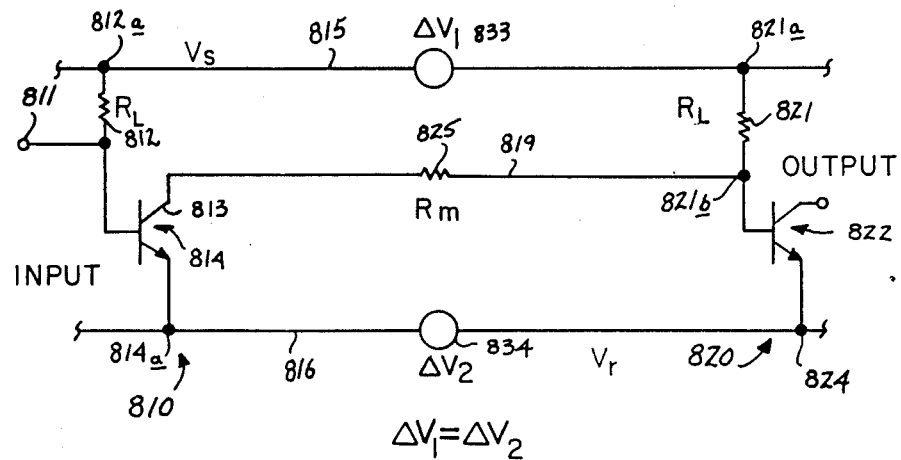
FIG. 25 is a schematic representation showing current coupling of a NOR gate to a succeeding stage where the logic conductor travels a substantial distance across the chip.

FIG. 25 schematically shows a novel current coupled logical interconnection between an invertor 810, such as shown and described with respect to FIG. 1A, and an inverter 820 logically downstream of inverter 810. Inverter 810 includes a transistor 814 and local resistor 812. Inverter 820 includes a transistor 822 and load resistor 821. During operation the inverters conduct current between a positive first power network 815 and a negative second power network 816. The input 811 determines the output state at first inverter output node 813. A low output at node 813 conducts positive current through the logically downstream load resistor 821 and logic signal conductor 819. The resistance of logic signal conductor 819 is represented by resistor 825 which is the resistance of the metallic or other conductor material used ($R_m$). The voltages existing at the positive and negative power networks adjacent to inverter 810 are typically not equal to those adjacent to inverter 820 because of the voltage varying profile across the power networks, as indicated by the voltage sources 833 and 834. However, because of the complementary voltage profiles between the networks, which will be discussed more fully below, each has an approximately equal differential voltage across the logic unit. For example, the voltages from the positive network nodes 812a and 821a of load resistors 812 and 821 to the negative nodes 814a and 824 are approximately equal, respectively.

When switching transistor 814 of inverter 810 turns on, then current must necessarily be conducted in sufficient amount through the downstream load resistor 821 so as to produce a sufficient voltage drop across the load resistor to reduce the base-emitter bias voltage on transistor 822 and effectively turn the transistor off. For preferred bipolar transistors a reduction of current by a factor of 1:100 calls for approximately 120 mV reduction in the biasing voltage, and a factor of 1:1000 calls for approximately 180 mV reduction. Preferred circuits according to this invention advantageously provide approximately 200 mV and 250 mV base-emitter voltage swings for the first and second logic families, respectively, in order to provide a factor of safety and assure adequate voltage differential at the load resistor 821 to thus provide the desired voltage swing and associated current reduction in the subsequent stage transistor 822. The logic signal conductor resistance 825 can theoretically approach the value of the load resistance. The resistance allowed in signal lines of the exemplary forms of the first and second logic families are accordingly as high as 200 ohms and 250 ohms for the first and second logic families, respectively for a 1 mA collector current.

The power network systems used in this invention allow the power supply voltages as referred to ground to vary from location to location on the chip. Where a driving logic unit operates at relatively lower power network voltages than a connected logically downstream stage, then the voltage differential from node 821a to node 814a will be relatively greater and tend to counteract the logic signal conductor resistance. Where the downstream logical stage operates at lower power network voltages, the maximum acceptable length of logic conductor 819 will be relatively shorter in order to avoid saturation. The high collector impedance will maintain current at approximately constant values within the acceptable limits if the transistor is not in a saturated mode of operation. In either case when the logic conductor resistance becomes sufficiently great to affect operation, then it is preferred to pass the signal through a repeater such as an intermediate buffer or inverter stage at some intermediate geographical location on the chip.

The current coupling of logical signals according to this invention is in part provided by connecting the load resistor, such as 821, to its associated transistor, such as 822, to form a logic unit which has a well defined differential voltage across the logic unit's power network connection nodes, such as between nodes 821a to 822d. This must be sharply contrasted with the prior art DCTL (direct coupled transistor logic) technique of voltage coupling using a load resistor connected between the transistor collector and the power network at a location adjacent to the transistor which is controlling flow of current through the load resistor.

Figure 26:
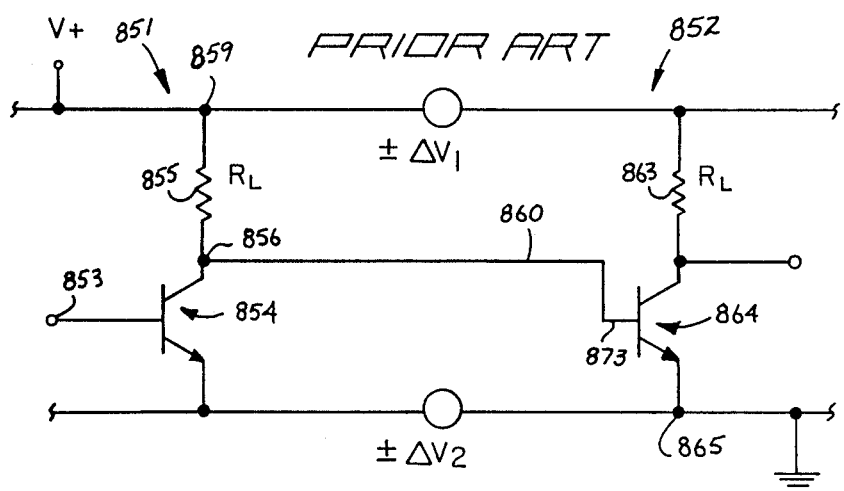
FIG. 26 is a schematic representation showing voltage coupling as practiced by prior art logic circuitries.

FIG. 26 shows a prior art voltage coupling construction between two inverters 851 and 852. Inverter 851 includes a load resistor 855 and transistor 854. Inverter 852 includes a load resistor 863 and transistor 864. The input 853 of inverter 851 is connected to the base of transistor 854. A low signal at input 853 causes transistor 854 to be turned substantially off. This causes the output node 856 to go high. The relatively high voltage signal at output node 856 is transmitted via a signal line 860 to an input 873 of second inverter 852. Assume in this case that an attempt is being made to build logic with a low supply voltage, so $V\pm = 0.8$ volts. The output of the second transistor 864 will vary because the base-emitter bias voltage is dependent upon the voltage developed between power network nodes 859 and 865. The voltage at node 859 is subject to substantially voltage variation relative to node 865 because of the uncertain and varying amounts of voltage drop in the positive network versus the negative network as represented by voltage drops $\Delta V_1$ and $\Delta V_2$ which are typically not equal. Since there is no relationship between these voltage drops the driving voltage between nodes 859 and 865 varies widely on the same chip. This will cause signal error sufficient to effectively cut off or saturate transistor 864, eliminating operation in the linear region and the well defined minimum logic swing. Most logic families do not even attempt to use the power supply lines to directly bias the transistors, and would use a value for V+ of as high as 5 volts. Thus with transistor 854 turned off, node 856 would rise until transistor 864 is saturated or until a Schottky clamp diode between the base and collector turns on. In neither case would transmitter 864 have a well defined collector output current. The Honeywell patent shows logic with a low voltage supply but without a well defined minimum logic swing.

This prior art construction must be contrasted to the present invention where the power networks are constructed in a complementary manner to produce a relatively constant differential voltage so that a load resistor connected from the power network to the base of the transistor can swing between high and low operating states and control the transistor as a result of controlled conductgion through the load resistor. In such novel current coupling constructions and methods, the signal resistance does not substantially affect the voltage at the input node, such as node 821b, because the driving transistor produces a given amount of current for the applied bias voltage. The load resistor is either immediately adjacent or sufficiently adjacent to the input of the transistor being driven so that precise biasing is applied even through the signal line may vary in length and resistance. According, the maximum possible voltage drop in the power network along the signal path does not need to be added to both the positive and negative extremes of the swing as in other logic families. This allows a minimum voltage swing to be used, which increases switching speed and/or decreases power dissipation.

The coupling of logic signals from the NOR gates of FIGS. 2A and 14A illustrate the possibility that output nodes like 83 and 253a can be lower in voltage because of fanin from two or more driving transistor collectors. When two or more transistor simultaneously turn on and conduct current the voltage created at the input of the next stage is significantly lowered due to the nearly two or more times current through the next stage load resistor. In the preferred embodiment examples of the first family, load resistor of 200 ohms will produce voltage drops of approximately 400 mV when there is double current of approximately 2 mA. This causes the base-collector junction to be forward biased 400 mv which is less than soft saturation and is of only small effect on transistor switching speeds and gate delay. However, if greater numbers of fanin connected inverters occur, then provision must be made to prevent the fanin load resistor from causing a load voltage drop in excess of 500 mV. This can advantageously be accomplished by including a suitable diode. A preferred type of diode is a Schottky 0.5 V diode. Such a diode is connected in parallel with the fanin load resistor, such as with the anode thereof connected to the first or positive power network and the cathode thereof connected to a point on the logic signal conductor where the fanin current can easily shunt around the downstream load resistor.

The A-type NOR gate 242 shown in FIGS. 13A and B does not conduct double current and does not apply a double low when both input are high because the conductions of both transistors together carry approximately a single unit of current which flows in the single emitter resistor. This current will be approximately 15% higher than normal since the emitter voltage will be somewhat higher when both transistors are turned on. This slightly higher level of current can usually be ignored in current balancing design. The A-type NOR gate 242 should be contrasted with B-type NOR gate 242a which can conduct either 0, 1 or 2 units of current for respective 0, 1 or 2 high inputs at 254a or 255a.

In addition to fanin it is also necessary to identify the fanout situation in coupling logic signals. In the fanout situation there are multiple downstream logic units and current from an output node many be conducted through more than one downstream load resistor. In such a case the voltage drop across each resistor will be reduced due to the multiple load resistor(s) which would conduct current in parallel. This situation can be remedied by not connecting all of the load resistors for the downstream logic units from the logical input nodes to the first power network connectors, and by directing connecting the inputs of the downstream logic units at the transistor bases. A logic signal voltage drop is developed across a load resistor which is functionally connected to the power network. The number of load resistors required in a fanout situation will be governed by the amount of current conducted by the driving transistor or transistors. Transistors fed with a fanout input can in turn output to other fanout connections.

Logic signals coupled as just described will work with circuitry according to this invention if the differential voltage across the base-emitter junction and any emitter resistor, $R_E$, of the associated transistor (node 821b to 822d in FIG. 25) is maintained within a desired range of values. In preferred forms of the second logic family the upper or high signal level base-emitter biasing voltage range is preferably within ±10 mV, or more preferably ±5 mV. These levels of voltage variations produce associated variations of ±8% and ±4% in the collector current, respectively. This allows such voltage coupling to be used for relatively short signal lines, while current coupling must be used for longer lines where the difference in power network voltage is greater than approximately ±10% mV between the various receiving transistors. In situation where a driving signal must fan out to two gates which are less than 20 mV apart on the power network, one load resistor may be centered between them and their input terminals, or bases, may be directly coupled together. This allows a single transistor to drive multiple gates, rather than requiring a separate transistor or collector to drive each gate.

Power Networks

Digital logic circuitries according to this invention further preferably include current network systems which properly apportion the current flow between the groups of logic units so as to achieve a closely related, preferably nearly constant differential voltage between the networks across the logic units. This allows the power networks to be used to precisely bias the switching transistors without the need for relatively complex and distinct biasing circuitry. A number of different structure are possible for proper current apportionment, approximately constant differential voltage and precise transistor biasing.

FIG. 27 schematically shows one structure 370 for proper apportionment of operation current. The routing and connection of logic signals is not explicitly indicated in FIG. 27 and can in general occur both within one of the current balanced blocks 371-374 or between these blocks or other blocks positioned elsewhere on an integrated circuit chip. Current network system 370 receives positive current from a voltage source 375 at voltage V+. Current is passed through a feed resistor 376 which is preferably of sufficient resistance so as to effectively stabilize and define the amount of current passing through the circuit shown in FIG. 27, between voltage source 375 and a current return or negative terminal 377. The impedance at feed node 378 is low because of the parallel connection of the logical operators in blocks 371-374. This impedance remains low despite switching activity as long as at least 16-20 logic units are connected between the power networks to conduct 8-10 current units. During switching only a few of the logic unit transistors will be switching at any one time so noise remains low. Each current mode inverter or other logic unit which is turned on behaves as a diode connected transistor which creates a low impedance path between the power networks. Node 378 and return 377 can be visualized as the positive and negative bonding pads on an integrated circuit chip or can be terminals to a subsystem within a chip. The feed resistor and voltage source function as a current source and means for providing a substantially constant current flow through the networks. The feed resistor can be on or off the chip and can be made of semiconductor materials or be formed from metallic conductor(s) arranged in a serpentine or other form to produce the desired resistance, or be some combination thereof.

The current supplied by the network is apportioned to the respective circuit blocks 371-374 based upon their current needs and as controlled by ballasting resistors 380-385. In many instances, the current through blocks 371-374 will be equal although such is not necessarily the case. FIG. 27 depicts a case where circuit blocks 371-374 each require relatively constant and equal amounts of current which are arbitrarily expressed in units termed an I unit of current. If each block is assumed to require one unit of current, I, then the total current flow is four units, 4I. In order conductors 371a and b, 373a and b, and 374a and b and provide equal voltage drop across each group 371-374, then resistors 380-385 advantageously take on the relative values shown in Table I, below.

TABLE 1

| Resistor | Resistance |
|----------|------------|
| 380 | R/3 |
| 381 | R/2 |
| 382 | R |
| 383 | R |
| 384 | R/2 |
| 385 | R/3 |

The differing relative resistance values given immediately above are preferably provided in integrated circuit structures according to this invention by utilizing a single conductor material, such as a metal, and by varying the conductive cross-sectional area of the conductors to achieve the relative resistance indicated or relationships analogous thereto. This allows construction which has relatively good tracking of resistance with temperature changes.

FIG. 28 shows another alternative integrated circuit power network structure 430 which can advantageously be used in digital logic circuitry according to this invention. Circuitry 430 is connected to a current source 432 connected between a positive terminal 431 of a power supply (not shown and the current network system at terminal 433 thereof. Terminal 433 represents an integrated circuit connection pad. The current source, such as a voltage supply and feed resistor, or a transistor biased as a current source, is thus placed off the chip to dissipate power at a remote location thus minimizing temperature effects.

Connected to current supply pad 433 are four discrete electrical conductors 434-437 which represent metal conduction lines formed in an integrated circuit. Conductors 434-437 connect to four iso-current or current balanced groups 438-441 made of digital inverters, NOR gates, or other logical structures or combinations thereof such as described above. Current is returned from current balanced blocks 438-441 via electrical conductors 442-445, respectively, to a ground pad 446 formed on the integrated circuit and connected to the negative terminal 447 of the power supply.

The voltages supplied at the positive terminals of the current balanced blocks 438-441 are each different because of the differing lengths of conductors 434-437. If each of the four blocks require equal amounts of current and the conductors 434-437 are of the same material and conductional cross-sectional area, then the resistance of the supply conductors 434–437 will be proportional to the length of such conductors on the IC chip. The voltage supplied to block 438 will thus be higher than the voltage supplied to block 441 with blocks 439 and 440 receiving supply voltages which are approximately linearly ordered therebetween because of the equal geographical spacing. The current return conductors 442–445 each also have different lengths with a proportional variation in resistance under the conditions given above. It can be seen from the layout of FIG. 28 that the lengths of each of the four conduction paths supplying and returning current to and form blocks 438–441 are substantially equal because they travel rectilinearly over the same total horizontal and vertical distances between the same two points, 433 to 466. Thus the total resistance of the current path defined by conductor 434 and 445 equals that defined by conductors 435 and 444; 436 and 443; and 437 and 442; assuming equal resistance for each of blocks 438–441 and equal conductor size and similar conductive material. This structure provides approximately equal voltage differentials across blocks 438–441, but with each block operating at differing absolute voltage levels. Logical interconnection between these blocks and other blocks on the integrated circuit (IC) is possible despite these differences in the absolute operating voltages, $V_s$ and $V_r$, by utilizing current coupling as explained above.

FIG. 29 shows a layout for an integrated circuit power network structure 400 which can be used to achieve desired current apportionment. Structure 400 includes a first current network having a primary power supply rail 401 which receives power from a current souce adjacent to the top edge 402. Side rail 401 as shown, as well as the other conductors shown in FIG. 29, are uniform in thickness perpendicular to the plane of the drawaing, such as 1 micron ($10^{-6}$ meter) in thickness. The horizontal secondary supply rails 403–409 branch from side rail 401 and extend transversely thereto. At each such branching of a horizontal rail, the side rail 401 is diminished in proportion to the relative amount of current which will be diverted to supply the current balanced groups 411 being supplied thereby. A similar diminution in the width and conductional cross-sectional area of the secondary rails occurs at each current balanced block branch 410. If each current balanced block 411 requires a relatively constant and equal amount of current, herein termed one current unit for purposes of this explanation, then the width or cross-sectional conduction area of the network can be appreciated as explained below.

At the extreme right-hand end of top horizontal rail 403 a single current unit flows and the uniform thickness metal conductor has a width equal to a required conductional cross-sectional area, herein termed one unit for purpose of this explanation. The next adjacent block 411 requires an additional unit of current, thus the conductor width (and cross-sectional area) is increased to two width units. Similarly on across the rail each electronic block 411 require an additional unit of current, thus totaling 10 units at the extreme left-hand side of horizontal rail 403. The actual horinzontal spacing between blocks 411 is advantageously made equal but such is not required. The voltage drop along the horizontal rail is defined by Ohm's law which states the $V=IR$; where V is voltage, I is current and R is resistance. At each width increase, the resistance of each segment of the conductive material is decrease and the current is increased a proportional amount. The Resistance R of a metallic conductor or segment thereof is defined by the equation:

$R = p(l/A)$ where:
p is the resistivity,
l is the length of the conductor, and
A is the cross-sectional conduction area which in this case equals t (thickness) $\times$ w (width).

Thus it can be seen that the voltage drop between each block branch 410 is $V = I(pl/A)$ If the voltage, V; resistivity, p; thickness, t; and secondary conductor line length, l; are equal for all groups in an array, then the conductor width will be constant. Thus the width of a uniform thickness conductor is tapered in direct proportion to the current being supplied therethrough, and the tapered powered network will have a regular, approximately linear voltage drop profile or gradient under these conditions. Other voltage profiles can alternatively be used.

Power network system 400 also includes a seocnd power network with a side rail 420 which is tapered similarly to first network side rail 401, except that its direction of taper is inverted. Current in returned from blocked 411 through block return branch conductors 412 which connect to secondary current return rails 413–419. Secondary return rails 413–419 are advantageously tapered or conductively profiled to increase in conductional area from the left-hand block 411 toward the side rail 420. The resistance of the horizontal return rails is advantageoulsy designed to provide a relatively linear voltage decrease across the return rails while providing for the additional current which is added or convened from each block of digital logic circuitry 411, as explained above. Alternatively, the tapered networks can be non-linearly tapered to provide a desired linear or non-linear voltage profile.

The complementary power rail network structure 400 preferably provides substantially constant voltage differentials across each of the electronic logic blocks 411. Logic blocks 411 can advantageously be designed to be locally current balanced so as to conduct relatively constant amounts of current for various logic states. Such a power network system and current balanced grouping design provides relatively constant power for the integrated circuit structure thus stabilizing the voltage at each point thereon for varying logical states and input and output combinations assumed by the digital circuitry over time.

Although structure 400 has been described with respect to each block 411 representing a current balanced group, such as a buffer, AND gate, or other such blocks, it can also represent a logic unit with a single transistor and associated load resistor, along with any desired emitter or tail resistors as described below. In such case current balancing would preferably be employed by arranging the cells 411 into pairs which switch out of phase. Typical arrangements in which relatively balanced current requirements could be developed along long complementary rails include shift resistors or memory chips based on the current balanced latch discussed above. Other logical structure which require an approximately constant current flow on each rail to within a sufficient range so as to maintain relatively precise biasing to the transistor bases can also be used. The relatively precise biasing ensures relatively constant voltage swing.

FIG. 29 also is relevant to the potential need for current balance between different parts of the logic circuitry. The logic units supplied with current by rail 403 and relieved of current by return rail 413 can be considered a rail zone. The other units supplied and relieved of current by opposing rails, such as 404, 414 etc., can also be considered distinct rail zones. The connection of a logical output signal from one rail zone to another rail zone causes additional current loading on the first power network of the rail zone of the driven logic unit. This reduces current loading on the first power network of the rial zone at the signal source. The current is conducted through the load resistor of the downstream logic unit(s) and through the connecting signal line to the driving transistor of the logically upstream zone. In some cases such current diversion will be insignificant and can be ignored as within the acceptable tolerance of current balance. In other cases signal routing must be altered to provide balanced operation between two or more zones. Current balancing between zones can be achieved by using logical devices connected in an appropriate way to provide balanced operation. A complementary or dummy current flow is established so that the same amount of current is used at all times. When the logical interconnection is active the dummy line is off. When the logical interconnection is off then the dummy circuit conducts the equivalent current in the same amount and current flow is kept constant. This can be done between zones operating at approximately the same voltage level or between zones at different levels as explained more fully below. Alternatively, extra devices, such as dummy inverters, can be added to the logically downstream zone to selectively conduct current which is in-phase with the logic unit being balanced. The current from such a unit is conducted between the first power network of the logically upstream zone to the second power network of the logically downstream zone to counteract the current flow between zones due to the active logic device being current balanced.

Figure 30:
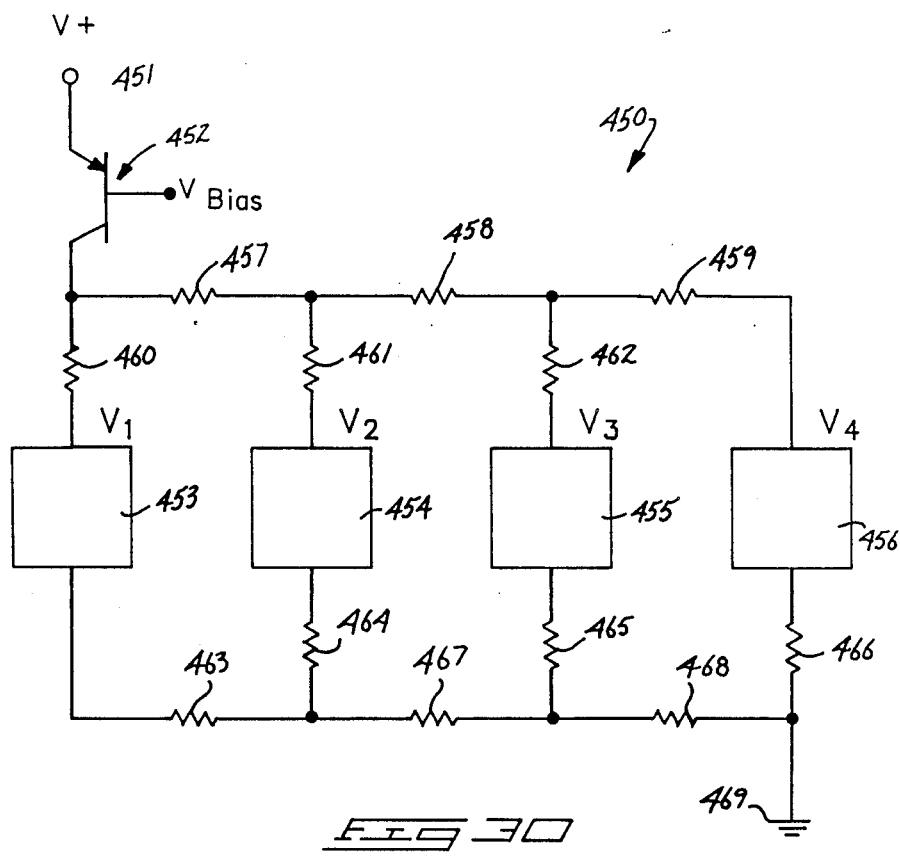
FIG. 30 is a diagrammatic representation showing yet another form of power network system useful in the digital logic circuitry according to this invention.

FIG. 30 shows a further alternative power network structure useful in circuitry according to this invention which may be referred to as a resistor ballasted power ladder circuit 450. The ladder network conducts positive electrical current from a voltage supply 451 through a regulation current feed transistor 452. Feed transistor 452 is biased at a carefully controlled bias voltage, $V_{bias}$, produced by a related circuit, not shown. Feed transistor 452 functions as a current flow regulator or other means for supplying a relatively constant current flow to the array of logic units. Feed transistor 452 can also be considered a series current feed regulation means for regulating current flow through an array. The series current regulation means is in series with the plurality of parallel logic units which conduct current between the power networks.

Circuit 450 supplies current to four current balance groups 453–456. Groups 453–456 need not necessarily use equal amounts of current. Current is properly apportioned between the current balanced groups using a number of ballasting resistors 457–468. The resistances of resistors 457–468 are individually designed according to well-known circuit analysis techniques so that the desired amounts of current are provided for each circuit block 453–456. The effective resistances of the circuitry within the current balanced blocks are also taken into account. The resistances of resistors 457–468 are further designed so that at the desired current flow a differential voltage is produced across each block which also is preferably approximately equal, and at equal absolute voltages as reference to either the supply voltage V+ or ground 469. Coupling of logic signals can be accomplished using current coupling or the alternative voltage coupling discussed above due to power network voltages which are equal. These relatively equal differential voltages provide a basis for well defined biasing voltages needed for precise control of transistor current flows.

The ballasting resistors shown in FIG. 30 can be formed according to well known resistor forming techniques. Alternatively, one or more of the ballasting resistors can be made of serpentine metal or other metallic formation with temperature coefficients of conductivity which match the logic units in response to temperature variation.

Figure 31:
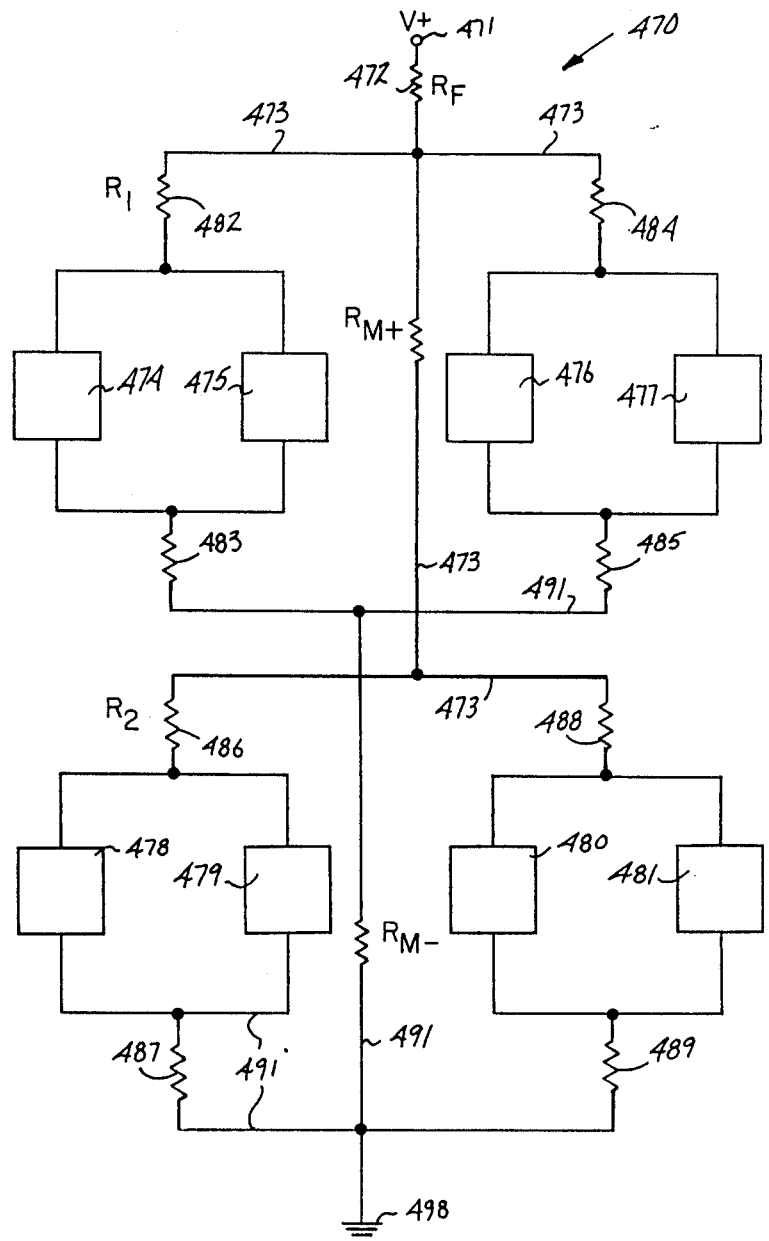
FIG. 31 is a diagrammatic representation showing an additional form of power network system useful in the digital logic circuitry according to this invention.

FIG. 31 shows a still further alternative current network system according to this invention. The circuitry shown in FIG. 31 can be referred to as a resistor ballasted power tree circuit 470. Circuit 470 may be only a portion of a larger array of similar or other suitable construction. The circuit includes a positive voltage supply 471 and current regulating feed resistor 472. Positive network conductors 473 branch outwardly from the feed resistor 472 in a dendritic form. Logic circuitry is arranged into logic units 474–481 each including an inverter, gate or logic group, such as described above. The units are preferably arranged into pairs which together draw a relatively constant current through their associated ballasting resistor 482–489. The resistance values of resistors 482–489 are determined so that the desired amount of current flows through the respective group pairs and returns through the negative current network 491 to ground 498. Resistors 482–489 are also preferably valued so as to provide a desired voltage differential across each of the pairs of logic blocks 474, 475, 476, 477; 478, 479; and 480, 481. The resistors are used to compensate for varying resistive voltage drops occuring in the current distribution lines 473 and current return lines 491 as generally represented by resistance $R_{M+}$ and $R_{M-}$. For example, the resistance $R_1$ of resistor 482 equals the resistances $R_{M+}$ and $R_2$ associated with the power network metal and resistor 486, respectively ($R_1 = R_{M+} + R_2$).

Figure 32:
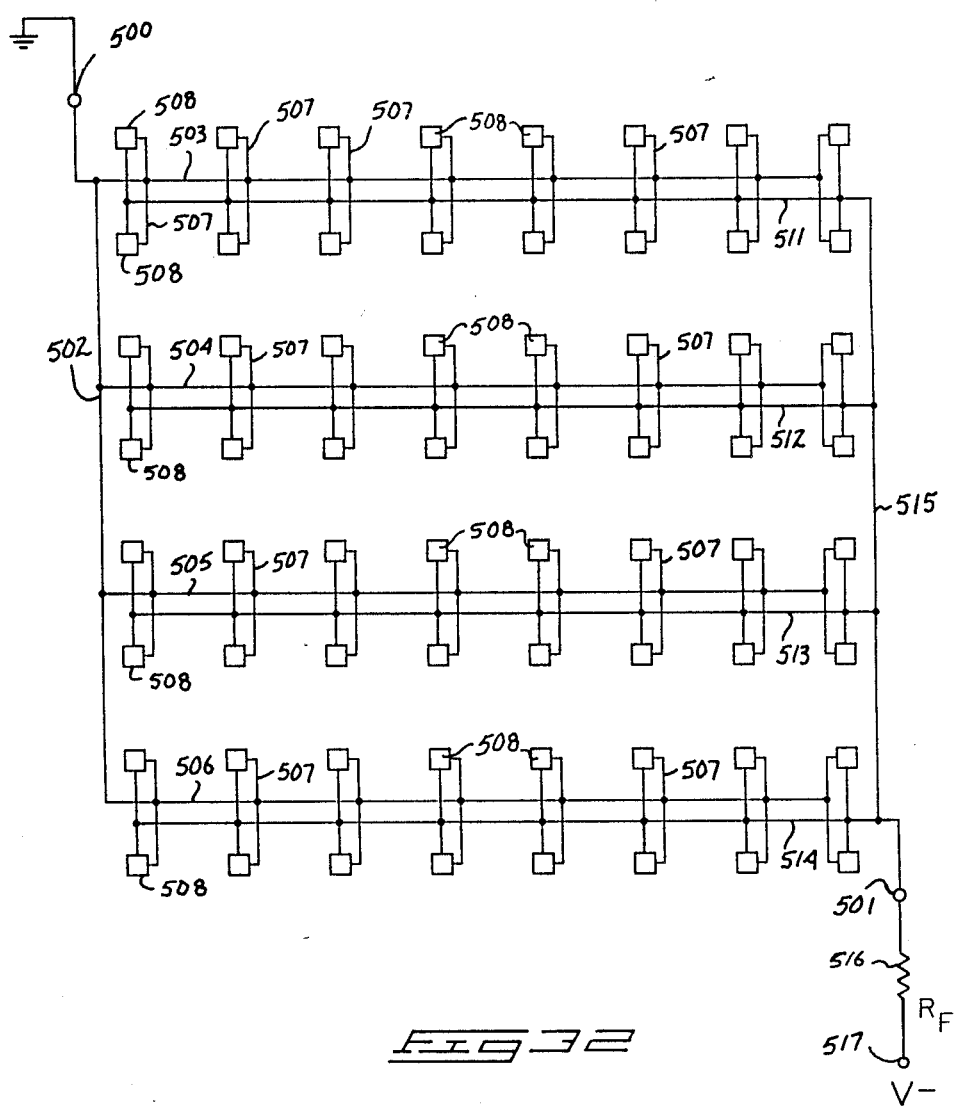
FIG. 32 is a diagrammatic representation showing still another form of power network system useful in the digital logic circuitry according to this invention.

FIG. 32 shows a still further alternative current apportionment system of this invention. Current flows from the relatively more positive terminal 500 which is grounded. Terminal 500 is connected to a positive first network. Current flows from terminal 500 through the first network, logic units 508, second network to a negative terminal 501. The negative terminal 501 is connected to a feed resistor 516 and negative voltage source 517 which are both preferably off chip. The current supply subsystem includes a primary distribution rail 502 which conducts positive current from ground to a plurality of intermediate or secondary rails 503–506. Branch conductors 507 lead from the intermediate rails to individual logic units such as inverters or gate cells 508 which incorporate logic circuitry of the type shown and described above. Inverters or gate cells 508 are arranged in pairs which together draw a substantially constant current since the inverters or other cell components can be logically connected to switch out of phase with their paired mate.

Current passed through the logic units or groups 508 is returned to intermediate or secondary current return rails 511-514 which are connected to a side or primary return rail 515 which conducts the current to current return terminal 501. The arrangement shown in FIG. 32 allows for reduced numbers of rails for the amount of logic circuitry supplied with current, as compared to the spacial layout shown in FIG. 29, because each intermediate rail supplies transistors arranged on both side thereof.

It is noteworthy that of the current networks shown and described above, those constructed using resistance which is provided solely by a single conductive material have an inherent advantage in that the relative resistance values of the different conductive runs are maintained in a relatively proportional relationship with temperature variations. This is most preferably provided by using metal power networks embodied in a monolithic integrated circuit. Temperature variations of a chip as a unit will cause resistance changes in both the semiconductor and metallic conductor materials; however, the change in resistance experienced by the conductor will remain sufficiently proportioned to allow proper operation. Use of semiconductor resistors in series with the logic functions such as in the resistor ballasted ladder and tree circuits of FIGS. 30 and 31 may cause significant relative resistance problems to occur if the circuit operation over a broad range of operating temperatures or if the temperature coefficients of resistivity are substantially different for the various circuit resistors and other components used, such as the interconnecting metallic conductor runs on the chip.

FIG. 33 is a pictorial view diagrammatically illustrating a further preferred integrated circuit power network system including current distribution and retun networks. FIG. 33 indicates that current flows into the sturcture at terminal 520 and is distributed through a first current network which is advantageously a conductive layer, or more preferably a grid 521 which is diagrammatically shown without detail as an upper or top plane in FIG. 33. A plurality of current balanced groups, inverter cells or other logic units 522 are arranged to receive positive current for the first grid 521 and to return current to a second conductive layer or grid 524, shown as a loer plane in FIG. 33. Second grid 524 receives and convenes current from logic units 522 and returns it to a negative or current return terminal 525. The conductive layers forming the first and second power networks, such as indicated in FIG. 33, can alternatively be formed as a continuous or semi-continuous layer with apertures in the conductive metal or other material for passage of signal conductors therethrough or other desired purposes.

FIG 34A shows a top or layout view of one sector 528 of an integrated circuit. The layout includes first and second grids 521 and 522 in greater detail as compared to the conceptual presentation in FIG. 33. The top view shown in FIG. 34A superimposes the first or upper grid with the second or lower grid, thus making cross-over points between the grids appear connected which are in fact not connected because of the spaced preferably coplanar relationship existing between the two grid portions of the networks. Reference to FIG. 34B may be helpful in understanding the basic construction of each of the first and second grids. FIG. 34B shows first grid 521 separate from second grid 524. Current is supplied from other parts of the chip or from a feed resistor or current source through first terminal 520 at the upper left-hand corner of first grid 521. Current flows from terminal 520 to a top or first side rail 531 and a left-hand or second side rail 541 both of which are conductively joined at terminal 520. The side rails 531 and 541 serve as the primary conductors in the upper first grid. A plurality of first grid intermediate or secondary conductors 532-539 and 542-549 extend down and across the sector from the primary conductors. The first set of secondary conductors 532-539 extend downwardly from the top primary rail 531. The second set of secondary conductors 542-549 extend from the second side rail 541 longitudinally across the sector, horizontally from left to right as shown in the FIGS. The secondary conductors 532-539 and 542-549 cross in an intersecting crisscross arrangement that allows electrical conduction between the crossing conductors at each intersection or node. Each such node can be described by referring to the intersecting rails, for example 532/545 for the conductive node created by the intersection of secondary rails 532 and 545.

FIG. 34A also shows a plurality of logic units, cells or modules 530 which are arranged into a rectilinear array for the sector. The sector shown in FIG. 34A is divided into 8×8 or 64 different sections or power frames 531 which each contain 16 cells 530. Each power frame 531 is advantageously divided into four groups 553, each containing 4 cells 530. Alternative arrangements are also clearly possible. The groups are supplied with current via tertiary conductors (not shown in FIGS. 34A or B) which extend between a primary or secondary conductor and the transistor(s), resistor(s) or other components included in each cell 530. FIG. 34A does not attempt to show the specific transistor and resistor structures which can be laid out in any desired arrangement so as to allow construction of inverters, NOR gates, and other logic structures such as described above. The inverters shown in FIGS. 1A and 12A are appropriate logic units for use as cells 530. The description given below with respect to FIGS. 35A-35C describes one preferred layout for power frames and logic cells.

The number of blocks 522 shown in FIG. 33 do not correspond to the power frames 531 shown in FIG. 34A, but are graphically representative thereof as conductors of current between the first and second power networks using suitable logic units.

FIG. 34A also shows a second power network in the form of a lower or negative network 524 which preferably comprises a grid similar to the positive first current distribution grid 521 described above. The first and second grids are arranged in spaced, approximately coplanar face-to-face relationship. The grids are also in complementary opposing orientations with the first and second terminals 520 and 525 contrapositioned at opposing corners of the sector. Second or negative grid 524 includes first and second primary conductors 561 and 571, respectively. First or bottom side rail conductor 571 extends longitudinally along the integrated circuit sector with a first set of secondary conductors 572-579 extending upwardly and transversely across the sector from the bottom toward the top. Second side rail conductor 561 extends along the adjacent right-hand side of the sector from the second or current return terminal 525 upwardly as shown in FIG. 34A. The primary conductors 561 and 571 are electrically joined, preferably contiguously at terminal 525. A second set of secondary conductors 562–569 extend longitudinally (horizontally) across the sector from the right-hand side conductor 561 toward the left-hand side of the sector. Secondary conductors 562–569 and 572–579 intersect to form conductive nodes in an intersecting crisscross pattern, as described above with respect to the first grid. The array of logic modules or cells 530 are connected to the primary and secondary conductors of each network using tertiary conductors (not shown) which extend from any convenient point on the network to the actual physical devices on the chip. The connections for cells 530 are advantageously selected and designed to provide local current balancing so that the conductors carry amounts of current which preferably remain within a suitable range so that the desired relatively constant differential voltage is maintained across the individual logic cells 530 thus biasing the transistors thereof within substantially equal voltage ranges.

The primary and secondary supply and return conductors 531–539, 541–549, 561–569 and 571–579 are preferably tapered, such as in stepwise increases or diminutions as shown in FIGS. 32A and B from the respective positive and negative sector terminals 520 and 525. The cross-sectional conductive area of such conductors is graduated to appropriately carry a desired amount of current and to produce a desired resistance in the conductors which preferably provides desired voltage profile from the terminals over each entire grid 521 and 524. As explained above, when the metal or other conductive layer is of approximately uniform thickness and all current groups use approximately the same amount of current and are regularly spaced, then the width of the conductive primary and secondary rails are tapered in direct proportion to the current being conveyed therethrough and an approximately linear voltage gradient along both the primary and secondary rails is provided.

Figure 35A:
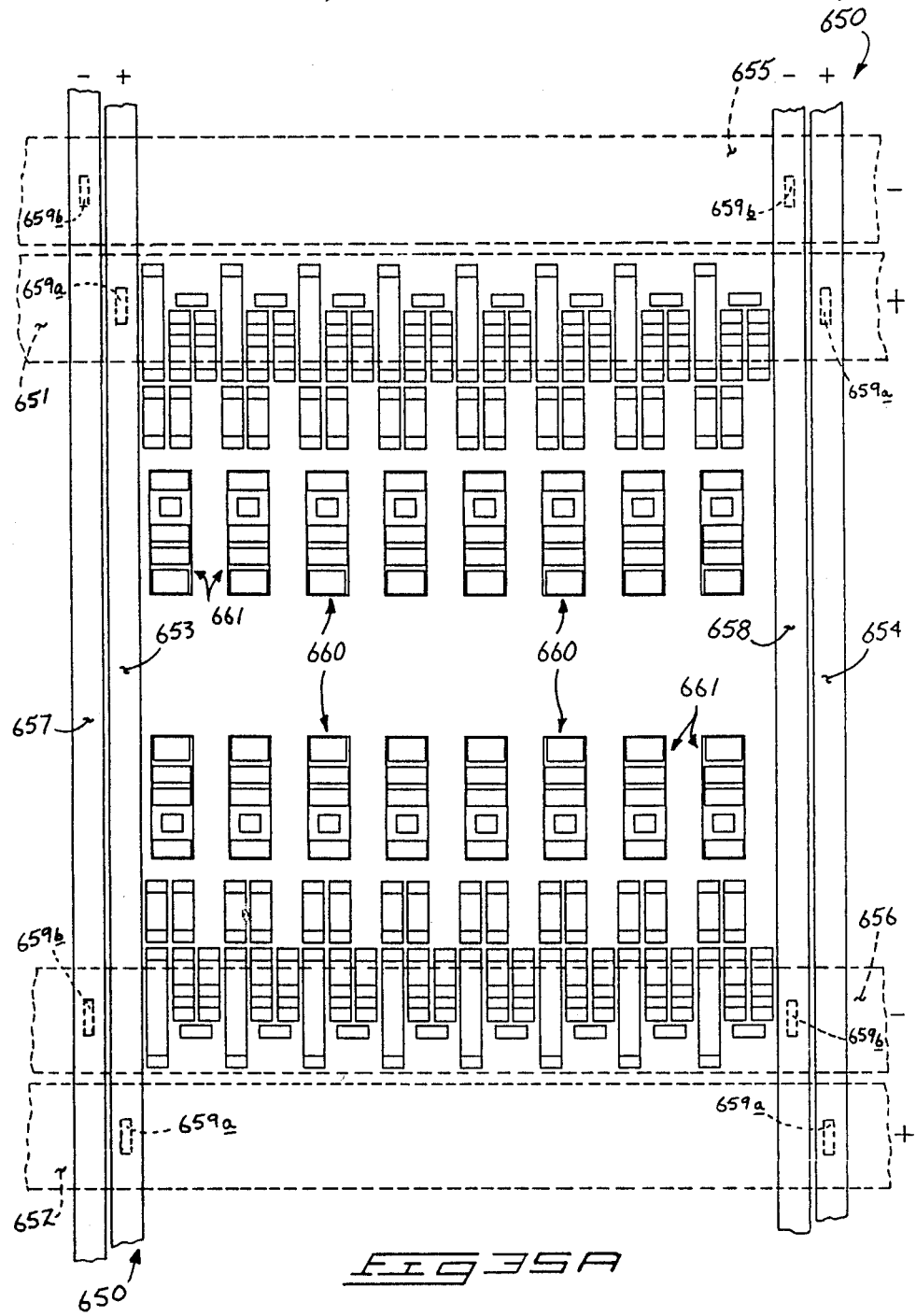
FIG. 35A is an enlarged plan or layout view showing a single alternative power frame arrangement which can be used in a power sector similar to that shown in FIG. 34A. The power frame has two rows of eight logic cells.

FIG. 34A shows power frames with 4×4 or 16 cells in each power frame. Alternatively it is possible to use other arrangements. The enlarged or zoom view of FIG. 35A shows an alternative power frame 650 which utilizes 16 cells arranged in two rows of eight cells. FIG. 35A shows two horizontally running first power network conductors 651, 652 and two vertically running first power network conductors 653, 654. Also shown are two horizontally running second power network conductors 655, 656 and two vertically running second power network conductors 657, 658. The first power network conductors are joined at vias 659a which pass into the plane of FIG. 35A to make connection between the superimposed planes. Similarly, the second power network conductors are joined at vias 659b. Although the respective first and second power networks are described with respect to implementation as layers or planes, it is not necessary that such an approach always be used. In many instances the conductors of the grids can otherwise be routed on different planes but electrically joined for the same effective results.

FIG. 35B shows a single cell 660 from power frame 650. Cell 660 is modular and representative of all 16 cells. Each cell includes a transistor assembly 661, Schottky diode 662 and five resistors 663–667. Silicon transistor assembly 661 includes an emitter 668, collector 669 and base 670. A p— silicon substrate 681 and n+ buried layer 682 are provided as typical. An epitaxial n— layer 683 exists between the buried n+ layer forming the collector and the p layer forming base 670. The base advantageously has a p+ diffusion (not shown) adjacent to where metallic connection will be made. An oxide isolation layer 671 exists over relevant portions leaving windows or lands for metallic conductor interconnection.

Adjacent to transistor 661 is a Schottky diode structure 662 which can optionally be connected between the first power network and the transistor collector 670 in order to limit current and prevent saturation where there is a fanin condition which might otherwise lower the collector voltage by more than 500 mV below the first power network voltage. The Schottky diode structure includes an n+ region 687 and a platinum silicilate region 688. Appropriate connection is taken from region 688 to the first power network in cells needing to utilize a Schottky diode.

Resistors 663–667 include p silicon regions 695 with appropriate isolation biasing occurring through a resistor bias connection 672 to the buried n+ layer utilizing an n+ contact diffusion. The buried and p resistor layers are separated by the n— epitaxial layer 683. Resistors 663 and 664 are designed to be approximately 100 ohm emitter resistors which can be connected either one at a time for single unit current flow, or both in parallel where double unit current flows are needed. Load resistors 665 and 666 can similarly be used either one at a time or in parallel. Resistors 665 and 666 can be connected either at terminals 674 to 675 for a value of approximately 125 ohms or at terminals 674 to 676 for a value of approximately 250 ohms. Resistor 667 is a tail resistor designed for a value of 500 ohms or less and constructed substantially like resistors 663 and 664 with a longer resistive path through the p layer 695. Its value may be varied by changing the spacing between the terminals.

Tertiary or other branch conductors are appropriately formed during metallization to connect the desired terminals of the transistors, Schottky diodes, or resistors together or to the first and second power networks as needed for the particular functions needed in that cell. The preferred processes of production are either oxide isolation or diffused isolation.

Figure 36:
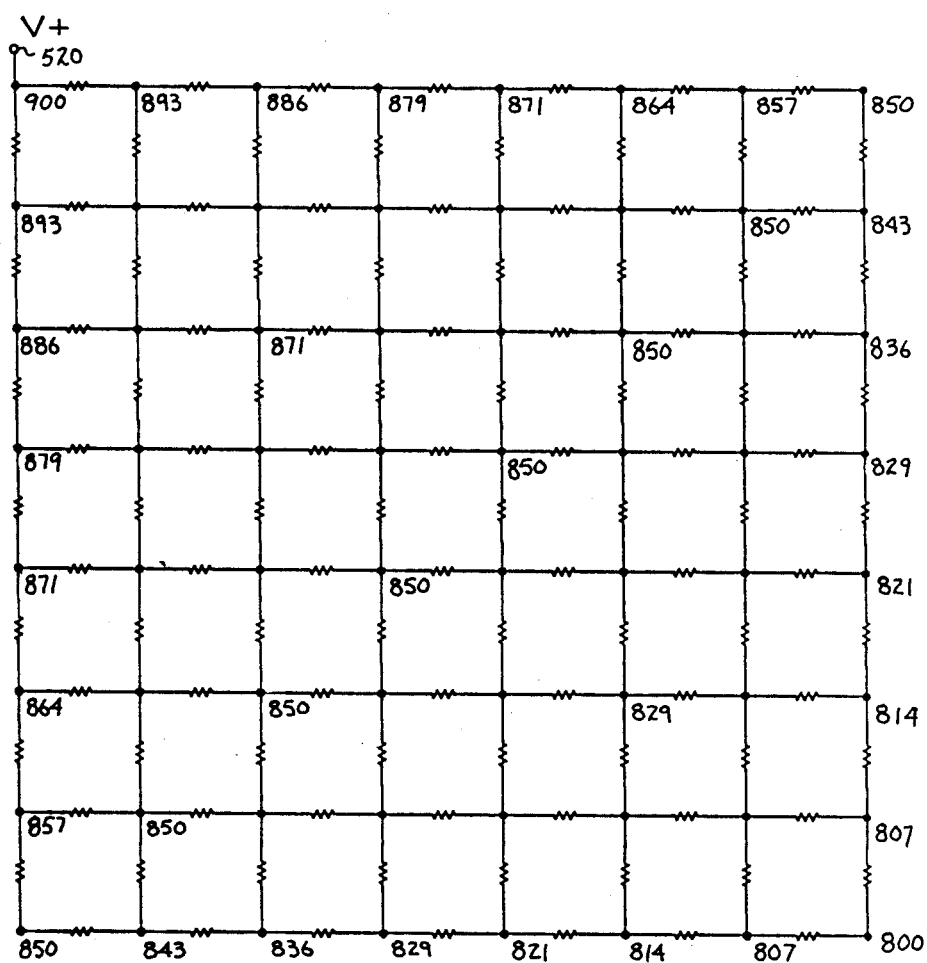
FIG. 36 is a diagram showing relative voltages in millivolts existing at various nodes of a positive grid similar to that shown in FIGS. 34A and B.
Figure 37:
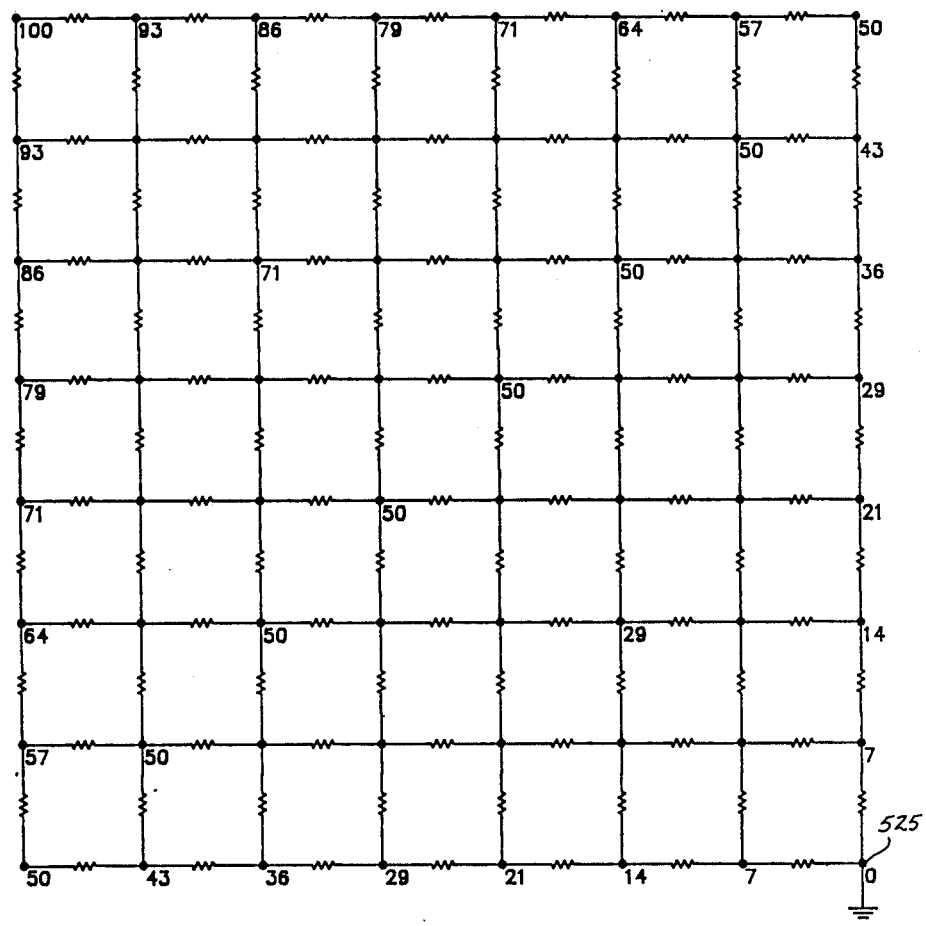
FIG. 37 is a diagram showing relative voltages in millivolts existing at various nodes of a negative grid similar to that shown in FIGS. 34A and B.

FIGS. 36 and 37 show exemplary voltage profiling for a sector similar to sector 528 of FIG. 34A described above. The electronic modeling program used to generate this profile was based upon the assumption that all inverter cells 530 in sector 528 are arranged on eight nodes so that the current demand is constant at each node. This effectively reduced the difficulty of modeling the sector, since sector 528 has fewer transistors connected to the conductors at the perimeter of the sector. This simulation thus is not an exact model of sector 528 but it is nonetheless indicative of the voltage gradients which exists across the sector. FIG. 36 shows the voltage profile from positive terminal 520 across the positive grid. FIG. 37 shows the negative grid profile across to negative terminal 525. The positive grid has been designed to allow an approximately 100 mV drop from the higher voltage at terminal 520 to the lowest voltage at the opposite corner of the grid. The negative grid has also been designed to allow a corresponding 100 mV drop from the upper left-hand corner across to the lowest voltage at negative terminal 525. The voltage profiles from this particular simulation indicate that a constant differential voltage of approximately 800 millivolts is maintained between the two grids in one exemplary form of the first logic family.

The value range of the voltage drop profile across each power network can be as high as desired. Preferred networks according to this invention have voltage profile drops of greater than 50 mV, more preferably greater than 100 mV, even more preferably greater than 200 mV. Voltage drop profiles of greater than 0.5 V (500 mV) are probably not practical unless the power network is external to the monolithic chip and is on a hybrid substrate. The greater network voltage drops allow less metallization and/or larger chips to be built. Wafer scale integration will most likely be successful using the technology of this invention. When logic signals are run across arrays with large drops, then repeaters, such as in the form of inverters or buffers, are needed for logic signals driven from a relatively higher to lower voltage locations on the networks.

The positive and negative grids are further designed by proper current balancing, logic function density, and power network taper to provide complementary voltage profiles such as by providing equal linear voltage gradients across each power network so as to produce two complementary power networks which have substantially equal differential voltages across the logic units at all points across the grids. Each inverter, NOR gate or other logic element thus is controlled between similar relative voltages and when turned on conducts the same current at its output, thus producing equal logic voltage swings at the downstream load resistors. It should be appreciated that although the designs presented herein are provided with nearly linear voltage profiling (constant voltage gradient), it is alternatively possible to have complementary power networks which have non-linear voltage profiles (varying voltage gradients). Such structures will nonetheless have voltage varying profiles for the positive and negative networks which by design of the chip or sector are complementary to provide substantially equal or otherwise closely related differential voltages therebetween as taught herein.

Preferred circuits according to this invention include means for applying base-emitter biasing voltages to the logic transistors which swing over a relatively well defined range. The application of relatively well defined biasing voltages is primarily dependent on maintaining a relatively constant differential voltage across the array of logic units including the load resistors, transistors and any emitter resistors and tail resistors which controllably conduct between the first and second power networks. The well defined biasing voltages accurately control the collector current which in turn creates the logic swing for the downstream logic unit by controllably conducting current through its associated load resistor. By maintaining nearly equal differential voltages across the logic units, the currents are well controlled and the voltages swing between well defined limits. This allows operation without saturation and with minimum gate voltage swing which allows the switching of capacitive loads with high speed and lowest power dissipation.

The ability of the power networks to also provide precision bias voltages to each logic unit is novel and eliminates the need for additional bias lines, bias circuits, clamp diodes, emitter followers, voltage regulators, decoupling, and their associated devices. This feature also allows the load resistor values, signal voltage swing, and power supply voltage to be minimized. The resulting benefits include small chip size, low power, high speed, high reliability, high functional density, and low cost.

The two-dimensional lattice of secondary conductors and intersecting nodes used in the first and second power network grids 521 and 524 provide a surprising level of voltage stability since noise due to variations in current demand or extraneously induced voltage spikes are effectively attenuated by current flow in both dimensions rather than along a single conductive line such as in ladder or dendritic arrangements such as shown in FIGS. 29 and 31. This stability is greatly preferred in providing error free digital signal processing using the relatively small operational voltage swings which are preferred in this invention for non-saturating transistor operation.

Figure 38:
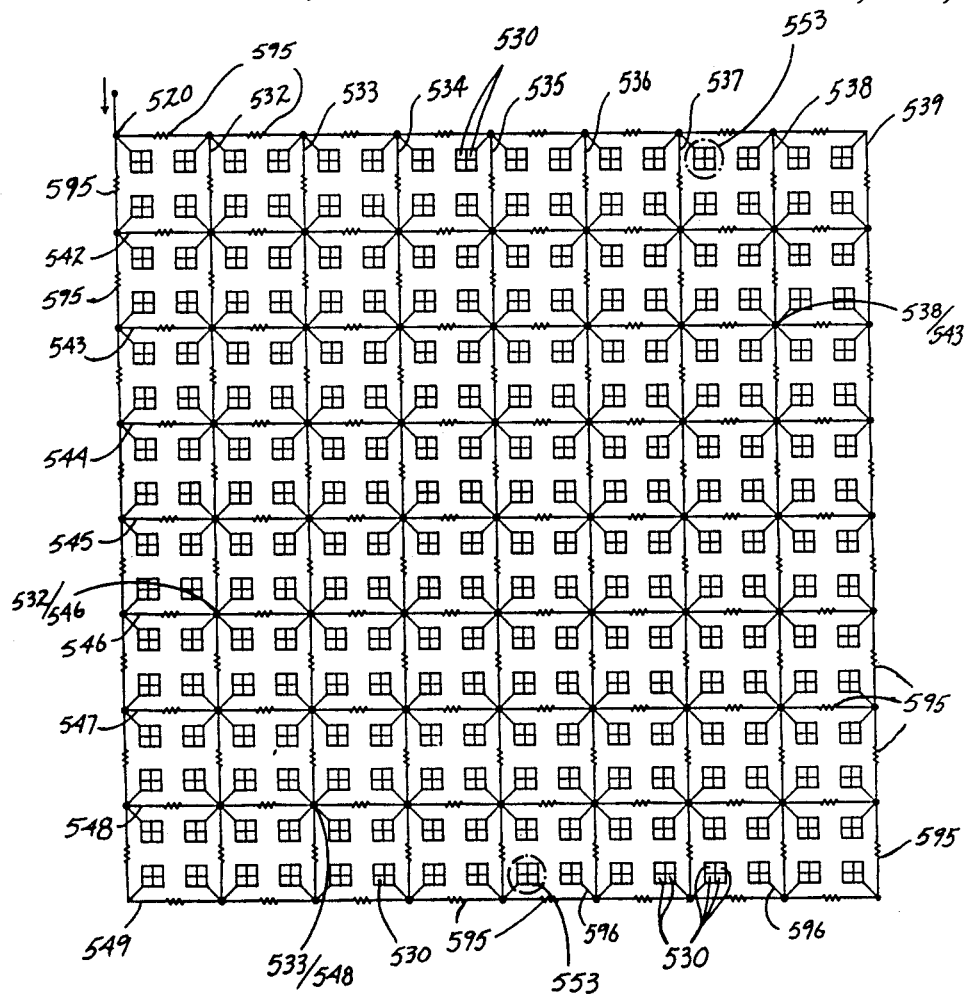
FIG. 38 is a schematic representation of an equivalent circuit of the positive power grid as shown in FIGS. 34A and B, connected to groups of four inverter cells diagrammatically shown as blocks of four squares.

FIG. 38 shows a schematic representation of an equivalent circuit of the positive power grid structure 521 described above. Electrical resistance associated with the metal or other conductive material forming the primary and secondary conductors 532–539, 541–549, 561–569 and 571–579 are indicated by resistors 595 interposed between nodes. Tertiary conductors 596 are schematically shown running from the nodes to groups 553 containing four cells 530. In actual construction, the tertiary conductors need not necessarily be grouped nor be connected at the node points of the grids. This schematic illustrates how a particular node point defined by the intersection of secondary conductors is particularly adapted to stabilize voltage at the node and thus across the grid. The interior nodes such as 532/546 can be supplied with current from as many as four connecting secondary conductors. In normal operation, DC supply current will flow from the two conductors which connect to nodes which have a more positive voltage. However, variations in voltage will tend to be suppressed by conduction to or from the node along all four conductors connected to interior nodes. Further stabilizing the voltage at each node is the effective low resistance of four groups 553, each containing four cells 530. Any voltage variations due to switching transients, current flow abnormalities, capacitances or induced electrical fields are suppressed by the low impedance of the grids, parallel logic units, and by the current balanced operation of conductive logic unit transistors. The equivalent circuit shown FIG. 38 has been numbered with respect to the first or positive grid 521. The second or negative grid 524 can be similarly represented except the position of the negative terminal is at the opposing corner.

Figure 39:
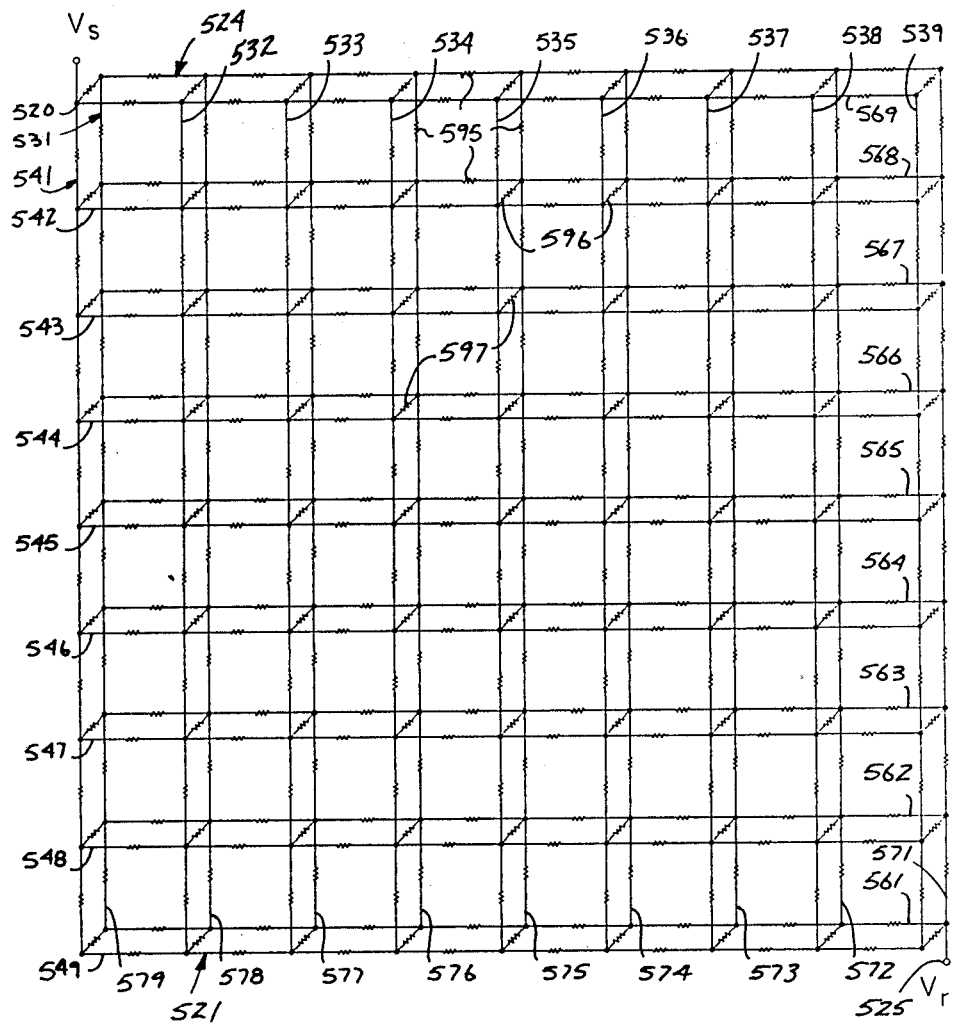
FIG. 39 is a schematic representation showing an equivalent circuit similar to the current distribution and accumulation networks shown in FIGS. 34A and B. The inverter cells are not shown per se but are represented by the resistors connecting the representations of the positive and negative power grids.

FIG. 39 shows another useful equivalent circuit schematic representation of the power network system formed by the positive and negative power grids 521 and 524. FIG. 39 pictorially shows the spaced planar relationship which may be assumed by grids 521 and 524. The resistors 595 represent equivalent metal or grid conductor resistances between nodes within either grid. The inter-grid resistors 597 represent the resistance through the logic units, such as through a transistor from base and collector to emitter and an emitter resistor, if used. The inter-grid resistors are connected between the grids by tertiary conductors 596 at each end of resistors 597. In FIG. 39 the conductors 596 and resistors 597 are representative to the collective current of numerous logic units, such as 16 of cells 530. The low impedance of the conductors dissipates a relatively small amount of heat and allows effective regulation of current by the feed resistor, feed transistor or other current regulator means. This structure also provides a low resistance for any incremental current at any point across the sector, thus substantially reducing or eliminating the need to compensate for current imbalance caused by logic signal current flows between gates which are far apart on the grid.

Digital logic circuitries according to this invention include a sufficient number of parallel transistors connected between the power networks, such as shown in FIGS. 1A, 2A, 12A, 13A, or 14A, so that relatively low impedance and voltage stabilization occurs. This need for numerous conductive transistors can be understood by considering that it is not possible to use a feed resistor in place of a voltage regulator to power a single inverter which turns on and off with time. Voltage stabilization is enhanced due to the parallel connection of numerous transistors and the resulting low impedance between the positive and negative power networks such as indicated in FIG. 39. Only a portion of the transistors can switch at any given time, so that a majority are available to stabilize the network. Since the transistors are arranged and logically connected to provide total array current balance, a relatively constant amount of current is conducted. The preferred circuits further have numerous transistors so that the effective impedance to the flow of incremental current for the entire circuit is very low, thus diminishing the effects which are associated with operation of any particular transistor. The impedance at any point will depend on the size and arrangement of an array and the impedance of the logic units. In general it is believed that a minimum of 8–10 units of current such as from 16–20 transistors should be included across positive and negative power grids, power rails or power ladders in order to provide the desired voltage-stabilizing, low impedance circuit structure preferred for circuitry according to this invention. More preferably, the novel circuitries hereof have 100 transistors or more. It should be appreciated however, that the particular power networks used and the logic circuitry employed will affect the minimum number of transistors needed in any particular design. In the exemplary circuits described herein each transistor provides approximately 26 ohms resistance at 1 mA of current. When approximately 1000 transistors are on at any one time there is a total impedance of 0.026 ohms.

The novel operational methods according to this invention further reduce impedance on the networks and help to stabilize voltages. These methods apply some level of forward biasing voltage across the logic transistors at all times. When the transistors are turned on the base-emitter bias voltage is relatively high and substantial amounts of current flow. However, even in the off condition the transistors are somewhat forward biased and some conduction takes place. This additional conduction allows small amounts of current to flow thus lowering the impedance compared to zero current flow in the off condition, thus helping to further stabilize voltages, particularly in very large arrays.

Figure 40:
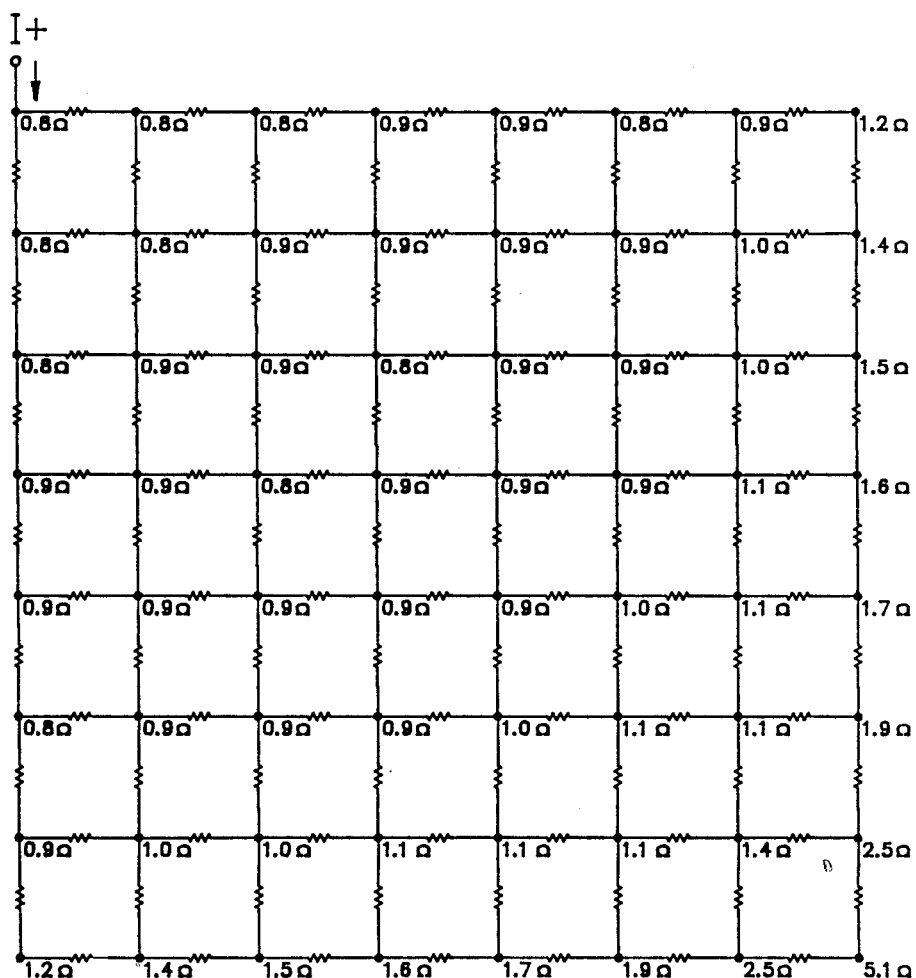
Figure 41:
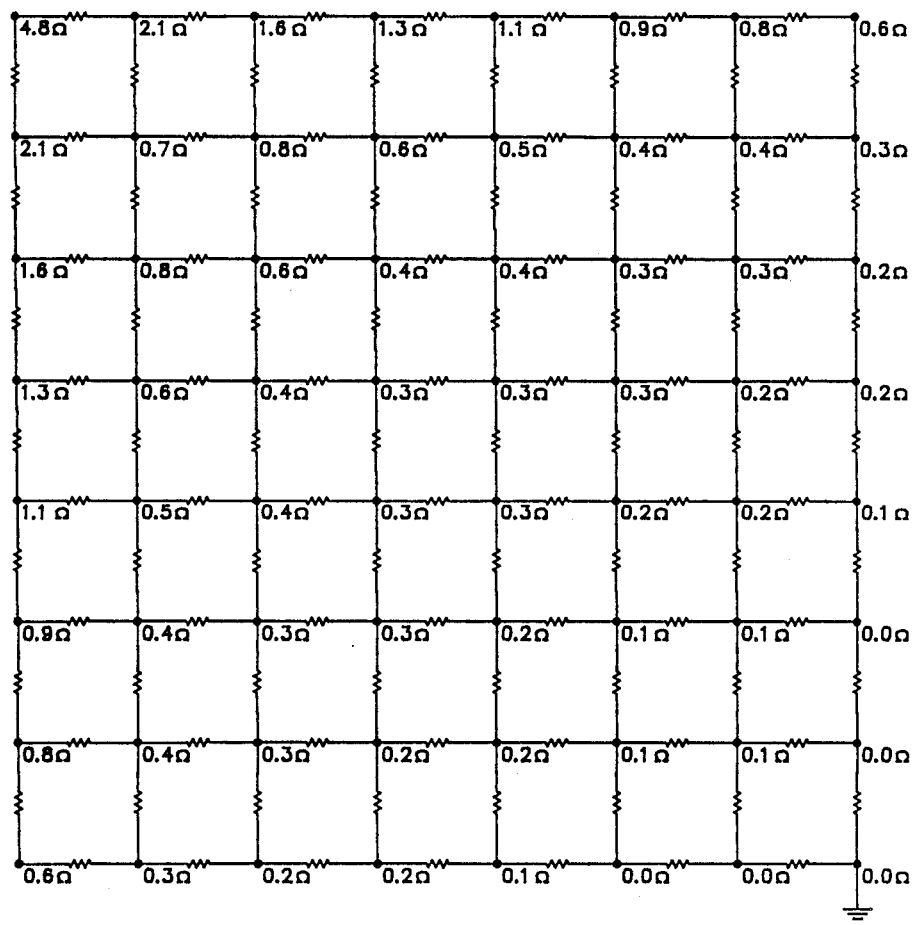
FIG. 41 is a diagram showing the resistance of a preferred negative power grid at various points across the grid. The same conditions apply as for FIG. 40.

FIGS. 40 and 41 show computer simulations which indicate the relatively low impedance to an increment of current which exist at secondary conductor nodes similar to those shown for grids 521 and 524, respectively. FIGS. 40 and 41 show the effective incremental resistance associated with applying an incremental 1 mA of current at any of the indicated nodes of the sector. These diagrams show that the resistance of the circuit is very low. The values shown were based on a model which included 1024 inverters with 512 inverters turned on and including 100 ohm emitter resistors. The model assumed the positive and negative networks were grids such as shown as 521 and 524. This low impedance allows signal currents to easily be coupled to distantly connected logic units in the grid without significantly changing local power network voltage or logic element swing. The relatively higher impedances at the corners opposite to the power terminals can be lowered by connecting suitable nonswitching dummy logic units to conduct a constant current flow at those or similar nodes.

The digital logic circuitries of this invention surprisingly have high noise immunity despite the relatively low logic signal threshold used for operation. Low noise generation is a result of several operational and structural features of the invention. One factor is the relatively low edge rate (voltage change rate) associated with switching of the logic unit transistors. The low edge rate is possible because the logic signal is required to change over a much smaller voltage range and this results in less unwanted current coupling through stray capacitance. Also relevant are the relatively low impedances which exist at all nodes of the circuit. Such low impedances allow any spurious signals from capacitive coupling of adjacent conductors to easily be absorbed and dissipated without generating sufficient voltage to cause a logic error. In many situations the capacitance and the low resistance of the input node of the transistor inverter or gate will be sufficient to suppress noise caused by capacitive coupling. The transistors also have a finite frequency response which tends to filter out very high frequency noise and prevent activation of the transistor. These factors and others keep noise low and noise immunity high.

Figure 42:
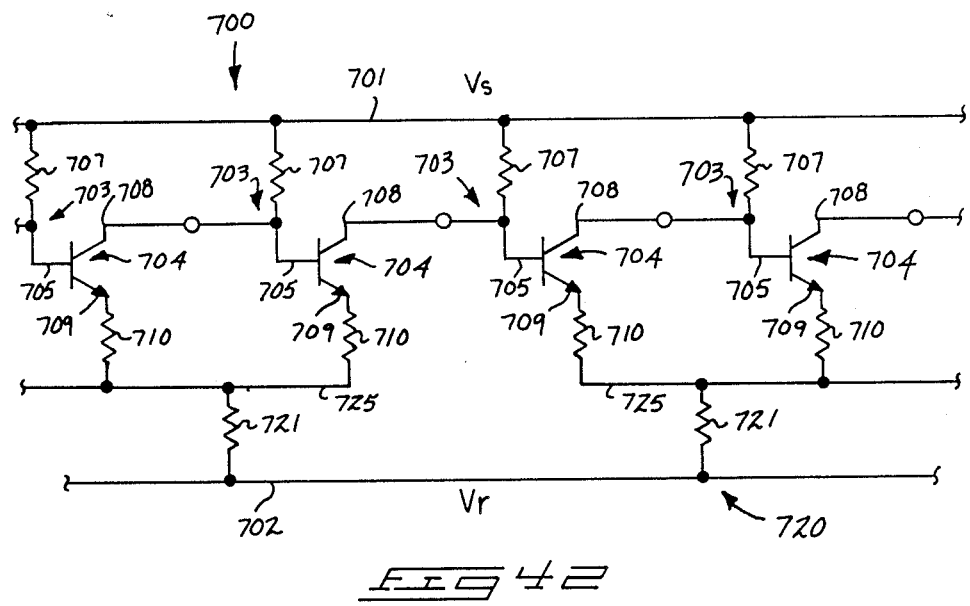
FIG. 42 is a schematic representation of a preferred structure used to evenly distribute current in a logic array.

FIG. 42 shows a schematic representation of portions of an optional power network structure 700. The structure shown in FIG. 42 is primarily employed to distribute the effective resistance of a feed resistor over the entire array thus providing more evenly distributed power dissipation on the chip. Uniform power dissipation prevents hot spots thus reducing operational problems associated with differential temperature changes. Such structures are particularly advantageous where a feed resistor cannot conveniently be placed off the chip.

Structure 700 employs a positive first power network 701 and a negative second power network 702. The logic cells 703 each include a single transistor 704 with base 705 connected as the logical input node and to the transistor end of load resistors 707. The collectors 708 form the logical outputs, and the emitters 709 are connected to emitter resistors 710. An intermediate or subdivisional power conductor 725 extends across and interconnects a plurality of emitters or emitter resistors 710, preferably being connected to 16–20 or more transistors to conduct 8–10 units of current or more in order to attenuate voltage fluctuations caused by switching. A plurality of distributed feed resistors, or tail resistors 721 are connected in parallel between the intermediate power conductor 725 and a primary, secondary or tertiary conductor 702 of the negative power network. This tail resistor and intermediate subdivisional power network structure creates an intermediate voltage on the intermediate power conductor which helps to further stabilize the differential voltages existing across the inverters or other logic units. Conductors 702 can advantageously be tapered to control the accuracy of the differential voltage developed across each cell. Lines 725 are preferably tapered if there is more than 2–3 mV of drop therealong. Where tapered metal is used a single tail resistor of appropriate value will be used at the end of the conductor.

In a preferred embodiment of the structure shown in FIG. 42, the tail resistors have nominal resistance values of 250 ohms or less and carry 1 mA each thus placing the intermediate power conductor 725 at approximately 250 mV higher voltage than the local voltage of the second power network 702. The total array voltage differential can thus be 1.25 volts including 100 mV drop on the power networks, 900 mV drop across logic units, and 250 mV drop across the tail resistors. The tail resistors can thus be employed at a ratio of 1:2 compared to the number of transistors and emitter resistors since approximately 50% of the logic units will be off at any particular time and thus on average there are two logic units per each unit (1 mA) of current being continuously conducted by tail resistors 721. In the logic cell construction described at FIG. 35A–35C a tail resistor can be provided with resistance of 250 ohms by changing the terminal location. The tail resistors can be used throughout the array to completely replace any need for a main feed resistor, instead creating a totally distributed feed resistor array. The logic units forming a subdivision connected to an intermediate conductor are preferably current balanced as a subdivision so that a relatively constant current flow occurs thus keeping the intermediate power conductor voltage at near a desired value.

It should also be understood that a distributed feed resistance means, such as provided by tail resistors 721, can be provided in alternative forms. One other possible construction is to design the first and second power networks with higher resistance so that the desired feed resistance between the positive and negative terminals of the logic array is inherently and only provided by the conductors making up the networks. When the networks are constructed in the complementary manners described and taught herein then all logic units in an array will experience approximately the same network resistance and approximately equal differential voltages, but at different absolute voltage values due to the substantial network resistances and voltage gradients developed across the networks.

Single and Multiple Level Gate Arrays

Figure 43:
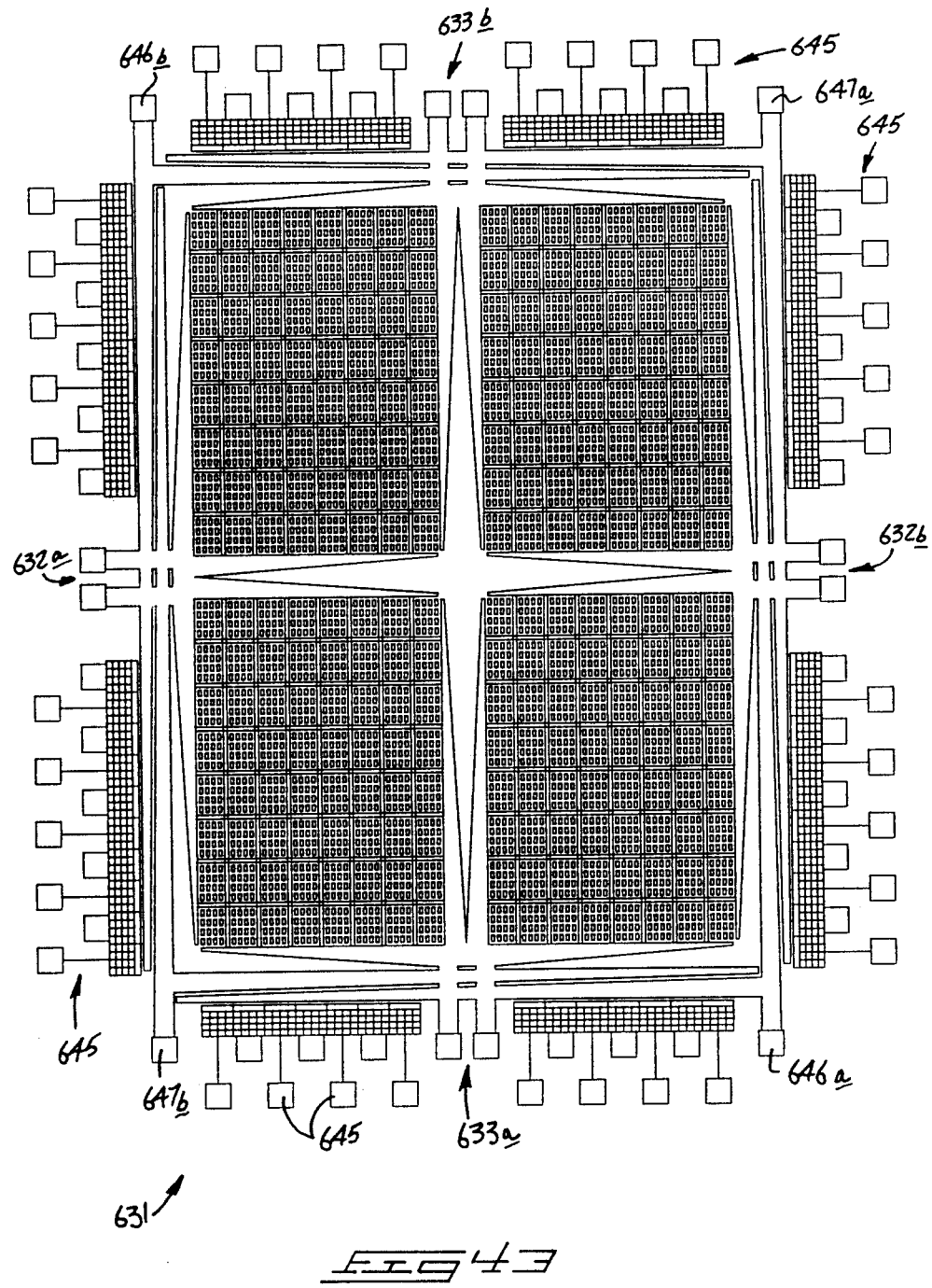
FIG. 43 is a plan or layout view showing a gate array chip having four sectors as shown in FIG. 34A which operate at a single power supply voltage level.

FIG. 43 shows an actual layout for an integrated circuit gate array 631. Gate array 631 included four sectors 528 as described above with respect to FIGS. 34A and B. The first power network terminals 520 at the extreme right and left center areas of the array, are connected to first network bonding pad terminals 632a and b. The second power network terminals 524 are connected to second network bonding pad terminals 633a and b. Logical signal connection bonding pads 645 extend about the perimeter of the chip. Otherwise logical signal conductors are not shown for sake of clarity. The power connections 646a and b and 647a and b are for providing power to appropriate input-output circuitry. The positive current flowing in each sector 528, in general flows from the first terminals 520 to the second terminals 524. All four sectors operate within the same general voltage ranges referenced to ground, with complementary voltage profiling on each as explained above.

Figure 44:
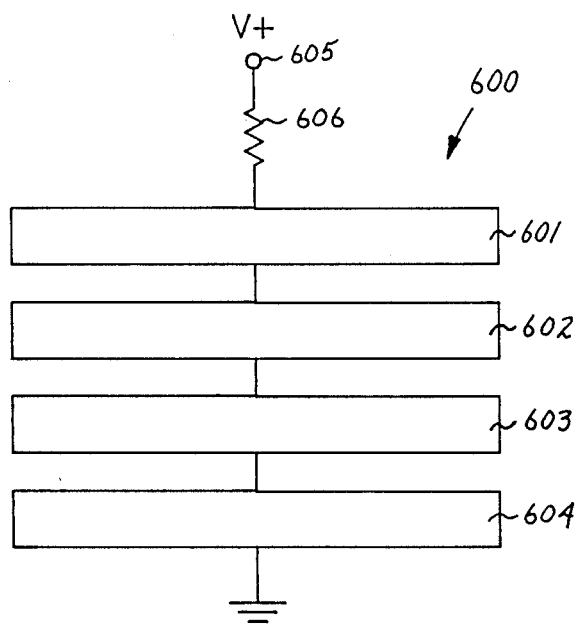
FIG. 44 is a diagrammatic representation showing how logic circuits can be stacked to achieve flow of a given power supply current through numerous levels of logic devices operating at different power supply voltage levels.

It has been found advantageous to utilize the relatively low differential voltages needed to operate these novel logic families by stacking the digital logic circuits into multiple levels thus allowing typical 5 volt digital power supplies to be used. FIG. 44 shows a diagrammatic presentation of how a plurality of logic sectors or other subdivisions 601–604 have been arranged to receive current in a series or stacked manner. The circuit 600 includes a voltage supply 605 which may be a typical +5 volt power supply used in many digital logic devices. A feed resistor 606 having a resistance value sufficient to cause a suitable voltage drop is provided to stabilize the amount of current supplied by voltage supply 605. Alternatively, each level 601–604 can be provided with an individual feed resistor or with the distributed feed or tail resistor structure which may replace or supplement use of a feed resistor or other means for regulating current flow through the array so as to achieve a nearly constant total current flow.

A first level or subdivision 601 receives current and apportions the current among various switching transistors as described herein so as to achieve a relatively constant current flow and differential voltage with time and varying logic states. The total current from subdivision 601 is used as the current feed to subdivision 602 (second level). The current return from subdivision 602 is connected to supply current to subdivision 603 (third level). The return current from subdivision 603 is used to supply current to subdivision 604 (fourth level). The return current from subdivision 604 is advantageously returned to a ground or negative terminal, such as a ground pad on an integrated circuit from whence the current returns to the basic power supply (not shown) used to power the chip.

Figure 45A:
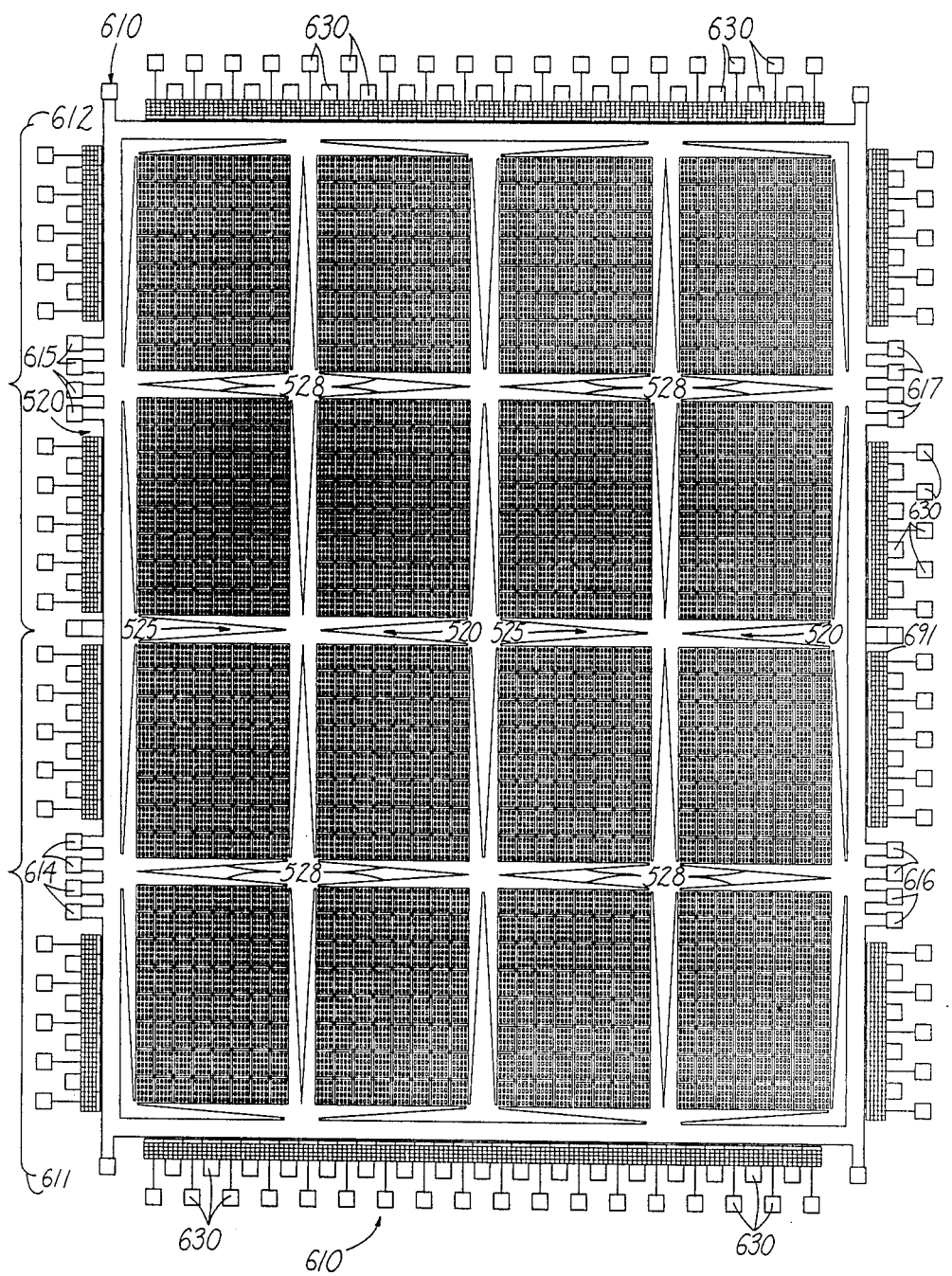
FIG. 45A is a plan or layout view showing a preferred monolithic integrated circuit gate array chip which utilizes 16 of the sectors as shown in FIG. 34A with both current distribution and current return networks superimposed. This chip utilizes four different power supply voltage levels.

FIG. 45A shows an actual layout for an integrated circuit gate array chip 610 which incorporates sixteen (16) sectors as described above with respect to FIG. 34A. The sixteen sectors 528 are arranged into two stacks 611 and 612 which run horizontally across FIG. 45A between bonding pads 614 to 616, and 615 to 617, respectively. Positive power is connected to the gate array at two main locations 614 and 615, for stacks 611 and 612, respectively. The current supplied to stack 611 is provided via four bonding pads 614 which are connected to power pins (not shown) mounted on the integrated circuit chip casing (not shown). The current supplied to second stack 612 is similarly provided via bonding pads 615 which similarly are connected to power pins (not shown) mounted on the chip casing. Current is removed from the first and second stacks via negative power bonding pads 616 and 617.

Figure 45B:
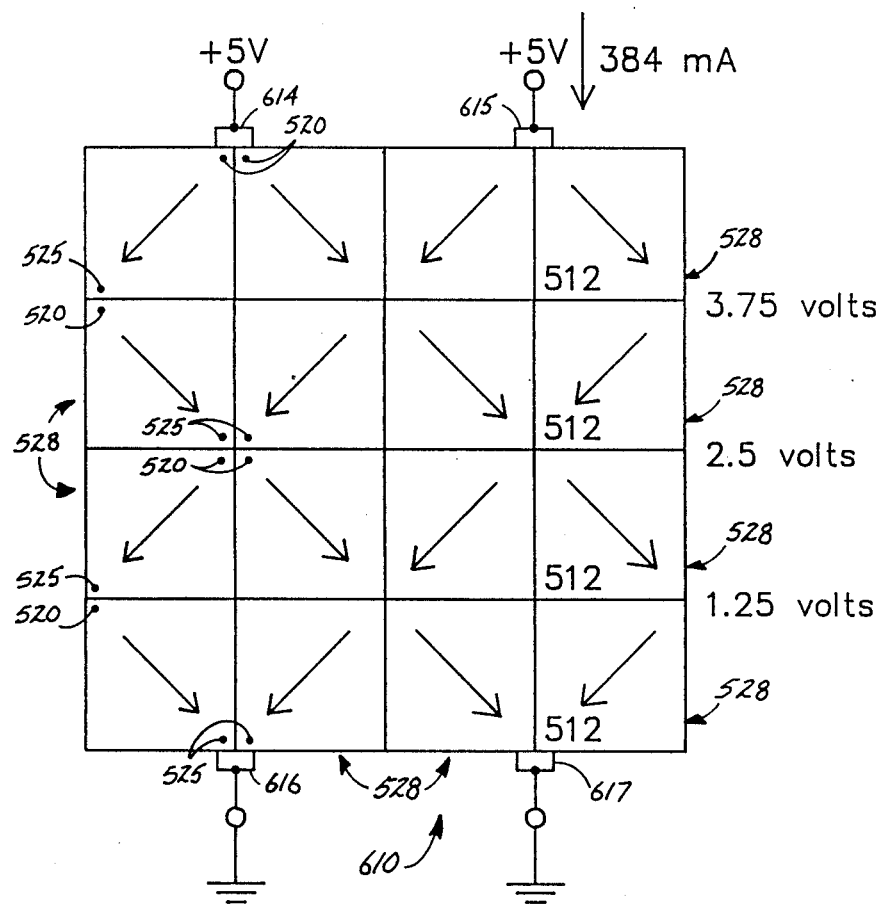
FIG. 45B is a diagram showing generally how current zig-zags through the integrated circuit shown in FIG. 45A passing through the four different voltage levels.

The positive power terminals 520 for each of the sectors 528 are arranged in mirror image relationship and are connected to a current supply conductor immediately adjacent to bonding pads 614 and 615. Current flows from the sector positive terminal 520 through the first power network for the sector to the logic units and through the negative power network. Current is removed from the sector at negative terminals 525 in the opposite corners of each sector 528. FIG. 45B diagrammatically shows the chip layout and that current flowing through chip 610 progresses through in a zig-zag fashion passing along four different paths through four different power levels as explained with respect to FIG. 44. Adjacent sectors on the same voltage level are advantageously connected both at the positive terminal ends 520 and at the negative ends to thereby further help stabilize voltages. The negative terminal of one level is connected to the positive terminal of the next lower level. The progression of the current through four independent voltage levels further improves voltage stability and can serve as a means for regulating current flow through the chip either in addition to or in lieu of the feed resistors or other means described herein.

Figure 46:
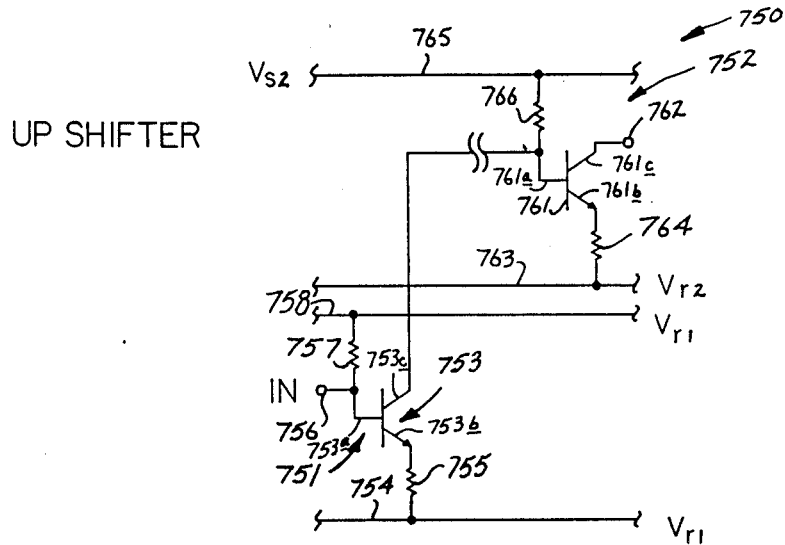
FIG. 46 is a schematic representation of a circuit according to this invention used to shift a logic signal from a lower power supply voltage level to a higher power supply voltage level.

FIG. 46 shows a preferred structure for conveying a logic signal from one stack level, such as level 602 in FIG. 44, up to an adjacent higher level, such as level 601 in FIG. 44. The up logic signal shifter 750 uses a first or lower voltage inverter 751 which operates between lower level voltages $V_{s1}$ and $V_{r1}$. Inverter 751 drives a second or higher voltage inverter 752 which operates between higher level voltages $V_{s2}$ and $V_{r2}$. First inverter 751 includes a bipolar switching transistor 753 having a base 753a, emitter 753b, and collector 753c. The emitter is connected to the lower level negative power network 754 via an emitter resistor 755. The logical input 756 is connected to transistor base 753a and load resistor 757. Load resistor 757 extends between the lower level positive power network 758 and base 753a.

The second or load inverter 752 of the up logic signal shifter 750 includes a switching transistor 761 having a base 761a, emitter 761b, and collector 761c. The collector is directly connected to the logical output 762 of the up level shifter. Emitter 761b is connected to the upper level negative power network 763 using an emitter resistor 764. The base 761a is connected to receive the output from the collector output 753c of first inverter switching transistor 753. Base 761a is also connected to the positive power network 765 via load resistor 766.

In a preferred embodiment of up logic signal shifter used with the second family of digital logic circuits of this invention, the load resistors 757 and 766 have resistance values of 250 ohms. The emitter resistors 755 and 764 have resistance values of 100 ohms. Such values are designed for use where the differential voltage between the positive and negative power networks is approximately 900 millivolts. The up level shifter is also useful with the first family of digital logic circuits.

In operation, the up logic signal shifter 750 receives a high signal at input 756 which forward biases the base-emitter junction of transistor 753 thus causing positive current to be drawn from the upper level positive power network 765 through load resistor 766. The voltage drop across load resistor 766 decreases the forward bias on the base-emitter junction of transistor 761 thus placing it in an off state which will cause the output 762 to go high when connected to a downstream logic device, due to lack of current flow through the downstream load resistor. Thus, the high input at lower level input 756 is translated to the higher voltage level as a high at output 762.

A low level input at 756 causes transistor 753 to turn off thus reducing current through load resistor 766 which in turn causes the base 761a to experience a relatively high voltage. This causes the switching transistor 761 to turn on which conveys current through the downstream load resistor (not shown), thus causing output 762 to go low. Thus the low input at 756 is translated to the higher voltage level as a low signal at output 762. A similar arrangement also works for NOR gates, used as either a driver below or as a load above.

Figure 47:
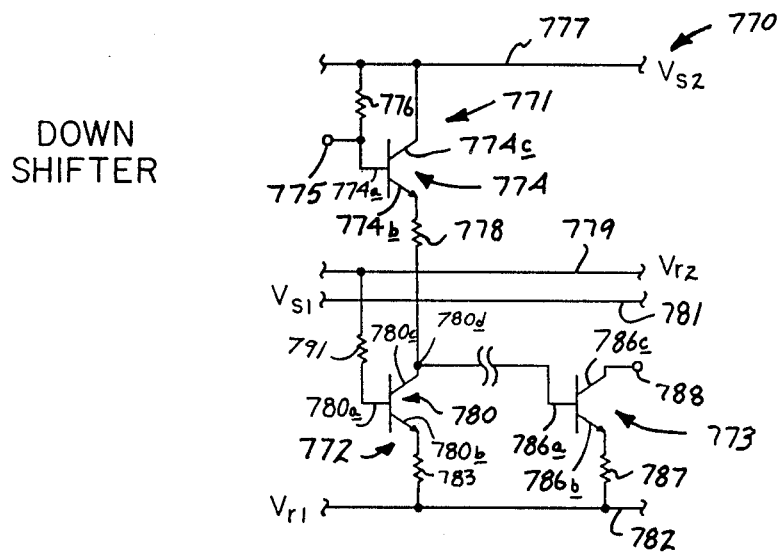
FIG. 47 is a schematic representation of a circuit according to this invention used to shift a logic signal from a higher power supply voltage level to a lower power supply voltage level.

FIG. 47 shows a down logic signal shifter 770 useful with the first and second families of digital logic circuits according to this invention. Shifter 770 serves to shift a logic signal from a higher voltage level such as level 601 in FIG. 44, down to a lower voltage level such as level 602. Shifter 770 also performs an adaptive function which automatically compensates for the varying power network voltages.

Shifter 770 includes a higher voltage input follower stage 771 and a lower voltage current source stage 772. Input or first stage 771 includes a bipolar transistor 774 which has a base 774a, emitter 774b, and collector 774c. The base 774a is directly connected to the down shifter input node 775 which is also connected to the transistor end of load resistor 776. The network end of load resistor 776 is connected to the positive power network 777 for the higher voltage level. The collector 774c is connected directly to positive first power network 777. The emitter 774b is connected to one end of an emitter resistor 778. The other end of emitter resistor 778 is connected to the second or current source stage 772.

The current source stage 772 includes a transistor 780 which has a base 780a, emitter 780b, and collector 780c. The base 780a is connected to the negative second power network 779 of the higher voltage level. The base can be connected either directly or more preferably, via resistor 791. The emitter 780b is connected to the negative power network 782 of the lower voltage level via emitter resistor 783. The collector 780c is connected to a third stage 773 and follower or level shift resistor 778 of the first stage.

The current source transistor 780 is connected with its base 780a referenced to the second power network lower voltage. The emitter 780b is referenced to the second power network of the lower level. This configuration causes the current source to automatically sense the relative voltage differences which may occur at varying locations across the power networks. The current source stage thus increases current flow when the voltage difference between the networks increases, and decreases current flow when such voltages difference decreases. The current generated by the current source thus causes the voltage at node 780d to automatically adapt to the particular placement of these stages on their respective power networks.

The third stage 773 includes a bipolar transistor 786 having a base 786a, emitter 786b, and collector 786c. The base 786a is connected to the collector 780c from the second stage 772. The emitter 786b is connected to the lower level negative power network 782 via emitter resistor 787. The collector 786c is the output 788 from the third or load stage 773.

The transistors 774, 773 and 780 are typical transistors used in the logic families, such as described herein. Preferred resistance values for resistors of down logic signal shifter 770 are 250, 250, 100, 100 and 100 ohms for resistors 776, 791, 778, 783, and 787, respectively, for embodiments designed for use with the exemplary form of the second logic family as described hereinabove.

In operation the first stage transistor 774 receives either a high or low signal dependent on the current flow through load resistor 776 being off or on, respectively, as dictated by the upstream logic unit. Second stage transistor 780 acts as an adaptive current source as indicated above. The action of transistor 780 as a current source allows the voltage at emitter 774b of first stage transistor 774 to move up and down in order to follow the signal at input 775. This maintains the base-emitter bias voltage of transistor 774 in an on condition for the amount of current supplied, without regard to whether the input signal is high or low. The voltage at node 780d thus also follows the signal input at node 775 and is high or low as input 775 is high or low, respectively. The voltage developed at node 780d is proper for correct biasing of the third stage transistor 773. The voltage at node 780d is communicated to base 786a of third stage transistor 773, thus controlling the base-emitter bias voltage thereof and current flow through the downstream load resistor (not shown). The signal output at input node 775 is thus translated onto the lower voltage level and inverted.

The first and second stages of the down level shifter should be connected on the chip so that the power network voltage drops do not cause the voltage developed across resistor 778 to go to zero. The voltage differential between $V_{r2}$ and $V_{s1}$ should also be approximately 150 mV or less.

Third stage 773 can be considered a part of down level shifter 770 or it can be considered a receiving inverter stage voltage coupled without connection of a load resistor to the lower voltage level first power network.

Figure 48:
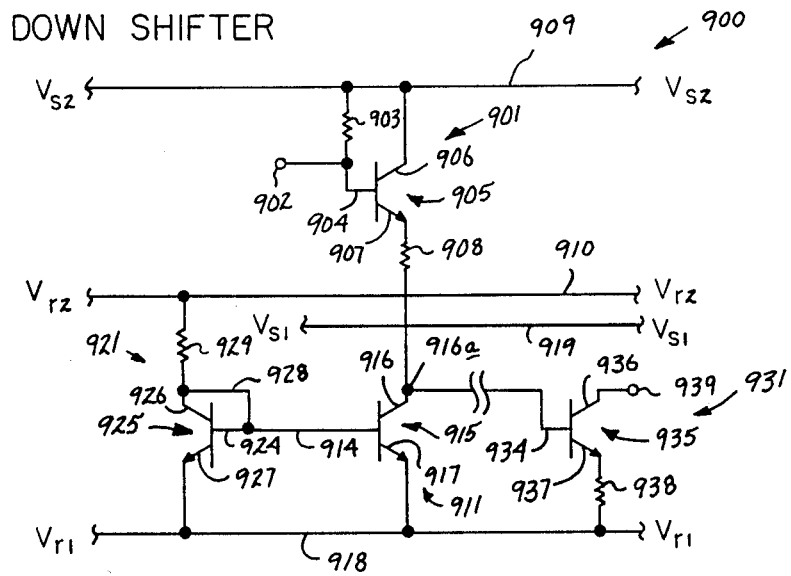
FIG. 48 is a schematic representation of an alternative logic signal down level shifter.

FIG. 48 shows an alternative form of logic signal down level shifter 900. Down level shifter 900 is also adaptive and can advantageously be used for situations where the $V_{r2}-V_{s1}$ voltage differential is greater than 150 mV. Down signal shifter 900 includes a follower or first stage 901 which receives an input signal at input node 902. Input node 902 is connected to the transistor end of a load resistor 903. The network end of load resistor 903 is connected to the upper level first power network 909 which is at upper level first power network voltage $V_{s2}$. The upper level second power network 910 is at voltage $V_{r2}$.

Input 902 is also connected to the base 904 of first transistor 905. The collector 906 of first transistor 905 is connected to the upper level first power network. Emitter 907 of the first transistor is connected to an emitter resistor 908. The opposite end of resistor 908 is connected to the collector 916 of the second or current source stage 911.

Current source stage 911 includes a second transistor 915 having emitter 917, base 914 and collector 916. Base 914 is connected to an adaptive bias stage 921 to provide a biasing voltage which varies depending upon the relative voltages between second networks 910, 918 of the upper and lower power networks, respectively. The emitter 917 is preferably connected directly to second network 918 of the lower level. The collector is connected to the output or third stage at node 916a in order to apply a controlling bias voltage thereto.

The adaptive stage 921 includes a transistor 925 having a base 924, collector 925 and emitter 917. Emitter 927 is connected directly to the lower level second power network 918 at voltage $V_{r1}$. The collector 926 is shorted across to base 924 by shunt conductor 928. Collector 926 is also connected to the second power network 910 of the upper level using resistor 929.

The output stage 931 includes a transistor 935 having base 934, collector 936, and emitter 937. Base 934 is connected to collector 916 of the current source transistor 915 at node 916a. Emitter 937 is connected to lower level second power network 918 using emitter resistor 938. Collector 936 is connected to the output node 939. Collector 916 can also be considered an output.

Transistors 905, 915, 925 and 935 are standard transistors for the first or second logic families such as described above. Resistors 903, 908, 929 and 938 have preferred resistance values of 250, 100, 100, and 100 ohms, respectively.

In operation the adaptive bias stage transistor 925 acts as a diode because of shunt 928 and produces a current in resistor 929 and a voltage at base 924 which varies dependent upon the difference in voltage between the second network of the upper level and the second network of the lower level at the particular placement of connection for each. The relative voltages between the first and second power networks remain constant but vary in absolute value (referred to ground) over the chip. Since connection of the logic signal may run from different locations the relative voltages between the upper and lower levels may vary. Resistor 929, diode connected transistor 925, and transistor 915 form a current mirror. The voltage at base 924 is communicated to base 914 to produce an adaptively varying current level therethrough. The amount of current conducted by transistor 915 causes an appropriate voltage drop across resistor 908 thus biasing base 934 in a proper manner.

The first or follower stage 901 must carry the current from current source 911 which causes the voltage at emitter 907 to vary with the input at node 902 in the manner described above with respect to FIG. 47. A decrease at input node 902 causes a corresponding decrease in the voltage at emitter 907 and node 916a. Thus the input signal at node 902 is translated to control the biasing voltage at base 934 of the output stage. The bias voltage at base 934 controls current through transistor 935 and its associated load resistor (not shown) which is connected at output 939. The output stage thus causes inversion of the logic signal at output 939. Output stage 935 can also be considered a receiving inverter stage voltage coupled without a load resistor connected between base 934 and the first power network of the lower level.

Logic signals produced by the novel circuitries described herein can be translated to drive appropriate signal levels for other types of logic such as emitter coupled logic (ECL) and transistor-transistor logic (TTL) to allow utilization of chips according to this invention with other logic families. Also, ECL and TTL signals may be translated to drive the logic functions described herein. Although such translation is possible and preferred translators are known, they are not necessary for utilization of this invention since entire logical devices can be constructed using the new logic forms described herein.

It should also be noted that the present invention further includes integrated circuits which utilize both the first and second logic families as described and taught herein. Utilization of both logic families on a single chip will typically call for having one or more first portions or arrays which use the first family logic and one or more second portions or arrays which use the second family logic. The preferred differential voltages applied across logic units for the first family is in general different from the voltage used across the second family logic units. In the exemplary versions described above there is 900 mV across the second family logic units whereas there is 800 mV across the first family logic units. The above values do not include voltages drops associated with the power networks, any tail resistors or other distributed feed resistance. In general it will be necessary to use one or more ballasting resistors or appropriately valued tail resistors (also called distributed feed resistors) to provide appropriate voltage differentials across the arrays of the different logic families employed. For example, if the voltage drop in the power networks is 100 mV and the voltage across the logic units is 800 mV for the first family and 900 mV for the second family, then additional voltage compensation through resistance or other means of 100 mV is needed to ballast the first array for operation with the same power supply as used with the second array. The addition of tail resistors producing a 200 mV drop with the second family array but not the first family array increases the required voltage drop across a ballast resistor or other means connected to the first family group to 300 mV. Separately or in addition, the first family array may be divided into subgroups, such as shown in FIG. 42 for the second family, and individual or multiple tail resistors used for each subgroup. A minimum of 8–10 current units should be used in each subgroup to minimize switching noise.

Operational Methodology

Methods according to this invention involve carefully controlling current flow through an array of logic units which are connected in parallel between first and second power networks to conduct current therebetween. Current is advantageously controlled at the level of the logic units, particularly transistors or similar controllable electrical current conduction devices. Careful current flow control is provided by using well defined control voltages which cause each logic unit transistor to conduct a well-defined and relatively equal amount of current when turned on. The total current flow produced by the array logic unit transistors is also controlled by the logical interconnection of the logic units which preferably causes an approximately constant amount of current to be conducted by the total logic array for various of operative logical states which can be assumed by the array. The conducting of current by the logic units can be done by logically interconnecting the devices so that approximately the same number of conductive logic units are on at substantially all times. This can be accomplished by having the logic units logically connected so that a relatively fixed proportion, such as one half, of all logic units are conductive at substantially all times. Alternatively, the logical connection of NOR gates in the second family and similar circuitry allows varying number of gates to be turned on while producing a total current flow which remains carefully controlled at a desired total array current flow value. This occurs due to the possibility that 1, 2 or in some cases more transistors may be turned on to controllably conduct through a single emitter resistor. In such cases the logical interconnection of the logic units is such as to create a current flow which is substantially equivalent to the desired current value which remains sufficiently current balanced for current flow purposes, but which includes a varying number of conductive transistors.

The controlling of current flow through a logic array according to this invention can also be described as involving the complementary functioning of paired inverters, NOR gates or other logic units which each conduct an amount of current which is sufficient so that the units form current balanced groups when logically connected to operate out of phase with one another.

The controlling of current through an array can be further aided and accomplished by using a current regulation means, such as a series current regulation means, which is placed in series with the array of parallel logic units. The regulating of current can be accomplished by passing the logic circuitry current through a feed resistor, feed transistor, distributed feed resistors, or the resistance of the power networks. Use of a feed resistor or feed transistor in series with the array of parallel logic units will greatly stabilize and regulate total current flow through the array.

The methods of this invention further include distributing power supply current to the logic units so that closely related differential voltages exist across the numerous parallel logic units. The distributing of current so as to create the closely related, preferably relatively equal differential voltages, allows the individual transistors to be precisely controlled by producing a controlled conduction through the logic unit load device which will produce a voltage drop which lowers the control voltage to a level where the transistor is still forward biased but its transconductance is sufficiently low that the logically downstream device turns on because there is only a minimal voltage drop across its load resistor. Transistors are turned on only to an extent so that hard saturation does not occur, more preferably so that soft saturation does not occur. Some forward biasing of the base-collector junction may occur but such produces only trivial saturation which does not slow operation.

Expected Benefits

Greater ease of design is associated with using a power supply network with a predetermined voltage profile. This should be contrasted to prior art techniques wherein the power supply conductor voltages were in most cases not susceptible to analysis until the chip layout drawing had been completed. If an analysis indicated problems, in some cases it was necessary to undertake substantial changes in the layout to correct the power distribution problems.

The novel inventions described herein also allow the amount of metal area to be minimized and the chip size to be reduced. The minimization of metal is provided since the power networks are designed to have a relatively greater voltage drop thus allowing smaller conductors to be used. A relatively lower amount of current is used to operate the chip since followers and bias circuits are not used. This further reduces metal size. Tapered metal conductors can further reduce the amount of metal required. A fewer number of transistors are used for equal numbers of gates, as compared to the prior art, which allows a smaller chip size, which in turn reduces the length of the conductor lines. This allows further reduction of conductor size. The number of power pins can also be reduced.

The novel logic circuitries and operational methods described herein make possible circuit designs which have minimum power supply voltage, current, and logic signal voltage swing while using a minimum of components and conductors. There is no need for bias circuits, decoupling, clamp diodes, emitter followers, voltage regulators, and their associated devices. The benefits of this new approach include high speed, low power, relatively simple construction, high noise immunity, a high degree of modularity which facilitates automated logic design and layout, high functional density, small chip size, high reliability, and low manufacturing cost. With the present technology such design problems and others will be solved or made easier to alleviate.

In compliance with the statute, the invention has been described in language more or less specific as to structural features. It is to be understood, however, that the invention is not limited to the specific features shown, since the means and construction herein disclosed comprise a preferred form of putting the invention into effect. The invention is, therefore, claimed in any of its forms or modifications within the proper scope of the appended claims, appropriately interpreted in accordance with the doctrine of equivalents.

I claim:

1. Electronic digital logic circuitry including means for conducting an approximately constant current through first and second electrically conductive power networks; a plurality of logic transistors which are electrically connected to controllably convey current between the first and second electrically conductive power networks; said plurality of logic transistors being logically connected to thus develop an approximately constant total current requirement over time for a variety of logical input and output combinations of said circuitry; means for providing an approximately constant differential voltage between the first and second electrically conductive power networks across logic units including said logic transistors to thereby provide approximately uniform biasing of all off transistors and relatively uniform biasing of all on transistors.

2. Electronic digital logic circuitry according to claim 1, wherein the approximately constant current requirement of the transistors ranges between ±20% of a desired value.

3. Electronic digital logic circuitry according to claim 1 wherein the approximately constant current requirement of the transistors ranges between ±10% of a desired value.

4. Electronic digital logic circuitry according to claim 1, and further defined by said logic transistors being logically connected so as to assign approximately all of the logic transistors to current balanced groups which conduct approximately constant current flows over time for a variety of logical input and output combinations.

5. An integrated circuit having at least a portion thereof provided with digital logic circuitry which comprises:
   first and second electrically conductive power networks electrically connected to conduct current from a current source which provides a carefully controlled total current flow; said first and second electrically conductive power networks being constructed so as to provide closely related differential voltages therebetween across a plurality of logic units each having a load means electrically connected to the first electrically conductive power network and to a control terminal of a transistor to form a logical input of the logic unit, the transistor also being connected with a first current conduction terminal thereof electrically connected to the second electrically conductive power network and a second current conduction terminal thereof forming a logical output which may be connected to a logical input of one or more logically downstream logic units; said logic units being logically connected so as to conduct approximately the carefully controlled total current flow with time for a variety of logical states.

6. An integrated circuit according to claim 5 and wherein said current source is a voltage source with a feed means for controlling total current flow through the first and second electrically conductive power networks.

7. An integrated circuit according to claim 6 wherein the feed means includes a feed resistor.

8. An integrated circuit according to claim 6 wherein the feed means includes a feed transistor biased to provide an approximately constant current flow.

9. An integrated circuit according to claim 5 comprising distributed current regulation means.

10. An integrated circuit according to claim 5 wherein the first and second electrically conductive power networks develop complementary voltage varying profiles during operation.

11. An integrated circuit according to claim 5 wherein the first and second electrically conductive power networks are electrically conductive grids.

12. An integrated circuit according to claim 5 wherein absolute voltages which define the closely related differential voltages vary with respect to ground.

13. An integrated circuit according to claim 5 wherein absolute voltages which define the closely related differential voltages vary with respect to ground in a smoothly varying manner across the electrically conductive power networks.

14. An integrated circuit according to claim 13 wherein the absolute voltages which define the differential voltages vary linearly.

15. An integrated circuit having at least a portion thereof provided with digital logic circuitry which comprises:
   first and second electrically conductive power networks;
   an array of transistors connected to in parallel controllably conduct current between the first and second electrically conductive power networks;
   means for regulating current flow through the first and second electrically conductive power networks to an approximately constant total current flow;
   said array of transistors being logically connected so as to provide current balanced groups which conduct current balanced current flows between the first and second electrically conductive power networks; said transistors being electrically connected at a bias control connection thereof to a load means to form logical inputs; said load means also being electrically connected to the first power network;
   another terminal of the transistors being electrically connected to the second electrically conductive power network; and a further terminal of the transistors being electrically connected to from logical outputs; the transistors being connected to controllably conduct current between the first and second electrically conductive power networks dependent upon biasing voltages applied at said bias control connection;
   means for providing biasing to the transistors which causes approximately equal amounts of current flow between the electrically conductive power networks for transistors which are on, and which causes relatively small amounts of current to flow between the electrically conductive power networks for transistors which are off.

16. Integrated circuit according to claim 15 wherein the transistors are bipolar and connected with bases thereof forming the bias control connections, emitters thereof are connected to the second electrically conductive power network, and collectors thereof forming logical outputs.

17. An integrated circuit according to claim 16 and further comprising an emitter resistor means which resistively and conductively connects said emitters of the transistors to the second electrically conductive power network.

18. An integrated circuit according to claim 15 wherein the transistors are field effect transistors and connected with gates thereof forming the bias control connections, sources thereof connected to the second electrically conductive power network, and drains thereof forming logical outputs.

19. An integrated circuit according to claim 18 and further comprising a resistor means which resistively and conductively connects said sources of the transistors to the second electrically conductive power network.

20. An integrated circuit having at least a portion thereof provided with digital logic circuitry which includes a plurality of logic transistor means which are connected to controllably conduct current between first and second electrically conductive power networks; said plurality of logic transistor means being logically connected to conduct a carefully controlled total amount of current over time for a variety of logical input and output combinations; means for providing high and low biasing voltages to the logic transistors to turn the transistors on and off, respectively; said means for providing high and low biasing voltages to the logic transistors being constructed so as to provide high biasing voltages which are sufficiently defined to cause substantially equivalent current flow through transistors which are on; said means for providing high and low biasing voltages being further constructed to provide low biasing voltages which provide for current flow which is greatly reduced compared to the on transistors; and means for regulating total current flow through the first electrically conductive power network, second electrically conductive power network and plurality of logic transistor means to provide approximately constant current flow therethrough.

21. A method of operation for an integrated circuit used to process digital logical functions, comprising;
conducting current from a first electrically conductive power network to a second electrically conductive power network using a plurality of transistors; said plurality of transistors being logically interconnected to conduct a current balanced amount of current between the electrically conductive power networks at substantially all times for a variety of logical states;
currents conducted by the plurality of transistors passing between the first and second networks through a load means which is positioned sufficiently close to an associated transistor so that when current is conducted through the load means it changes the voltage at a control connection of the associated transistor and turns the associated transistor sufficiently off so that a downstream transistor logically connected to the associated transistor at a downstream load resistor is turned on to conduct current without saturating the downstream transistor.

22. A method according to claim 21 wherein the voltage at the control connections of the transistors change within a logic swing range which is less than 600 millivolts.

23. A method according to claim 21 wherein the voltage at the control connections of the transistors change within a logic swing range which is less than 500 millivolts.

24. A method according to claim 21 wherein the voltage at the control connections of the transistors change within a logic swing range which is less than 400 millivolts.

25. A method according to claim 21, wherein the voltage at the control connections of the transistors change within a logic swing range which is less than 300 millivolts.

26. A method according to claim 21 wherein the voltage at the control connections of the transistors change within a logic swing range which is less than 200 millivolts.

* * * * *

REEXAMINATION CERTIFICATE (1811th)
United States Patent [19]
Schoeff

[11] B1 4,962,341
[45] Certificate Issued    Oct. 13, 1992

[54] LOW VOLTAGE NON-SATURATING LOGIC CIRCUIT TECHNOLOGY

[76] Inventor: John A. Schoeff, 4107 W. Jensen Rd., Cheney, Wash. 99004

Reexamination Request:
No. 90/002,583, Feb. 14, 1992

Reexamination Certificate for:
Patent No.: 4,962,341
Issued: Oct. 9, 1990
Appl. No.: 151,423
Filed: Feb. 2, 1988

[51] Int. Cl.$^5$ .............. H03K 19/091; H03K 19/086; H03K 19/09; H03K 19/082
[52] U.S. Cl. ............................ 307/200.1; 307/440; 307/448; 307/454; 307/455; 307/459; 307/477; 307/228; 364/490
[58] Field of Search ............ 307/443, 448, 451, 296.1, 307/296.6, 551, 552, 465, 200.1, 440, 454, 455, 459, 477, 228; 357/45, 68; 364/490

[56] References Cited
U.S. PATENT DOCUMENTS

| | | | |
|---|---|---|---|
| 4,249,087 | 2/1981 | Sundberg | 307/552 |
| 4,475,119 | 10/1984 | Kuo et al. | 357/45 |
| 4,609,834 | 9/1986 | Gal | 307/296.1 |
| 4,774,559 | 9/1988 | Culican et al. | 307/465 |

*Primary Examiner*—John S. Heyman

[57] ABSTRACT

Digital logic circuitry designed to operate on a low voltage power supply without substantial transistor saturation thereby achieving lower power and higher operational speeds. A non-saturating inverter with a low voltage swing can be made with one transistor using standard bipolar production processes and without clamp diodes. The novel circuitry uses logic units which can be modularly combined to form various other logical functions such as inverters, gates, flip-flops, etc. The preferred logic units use a transistor with the base connected by a load resistor to a first current network. The logical input is between the load resistor and base. The emitter is connected either directly or via one or more resistors to a second current network. The first and second power networks are constructed and arranged to provide a voltage-varying profile across both networks which are preferably complementary to provide nearly constant differential voltages across the logic units. The differential voltages can be relatively low, such as less than 1 volt, thus providing low power operation. The power networks provide the biasing voltage for the logic units without separate biasing circuitry. The inverters, gates or other logical units are advantageously grouped into current balanced groups which conduct approximately constant current between the power networks for a variety of logical code combinations. The total current flow is preferably balanced to be approximately constant. A means for providing a relatively fixed amount of current matched to equal the balanced total current flow for the logic array is also preferably used. Also disclosed are preferred power networks, logic signal interconnect methods, a preferred gate array and methods for operating such circuits in non-saturating manners.

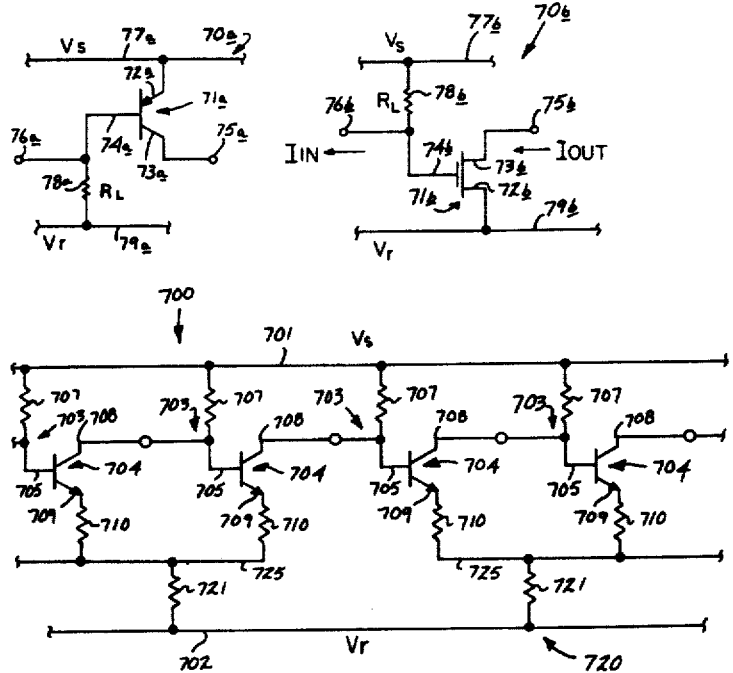

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-26 is confirmed.